US012650379B2

(12) United States Patent
Lane et al.

(10) Patent No.: US 12,650,379 B2
(45) Date of Patent: Jun. 9, 2026

(54) TUNABLE SHRINKAGE AND TRIM PROCESS FOR FABRICATING GRATINGS

(71) Applicant: Meta Platforms Technologies, LLC, Menlo Park, CA (US)

(72) Inventors: Austin Lane, Snohomish, WA (US); Ankit Vora, Bothell, WA (US); Richard Farrell, Seattle, WA (US); Keren Zhang, Woodinville, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 905 days.

(21) Appl. No.: 17/968,779

(22) Filed: Oct. 18, 2022

(65) Prior Publication Data

US 2023/0160820 A1     May 25, 2023

Related U.S. Application Data

(60) Provisional application No. 63/282,160, filed on Nov. 22, 2021.

(51) Int. Cl.
| | |
|---|---|
| *G03F 7/00* | (2006.01) |
| *G01N 21/47* | (2006.01) |
| *G01N 21/956* | (2006.01) |
| *G03F 7/20* | (2006.01) |
| *G03F 7/40* | (2006.01) |

(52) U.S. Cl.
CPC ....... *G01N 21/4788* (2013.01); *G01N 21/956* (2013.01); *G03F 7/0005* (2013.01); *G03F 7/0035* (2013.01); *G03F 7/2022* (2013.01); *G03F 7/40* (2013.01); *G03F 7/70625* (2013.01); *G01N 2021/95676* (2013.01)

(58) Field of Classification Search
CPC ........ G03F 7/0005; G03F 7/0035; G03F 7/09; G03F 7/11
See application file for complete search history.

(56) References Cited

U.S. PATENT DOCUMENTS

| | | | |
|---|---|---|---|
| 11,035,988 B1 * | 6/2021 | Colburn | G02B 5/1857 |
| 2004/0259042 A1 | 12/2004 | Fritze et al. | |
| 2012/0237880 A1 | 9/2012 | Sills et al. | |
| 2015/0338744 A1 * | 11/2015 | Hatakeyama | G03F 7/0046 430/325 |
| 2017/0330806 A1 * | 11/2017 | deVilliers | G03F 7/70558 |

(Continued)

FOREIGN PATENT DOCUMENTS

WO        2020194267 A1   10/2020

OTHER PUBLICATIONS

International Search Report and Written Opinion for International Application No. PCT/US2022/050514, mailed Mar. 22, 2023, 10 pages.

(Continued)

*Primary Examiner* — Daborah Chacko-Davis
(74) *Attorney, Agent, or Firm* — Greenberg Traurig, LLP

(57) ABSTRACT

A method is provided. The method includes forming a shrink material layer over a substrate including a photoresist pattern. The method also includes exposing the substrate with the shrink material layer to an activating radiation via a grey-tone mask that provides a predetermined light transmittance profile for the activating radiation. The method also includes removing at least a portion of the shrink material layer.

20 Claims, 20 Drawing Sheets

(56)         References Cited

U.S. PATENT DOCUMENTS

| | | |
|---|---|---|
| 2020/0271850 A1 | 8/2020 | Vora et al. |
| 2022/0082739 A1* | 3/2022 | Franke ............... G02B 27/0101 |

OTHER PUBLICATIONS

Carlson A., et al., "Negative and Iterated Spacer Lithography Processes for Low Variability and Ultra-Dense Integration," Optical Microlithography XXI, Proceedings of SPIE, 2008, vol. 6924, pp. 69240B-1-69240B-9.

Fonseca C., et al., "Advances and Challenges in Dual-Tone Development Process Optimization," Optical Microlithography XXII, Proceedings of SPIE, 2009, vol. 7274, pp. 72740I-1-72740I-12.

Fonseca C., et al., "Advances in Dual-Tone Development for Pitch Frequency Doubling," Optical Microlithography XXIII, Proceedings of SPIE, 2010, vol. 7640, pp. 76400E-1-76400E-12.

Hong S., et al., "Acid Diffusion Characteristics of Relacs™ Coating for 193nm Lithography," Advances in Resist Technology and Processing XXI, Proceedings of SPIE, 2004, vol. 5376, pp. 285-293.

Kaitz J., et al., "Contact Hole Shrink of 193nm NTD Immersion Resist," Advances in Patterning Materials and Processes XXXVI, Proceedings of SPIE, 2019, vol. 10960, pp. 1096022-1-1096022-9.

Kim J-S., et al., "Implementation of Sub-150 nm Contact Hole Pattern by Resist Flow Process," Japanese Journal of Applied Physics, Dec. 1998, vol. 37, No. 12B, pp. 6863-6868.

Kim S-H., et al., "Realization of sub-80nm Small Space Patterning in ArF Photolithography," Advances in Resist Technology and Processing XXI, Proceedings of SPIE, 2004, vol. 5376, pp. 1082-1090.

Liu C., et al., "Chemical Trimming Overcoat: An Enhancing Composition and Process for 193nm Lithography," Advances in Patterning Materials and Processes XXXII, Proceedings of SPIE, 2016, vol. 9779, pp. 97791Y-1-97791Y-10.

Miyamoto Y., et al., "Advanced Shrink Material for NTD Process with Lower Y/X Shrinkage Bias of Elongated Patterns," Advances in Patterning Materials and Processes XXXII, Proceedings of the SPIE, 2015, vol. 9425, pp. 942520-1-942520-6.

Oyama K., et al., "The Enhanced Photoresist Shrink Process Technique toward 22nm Node," Advances in Resist Materials and Processing Technology XXVIII, Proceedings of SPIE, 2011, vol. 7972, pp. 7972Q-1-7972Q-6.

Shiu W., et al., "Advanced Self-aligned Double Patterning Development for Sub-30-nm Dram Manufacturing," Optical Microlithography XXII, Proceedings of SPIE, 2009, vol. 7274, pp. 72740E-1-72740E-7.

Terai M., et al., "Below 70-nm Contact Hole Pattern with Relacs Process on ArF Resist," Advances in Resist Technology and Processing XX, Proceedings of SPIE, 2003, vol. 5039, pp. 789-797.

Yaegashi H., et al., "Recent Progress on Multiple-Patterning Process," Advances in Patterning Materials and Processes XXXI, Proceedings of the SPIE, 2014, vol. 9051, pp. 90510X-1-90510X-7.

Yang X., et al., "Shrink Assist Film for Enhanced Resolution (SAFIER™) Process for Printing of 20 nm Trenches with High Aspect Ratio," Emerging Lithographic Technologies VIII, Proceedings of SPIE, 2004, vol. 5374, pp. 558-565.

* cited by examiner

500

550

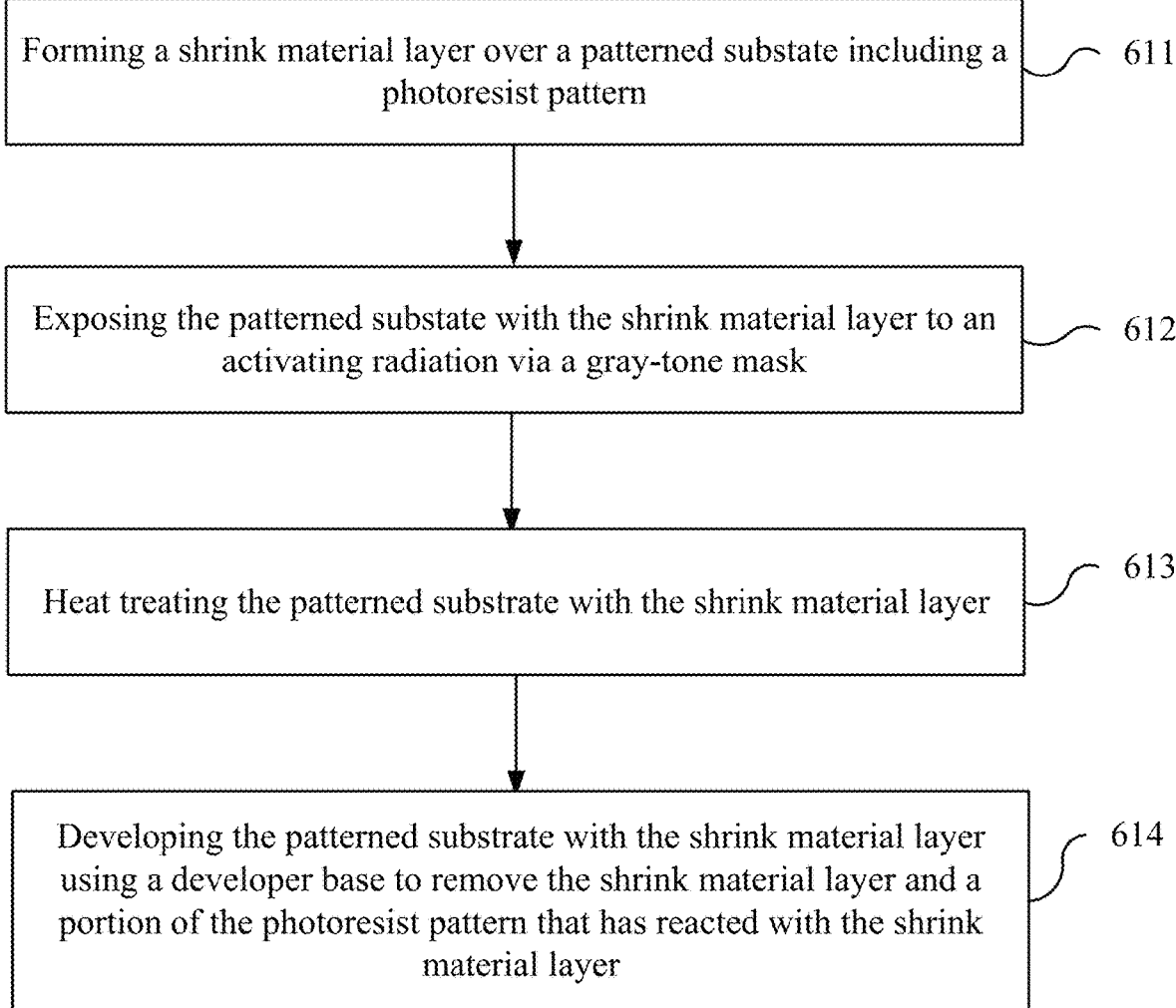

Forming a shrink material layer over a patterned substate including a photoresist pattern — 611

Exposing the patterned substate with the shrink material layer to an activating radiation via a gray-tone mask — 612

Heat treating the patterned substrate with the shrink material layer — 613

Developing the patterned substrate with the shrink material layer using a developer base to remove the shrink material layer and a portion of the photoresist pattern that has reacted with the shrink material layer — 614

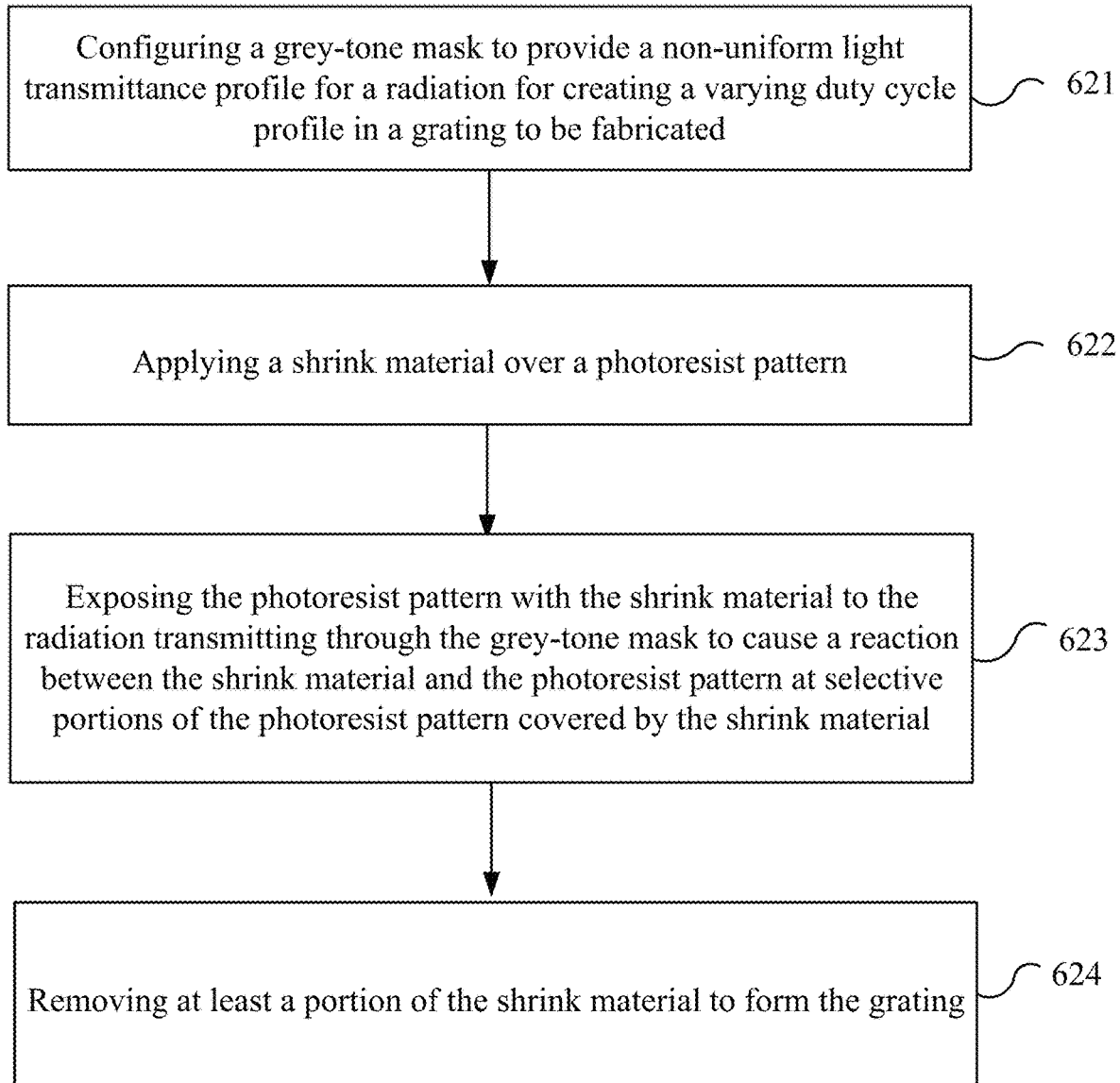

Configuring a grey-tone mask to provide a non-uniform light transmittance profile for a radiation for creating a varying duty cycle profile in a grating to be fabricated     621

Applying a shrink material over a photoresist pattern     622

Exposing the photoresist pattern with the shrink material to the radiation transmitting through the grey-tone mask to cause a reaction between the shrink material and the photoresist pattern at selective portions of the photoresist pattern covered by the shrink material     623

Removing at least a portion of the shrink material to form the grating     624

TUNABLE SHRINKAGE AND TRIM PROCESS FOR FABRICATING GRATINGS

CROSS REFERENCE TO RELATED APPLICATION

This application claims the benefit of priority to U.S. Provisional Application No. 63/282,160, filed on Nov. 22, 2021. The content of the above-mentioned application is incorporated herein by reference in its entirety.

TECHNICAL FIELD

The present disclosure generally relates to fabrication methods of gratings and, more specifically, to tunable shrinkage and trim process for fabricating gratings.

BACKGROUND

An artificial reality system, such as a head-mounted display ("HMD") or heads-up display ("HUD") system, generally includes a near-eye display ("NED") system in the form of a headset or a pair of glasses, and configured to present content to a user via an electronic or optic display within, for example, about 10-20 mm in front of the eyes of a user. The NED system may display virtual objects or combine images of real objects with virtual objects, as in virtual reality ("VR"), augmented reality ("AR"), or mixed reality ("MR") applications. For example, in an AR system, a user may view both images of virtual objects (e.g., computer-generated images ("CGIs")) and the surrounding environment by, for example, seeing through transparent display glasses or lenses (also referred to as an optical see-through AR system).

One example of an optical see-through AR system may include a pupil-expansion light guide display system, in which an image light representing a CGI may be coupled into a light guide (e.g., a transparent substrate), propagate within the light guide, and be coupled out of the light guide at different locations to expand an effective pupil. Diffractive optical elements may be coupled with the light guide to couple the image light into or out of the light guide via diffraction, such as surface relief gratings, holographic gratings, metasurface gratings, etc.

SUMMARY OF THE DISCLOSURE

Consistent with an aspect of the present disclosure, a method is provided. The method includes forming a shrink material layer over a patterned substrate including a photoresist pattern. The method also includes exposing the patterned substrate with the shrink material layer to an activating radiation via a grey-tone mask that provides a predetermined light transmittance profile for the activating radiation. The method also includes removing at least a portion of the shrink material layer.

Consistent with another aspect of the present disclosure, a method is provided. The method includes configuring a grey-tone mask to provide a non-uniform light transmittance profile for a radiation for creating a varying duty cycle profile in a grating to be fabricated. The method also includes applying a shrink material over a photoresist pattern. The method also includes exposing the photoresist pattern with the shrink material to the radiation transmitting through the grey-tone mask to cause a reaction between the shrink material and the photoresist pattern at selective portions of the photoresist pattern covered by the shrink material. The method further includes removing at least a portion of the shrink material to form the grating.

Consistent with another aspect of the present disclosure, a method is provided. The method includes forming a photoresist pattern through a lithography mask via a lithography process, the photoresist pattern including a first duty cycle profile. The method also includes applying a shrink material over the photoresist pattern. The method also includes exposing the photoresist pattern with the shrink material to a radiation through a grey-tone mask having a non-uniform light transmittance profile for the radiation, the non-uniform light transmittance profile corresponding to a second duty cycle profile that is different from the first duty cycle profile. The method further includes removing at least a portion of the shrink material to form a grating having the second duty cycle profile.

Other aspects of the present disclosure can be understood by those skilled in the art in light of the description, the claims, and the drawings of the present disclosure. The foregoing general description and the following detailed description are exemplary and explanatory only and are not restrictive of the claims.

BRIEF DESCRIPTION OF THE DRAWINGS

The following drawings are provided for illustrative purposes according to various disclosed embodiments and are not intended to limit the scope of the present disclosure. In the drawings:

FIG. 6B illustrates a flow chart showing a method for selectively reducing critical dimensions of lithography-defined features, according to an embodiment of the present disclosure;

FIG. 6C illustrates a flow chart showing a method for selectively reducing critical dimensions of lithography-defined features, according to an embodiment of the present disclosure;

DETAILED DESCRIPTION

Figure 1A:
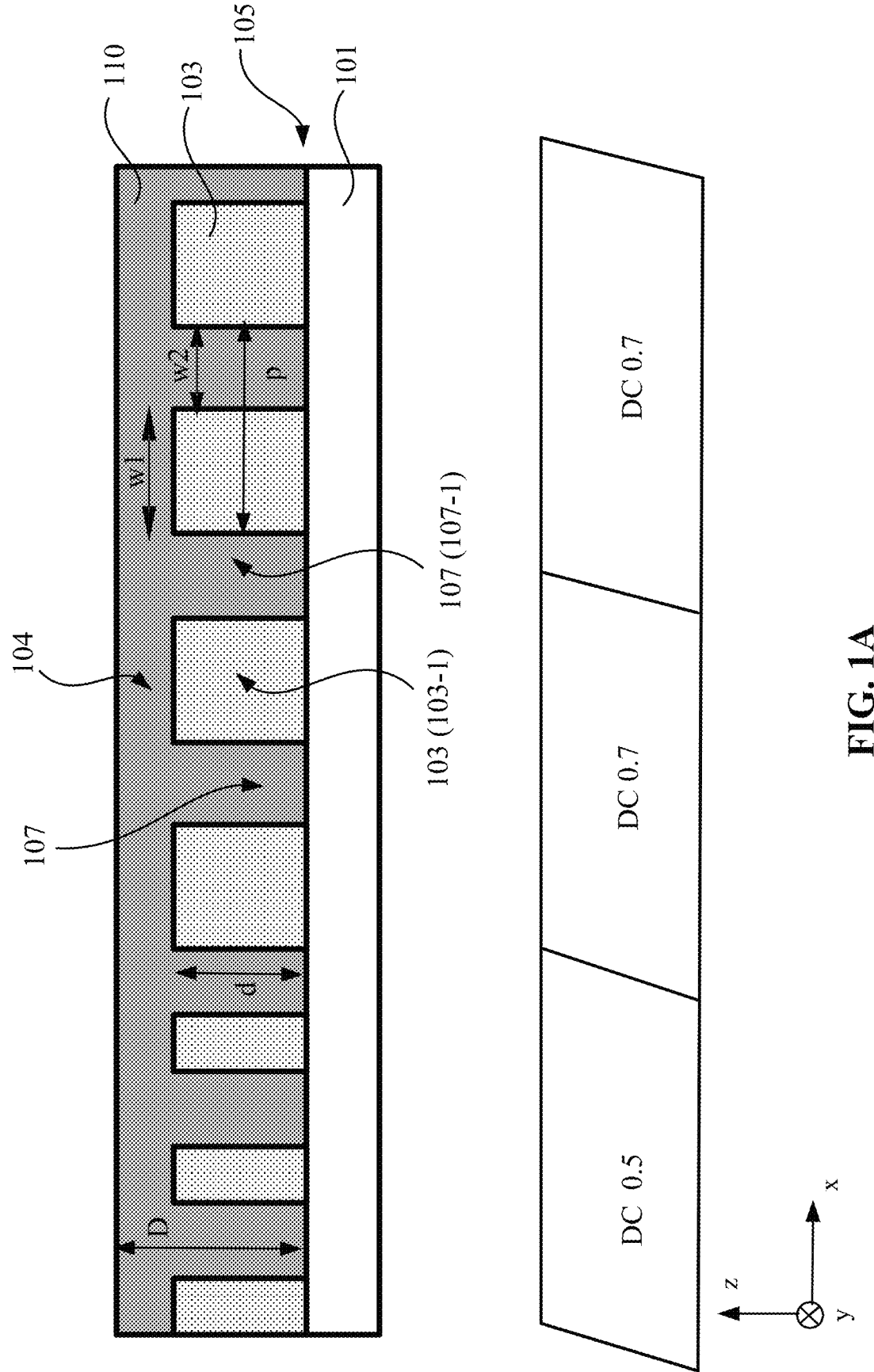
FIGS. 1A-1C illustrate schematic diagrams showing processes for selectively reducing critical dimensions of lithography-defined features, according to an embodiment of the present disclosure.

Embodiments consistent with the present disclosure will be described with reference to the accompanying drawings, which are merely examples for illustrative purposes and are not intended to limit the scope of the present disclosure. Wherever possible, the same reference numbers are used throughout the drawings to refer to the same or similar parts, and a detailed description thereof may be omitted.

Further, in the present disclosure, the disclosed embodiments and the features of the disclosed embodiments may be combined. The described embodiments are some but not all of the embodiments of the present disclosure. Based on the disclosed embodiments, persons of ordinary skill in the art may derive other embodiments consistent with the present disclosure. For example, modifications, adaptations, substitutions, additions, or other variations may be made based on the disclosed embodiments. Such variations of the disclosed embodiments are still within the scope of the present disclosure. Accordingly, the present disclosure is not limited to the disclosed embodiments. Instead, the scope of the present disclosure is defined by the appended claims.

As used herein, the terms "couple," "coupled," "coupling," or the like may encompass an optical coupling, a mechanical coupling, an electrical coupling, an electromagnetic coupling, or any combination thereof. An "optical coupling" between two optical elements refers to a configuration in which the two optical elements are arranged in an optical series, and a light output from one optical element may be directly or indirectly received by the other optical element. An optical series refers to optical positioning of a plurality of optical elements in a light path, such that a light output from one optical element may be transmitted, reflected, diffracted, converted, modified, or otherwise processed or manipulated by one or more of other optical elements. In some embodiments, the sequence in which the plurality of optical elements are arranged may or may not affect an overall output of the plurality of optical elements. A coupling may be a direct coupling or an indirect coupling (e.g., coupling through an intermediate element).

The phrase "at least one of A or B" may encompass all combinations of A and B, such as A only, B only, or A and B. Likewise, the phrase "at least one of A, B, or C" may encompass all combinations of A, B, and C, such as A only, B only, C only, A and B, A and C, B and C, or A and B and C. The phrase "A and/or B" may be interpreted in a manner similar to that of the phrase "at least one of A or B." For example, the phrase "A and/or B" may encompass all combinations of A and B, such as A only, B only, or A and B. Likewise, the phrase "A, B, and/or C" has a meaning similar to that of the phrase "at least one of A, B, or C." For example, the phrase "A, B, and/or C" may encompass all combinations of A, B, and C, such as A only, B only, C only, A and B, A and C, B and C, or A and B and C.

When a first element is described as "attached," "provided," "formed," "affixed," "mounted," "secured," "connected," "bonded," "recorded," or "disposed," to, on, at, or at least partially in a second element, the first element may be "attached," "provided," "formed," "affixed," "mounted," "secured," "connected," "bonded," "recorded," or "disposed," to, on, at, or at least partially in the second element using any suitable mechanical or non-mechanical manner, such as depositing, coating, etching, bonding, gluing, screwing, press-fitting, snap-fitting, clamping, etc. In addition, the first element may be in direct contact with the second element, or there may be an intermediate element between the first element and the second element. The first element may be disposed at any suitable side of the second element, such as left, right, front, back, top, or bottom.

When the first element is shown or described as being disposed or arranged "on" the second element, term "on" is merely used to indicate an example relative orientation between the first element and the second element. The description may be based on a reference coordinate system shown in a figure, or may be based on a current view or example configuration shown in a figure. For example, when a view shown in a figure is described, the first element may be described as being disposed "on" the second element. It is understood that the term "on" may not necessarily imply that the first element is over the second element in the vertical, gravitational direction. For example, when the assembly of the first element and the second element is turned 180 degrees, the first element may be "under" the second element (or the second element may be "on" the first element). Thus, it is understood that when a figure shows that the first element is "on" the second element, the configuration is merely an illustrative example. The first element may be disposed or arranged at any suitable orientation relative to the second element (e.g., over or above the second element, below or under the second element, left to the second element, right to the second element, behind the second element, in front of the second element, etc.).

When the first element is described as being disposed "on" the second element, the first element may be directly or indirectly disposed on the second element. The first element being directly disposed on the second element indicates that no additional element is disposed between the first element and the second element. The first element being indirectly disposed on the second element indicates that one or more additional elements are disposed between the first element and the second element.

The term "processor" used herein may encompass any suitable processor, such as a central processing unit ("CPU"), a graphics processing unit ("GPU"), an application-specific integrated circuit ("ASIC"), a programmable logic device ("PLD"), or any combination thereof. Other processors not listed above may also be used. A processor may be implemented as software, hardware, firmware, or any combination thereof.

The term "controller" may encompass any suitable electrical circuit, software, or processor configured to generate a control signal for controlling a device, a circuit, an optical element, etc. A "controller" may be implemented as software, hardware, firmware, or any combination thereof. For example, a controller may include a processor, or may be included as a part of a processor.

The term "non-transitory computer-readable medium" may encompass any suitable medium for storing, transferring, communicating, broadcasting, or transmitting data, signal, or information. For example, the non-transitory computer-readable medium may include a memory, a hard disk, a magnetic disk, an optical disk, a tape, etc. The memory may include a read-only memory ("ROM"), a random-access memory ("RAM"), a flash memory, etc.

The term "film," "layer," "coating," or "plate" may include rigid or flexible, self-supporting or free-standing film, layer, coating, or plate, which may be disposed on a supporting substrate or between substrates. The terms "film, " "layer," "coating," and "plate" may be interchangeable. The term "diffraction efficiency" as used herein is a quantitative measurement of the extent to which energy of an incident light is diffracted by a diffractive element. The diffraction efficiency may be defined as a ratio between an intensity (or optical power) of a diffracted light output from the diffractive element and an intensity (or optical power) of the incident light. The diffraction efficiency of the diffractive element may be calculated for a specific incident light, or a specific polarized component in the incident light.

In a pupil-replication or pupil-expansion light display system, a light source assembly may generate an image light representing a virtual image. An in-coupling grating may couple the image light into a light guide as an in-coupled light. The in-coupled light may propagate within the light guide toward an out-coupling grating through total internal reflection ("TIR"). Hence, the in-coupled light is also referred to as a TIR propagating light. When propagating inside the light guide, the TIR propagating light may be incident onto different portions of the out-coupling grating. The out-coupling grating may couple the TIR propagating light out of the light guide at the different portions as a plurality of out-coupled or output lights. In this manner, the out-coupling grating may replicate the image light received from the light source assembly to expand an effective pupil of the light guide display assembly. As the TIR propagating light are gradually coupled out of the light guide at different portions of the out-coupling grating, the intensity of the TIR propagating light inside the light guide may gradually decrease. When the out-coupling grating provides a uniform or constant diffraction efficiencies for the TIR propagating light (or a predetermined polarized component of the TIR propagating light) incident onto different portions of the out-coupling grating, the intensities or illuminances of the out-coupled lights may gradually decrease. Thus, the light guide display system may provide a non-uniform illuminance at the output side of the light guide, and the images perceived by eyes of a user may have a low uniformity.

To compensate for the decrease in the light intensity of the TIR propagating light as it is gradually coupled out of the light guide, the diffraction efficiency of the out-coupling grating may be configured to gradually increase. When a surface relief grating ("SRG") is implemented as the out-coupling grating, the SRG may be configured to have a broad spatial variation of duty cycle ranging from, e.g., 0.1 to 0.9. The diffraction efficiency of the SRG is determined, in part, by the duty cycle. For example, as the duty cycle of the SRG increases, the diffraction efficiency may increase accordingly. Thus, the spatial variation of the duty cycle may provide a spatial variation of the diffraction efficiency at different regions of the SRG. Accordingly, the intensities or illuminances of the out-coupled lights from different portions of the light guide may be adjustable for improving the illuminance uniformity within the eye-box region.

In conventional lithography technologies, it may be challenging to fabricate SRGs with a substantially high duty cycle (e.g., 0.8, 0.9, etc.), due to the critical dimension being as small as 20-60 nm without using double patterning techniques and 193-nm immersion technology. State-of-the-art 193-nm lithography may use a bright field mask with negative tone development ("NTD") and an organic developer for printing iso-hole and iso-trench. A trench shrink material may be used as a negative photoresist. However, it may be challenging to achieve varying shrinkage amounts at selective areas using traditional shrink materials and processes. In addition, it may be also challenging to fabricate SRGs with a substantially low duty cycle, e.g., 0.4, 0.3, 0.2, 0.1, etc., due to the critical dimension being as small as 20-60 nm without using double patterning techniques and the 193-nm immersion technology. State-of-the-art 193-nm lithography may use positive tone development ("PTD") and an aqueous developer for printing features with a low duty cycle. Trim etch process is often used to further reduce the duty cycle. However, it may be challenging to achieve variable trim amounts at selective areas using traditional trim materials and processes. It may be also expensive and time consuming to change the mask for different design iterations of variable duty cycle maps, or accommodate the duty cycle correction from etch bias changes.

In view of the limitations in conventional technologies, the present disclosure provides various methods for selectively adjusting (e.g., reducing) critical dimensions of predefined features using a grey-tone mask. The predefined features may include a plurality of lithography-defined features of a photoresist pattern, such as photoresist lines, trenches, holes, or contact openings, etc. Through configuring a light transmittance variation of the grey-tone mask, the critical dimensions of the lithography-defined features may be selectively reduced. For example, the critical dimensions of the lithography-defined features at selective portions of the photoresist pattern may be reduced. In addition, through configuring a light transmittance variation of the grey-tone mask, the reduction amounts of the critical dimensions of the respective lithography-defined features of the photoresist pattern may be configurable, thereby providing final features of desirable critical dimensions.

The disclosed methods may allow much smaller critical dimensions to be defined as part of the manufacturing process for various devices, e.g., microelectronic devices (e.g., integrated circuits) and optical devices (e.g., gratings) including nano-sized features, without using a new lithography mask or changing the lithography conditions. For example, the disclosed methods and processes may be used to fabricate an SRG with nano-sized features and a broad variation of the duty cycle. The broad variation of the duty cycle of the SRG may include at least one of a substantially low duty cycle (e.g., 0.4, 0.3, 0.2, or 0.1, etc.) and/or a substantially high duty cycle (e.g., 0.8, or 0.9, etc.). For illustrative purposes, one-dimensional ("1D") SRGs are used as examples to explain the fabrication processes and methods. The disclosed fabrication processes and methods may also be applied to fabricate two-dimensional ("2D") SRGs and three-dimensional ("3D") SRGs. The SRGs fabricated based on the disclosed methods and processes may be implemented as an out-coupling grating in a light guide display system to further improve the illuminance uniformity within the eye-box region.

Figure 1B:
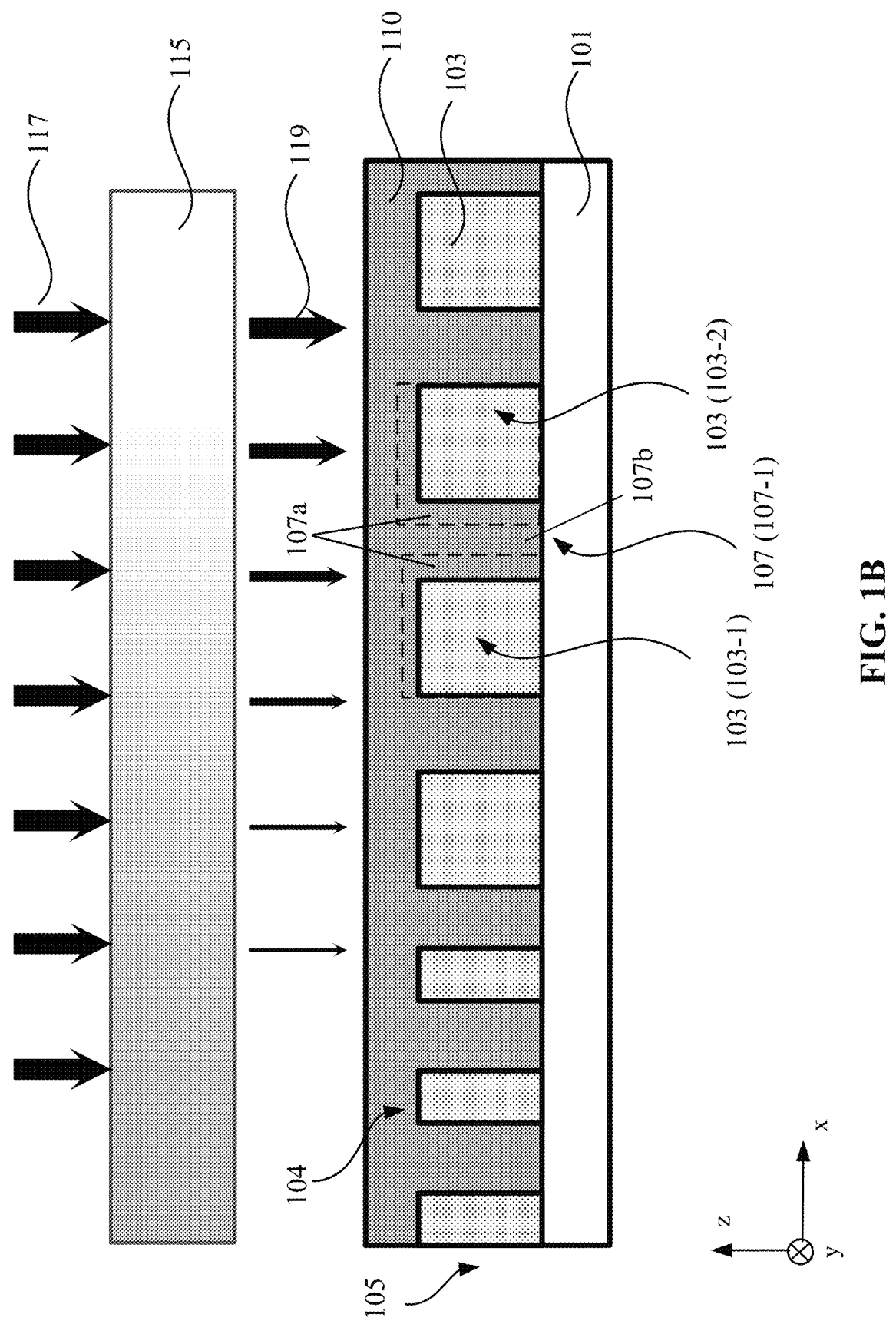
Figure 1C:
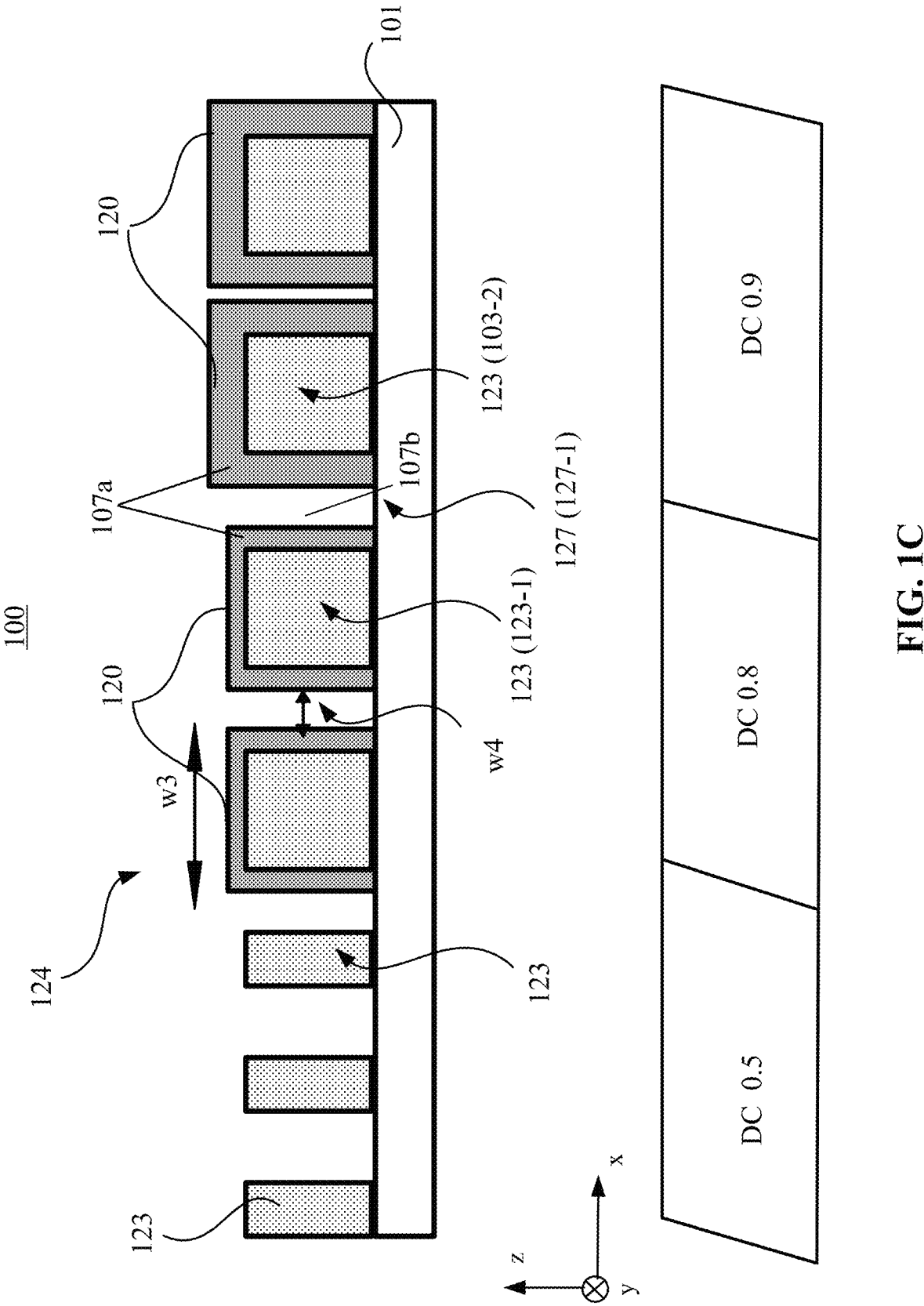

FIGS. 1A-1C illustrate schematic diagrams showing processes for selectively reducing a critical dimension of predefined features (e.g., lithography-defined features), according to an embodiment of the present disclosure. For illustrative purposes, trenches in a photoresist pattern are used as examples of the predefined features (e.g., lithography-defined features) to explain the processes. The disclosed processes may also be applied to selectively reducing other predefined features (e.g., other lithography-defined features), such as holes and contact openings in a photoresist pattern.

As shown in FIG. 1A, a substrate 101 with a first photoresist pattern 104 may be provided. In some embodiments, the substrate 101 provided with the first photoresist pattern 104 may also be referred to as a patterned substrate 105. In some embodiments, the patterned substrate 105 may include at least one of a photoresist layer, an ion implant layer, a dielectric layer, a microelectronic wafer, a microelectromechanical systems structures, or a functional surface of a microelectromechanical system. The substrate 101 may provide support and protection to various layers, films, and/or structures formed thereon. In some embodiments, the substrate 101 may be a wafer, a glass, a plastic, a sapphire, or a combination thereof, etc. In some embodiments, the substrate 101 may include silicon, a silicon substrate coated with a metal surface, a silicon wafer coated with copper, copper, aluminum, a polymeric resin, silicon dioxide, a metal, doped silicon dioxide, silicon nitride, silicon carbide, tantalum, polysilicon, ceramics, an aluminum-copper mixture, glass, coated glass, gallium arsenide, other Group III/V compounds, etc. In some embodiments, the substrate 101 may be rigid, semi-rigid, flexible, or semi-flexible. In some embodiments, the substrate 101 may include a flat surface or a curved surface, on which the various layers, films, and/or structures may be formed. In some embodiments, the substrate 101 may be a part of another element or device (e.g., another opto-electrical element or device, another electrical element or device). For example, the substrate 101 may be a solid optical lens, a part of a solid optical lens, or a light guide, etc.

The first photoresist pattern 104 may include a plurality of photoresist structures 103 with sizes at the nano level or micron level. The photoresist structures 103 may include a plurality of predefined features. In the embodiment shown in FIG. 1A, the photoresist structures 103 may be rectangular pillars (also referred to as photoresist lines 103 for discussion purposes). The cross-sections of the photoresist structures 103 may be rectangular shapes. In some embodiments, the cross-sections of the photoresist structures 103 may be triangular shapes, trapezoidal structures, more complex shapes, or a combination thereof. The photoresist structures 103 may define a plurality of openings for forming a plurality of trenches 107. For illustrative purposes, the photoresist structures 103 are schematically illustrated as rectangular structures filled with dots, and the trenches 107 are shown as spaces between the rectangular structures filled with dots.

The photoresist structures 103 may be arranged in a 1D array or a 2D array on the substrate 101. The photoresist structures 103 may be slanted or may be perpendicular with respect to the substrate 101. In some embodiments, the photoresist structures 103 may be integrally formed as a part of the substrate 101 at a surface (e.g., an upper surface shown in FIG. 1A) of the substrate 101, based on the same material or different materials. In some embodiments, the photoresist structures 103 may be formed or disposed at (e.g., affixed to) a surface (e.g., an upper surface shown in FIG. 1A) of the substrate 101, and the photoresist structures 103 and the substrate 101 may fabricated based on the same material or different materials.

In some embodiments, a period or pitch p of the first photoresist pattern 104 may be defined as a distance between two neighboring photoresist structures 103. In some embodiments, the period p may be uniform or constant for the entire photoresist pattern 104. In some embodiments, at least one period p between two neighboring photoresist structures 103 may be different from another period p between another two neighboring photoresist structures 103. That is, in some embodiments, the period p of the first photoresist pattern 104 may vary along one or two directions within a plane of the first photoresist pattern 104. A line width $w_1$ of the first photoresist pattern 104 may be defined as a width of a single photoresist structure 103 of the first photoresist pattern 104. In some embodiments, the line width $w_1$ may be uniform or constant for the entire photoresist pattern 104. In some embodiments, the line width $w_1$ may vary along one or two directions within a plane of the first photoresist pattern 104. That is, at least two photoresist structures 103 may have different widths. A width $w_2$ of the trench 107 may be a difference between the period p and the line width $w_1$. A duty cycle ("DC" in FIG. 1A) of the first photoresist pattern 104 may be defined as a ratio between the line width $w_1$ and the period p. In some embodiments, the duty cycle of the first photoresist pattern 104 may be uniform or constant for the entire photoresist pattern 104. In some embodiments, the duty cycle of the first photoresist pattern 104 may vary along one or two directions within a plane of the first photoresist pattern 104, e.g., a duty cycle at a first portion of the first photoresist pattern 104 may be different from a duty cycle at a second portion of the first photoresist pattern 104. A duty cycle variation of the first photoresist pattern 104 may be referred to as a first duty cycle variation.

A depth d of the first photoresist pattern 104 may be defined as a depth of the trench 107 or a height of the photoresist structure 103. An aspect ratio of the first photoresist pattern 104 may be defined as a ratio between the depth d and the width $w_2$ of the trench 107. The respective trench 107 may have two sidewalls and a bottom wall between the two sidewalls. The height of the sidewall may be equal to the depth d of the first photoresist pattern 104, and the width of the bottom wall may be equal to the width $w_2$ of the trench 107. The width $w_2$ of the trench 107 may be referred to as a critical dimension of the trench 107 (or of the first photoresist pattern 104). The respective photoresist structure 103 may include two sidewalls and a top wall between the two sidewalls. The height of the sidewall may be equal to the depth d of the first photoresist pattern 104, and the width of the top wall may be equal to the line width $w_1$. In some embodiments, a surface of the first photoresist pattern 104 may include the sidewalls of the respective photoresist structures 103 (or the sidewalls of the respective trenches 107), the top walls of the respective photoresist structures 103, and the bottom walls of the respective trenches 107.

In some embodiments, the patterned substrate 105 may function as a patterned grating (e.g., an SRG) 105, and the photoresist structures 103 may function as the grating lines or grating elements. For discussion purposes, such a patterned grating (e.g., an SRG) 105 may be referred to as a base grating (e.g., a base SRG) 105. For example, the base SRG 105 may be a 1D grating or a 2D grating. The base SRG 105 may be a slanted grating or a non-slanted grating. The base SRG 105 may function as an optically isotropic grating or an optically anisotropic grating. The base SRG 105 may be a reflective grating or a transmission grating. For illustrative purposes, FIG. 1A shows the patterned substrate 105 as a 1D, binary non-slanted grating with a rectangular profile. In some embodiments, the patterned grating 105 may be a slant grating with a complex profile, e.g., a step profile, a triangular profile, a trapezoidal profile, or a combination thereof, or a blazed grating.

For illustrative purposes, FIG. 1A shows that the period p of the first photoresist pattern 104 may be uniform or constant for the entire photoresist pattern 104, e.g., about 200 nm. The width $w_2$ of the trenches 107 may not be uniform or constant for the entire photoresist pattern 104. For example, the width $w_2$ of the trench 107 may decrease in +x-axis direction, and the widths $w_2$ of the trenches 107 located at a left portion, a central portion, and a right portion of the first photoresist pattern 104 may be 100 nm, 60 nm, and 60 nm, respectively. Accordingly, the duty cycle at the left portion, the central portion, and the right portion of the first photoresist pattern 104 may be calculated as 0.5, 0.7, and 0.7, respectively. Although not shown, in some embodiments, the plurality of trenches 107 may be configured with a predetermined 1D or 2D width variation in one or two dimensions within a plane (e.g., an x-y plane shown in FIG. 1A) perpendicular to a thickness direction (e.g., a z-axis direction shown in FIG. 1A) of the first photoresist pattern 104. Accordingly, the first photoresist pattern 104 may be configured with a predetermined 1D or 2D duty cycle variation in one or two dimensions within the plane (e.g., the x-y plane shown in FIG. 1A) perpendicular to the thickness direction (e.g., the z-axis direction shown in FIG. 1A) of the first photoresist pattern 104. In some embodiments, the period p, the linewidth $w_1$, and the duty cycle of the first photoresist pattern 104 may be uniform for the entire photoresist pattern 104, respectively, such as a first photoresist pattern 204 used in the processes shown in FIGS. 2A-2C.

The patterned substrate 105 may be fabricated using any suitable methods, such as etching, lithography (e.g., photolithography, holographic lithography, or nano-imprint lithography, etc.), ink-jet printing, or micro-molding, etc. In some embodiments, the fabrication processes of the patterned substrate 105 may include forming a layer of a photoresist composition (also referred to as 103 for discussion purposes) over the substrate 101; exposing the layer of the photoresist composition 103 to an activating radiation (referred to as a first activating radiation) through a patterned photomask; and developing the exposed layer of the photoresist composition 103 in a developer base to form the first photoresist pattern 104.

In some embodiments, the photoresist composition 103 may include a mixture of a photoresist (e.g., a polymer or monomers) and one or more photosensitive compound (e.g., one or more photoacid generators ("PAGs")). In some embodiments, the photoresist composition 103 may include a first PAG configured to generate acid groups (referred to as first acid groups) when subject to the first activating radiation. The first acid groups may react with the photoresist in the layer of the photoresist composition 103, resulting in a solubility difference between the exposed regions and the unexposed regions of the layer of the photoresist composition 103 in the developer base. That is, the first PAG may be configured for the formation of the first photoresist pattern 104, and may be referred to as a PAG for primary exposure. In some embodiments, the photoresist composition 103 may include additional ingredients, e.g., a second PAG different from the first PAG, an initiator for polymerization, etc.

In some embodiments, the photoresist composition 103 may be dissolved in one or more solvents to form a solution, and the solution may be applied over (e.g., coated on) the substrate 101 to form the layer of the photoresist composition 103. In some embodiments, after forming the layer of the photoresist composition 103 over the substrate 101, and before exposing the layer of the photoresist composition 103 to the first activating radiation through the patterned photomask, the fabrication processes of the patterned substrate 105 may further include heat treating the layer of the photoresist composition 103 in a softbake process (e.g., post apply baking) to remove the one or more solvents.

In some embodiments, the patterned photomask may be a binary half-tone photomask that uses two levels of grey tones (e.g., including optically opaque regions with about 0% light transmittance and optically transparent regions with about 100% light transmittance). The first activating radiation through the patterned photomask may activate the first PAG to generate first acid groups that react with the photoresist in the layer of the photoresist composition 103, resulting in a solubility difference between the exposed regions and the unexposed regions of the layer of the photoresist composition 103 in the developer base. In some embodiments, the photoresist composition 103 may include a positive photoresist, and the exposed regions of the layer of the photoresist composition 103 corresponding to the optically transparent regions of the patterned photomask may be soluble and removed in the subsequent development step (e.g., via an aqueous developer base). In some embodiments, the photoresist composition 103 may include a negative photoresist, and the unexposed regions of the layer of the photoresist composition 103 corresponding to the optically opaque regions of the patterned photomask may be soluble and removed in the subsequent development step (e.g., via an organic developer base). In some embodiments, after exposing the layer of the photoresist composition 103 to the activating radiation through the patterned photomask, and before developing the exposed layer of the photoresist composition 103 to form the first photoresist pattern 104, the fabrication processes of the patterned substrate 105 may further include heat treating the layer of the photoresist composition 103 in a hardbake process (e.g., post exposure baking).

Referring to FIG. 1A, after the patterned substrate 105 is provided, a layer of a shrink material 110 (also referred to as a shrink material layer 110) may be formed over the patterned substrate 105. The shrink material layer 110 may be formed at the patterned substrate 105 using any suitable methods, e.g., coating, dipping, deposition, etc. In some embodiments, the shrink material 110 may be dissolved in a mixture of one or more solvents (e.g., one or more organic solvents) to form a solution. A suitable amount of the solution may be dispensed on the patterned substrate 105 using any suitable solution dispensing process, e.g., spin coating, slot coating, blade coating, roll-coating, spray coating, or jet (ink-jet) coating or printing, etc. In some embodiments, the formed shrink material layer 110 may be heat treated in a softbake process (e.g., post apply baking) to remove the one or more solvents from the dispensed solution.

The shrink material layer 110 may be applied to at least a portion of the surface of the first photoresist pattern 104 to flatten or planarize the first photoresist pattern 104. At least one (e.g., each) of the trenches 107 may be filled with the shrink material 110. For example, the entire trench 107 between the neighboring photoresist structures 103 may be filled with the shrink material 110. The first photoresist pattern 104 provided with the shrink material layer 110 may have a substantially uniform thickness/) across the entire first photoresist pattern 104. In some embodiments, as shown in FIG. 1A, the shrink material 110 may be disposed at the entire surface of the first photoresist pattern 104, e.g., covering the sidewalls of the respective photoresist structures 103 or respective trenches 107, the top walls of the respective photoresist structures 103, and the bottom walls of the respective trenches 107. In such a configuration, the thickness/) may be greater than the depth d of the trench 107. In some embodiments, the shrink material 110 may not be disposed at the top walls of the respective photoresist structures 103. In such a configuration, the thickness/) may be substantially equal to the depth d of the trench 107.

In some embodiments, the shrink material 110 may include a polymer or small molecules (e.g., molecule weight less than 1000) with protected amine functionalities (e.g., including one or more amine functional groups and one or more amine protecting groups). Examples of the polymer or small molecules with protected amine functionalities may include tert-butyl carbamate methacrylate-polymethyl methacrylate ("PMMA") copolymer, methacrylate copolymer with photobase generator group, etc. The polymer or small molecules with protected amine functionalities may be soluble in a mixture of one or more organic solvents to form a solution. At least one of the organic solvents may have a boiling point greater than 150° C. Examples of the organic solvent may include propylene glycol methyl ether acetate ("PGMEA"), propylene glycol methyl ether, anisole, cyclohexanone, propylene carbonate, di(propylene glycol) butyl ether, di(propylene glycol) methyl ether, di(propylene glycol) methyl ether acetate, butyl lactate, 2-ethylhexyl-lactate, benzyl benzoate, n-methyl-2-pyrrolidinone, gamma-butyrolactone, tripropylene glycolmethylether, 1,6-diacetoxyhexane, 3-phenoxy toluene, benzyl alcohol, tolyl ether, terpineol, etc. In some embodiments, the total solid content in the formulation may be within a range of about 0.5-10 wt %. For example, the concentration of the polymer or small molecules with protected amine functionalities in the solution may be within a range of about 0.5-10 wt %. In some embodiments, the solution may include PGMEA, dissolved with tert-butyl carbamate methacrylate-PMMA copolymer of 5 wt % and a photoacid generator of 1 wt %. In some embodiments, the solution may include PGMEA, dissolved with methacrylate copolymer with a photobase generator group of 5 wt %.

In some embodiments, the shrink material 110 may include monomers that are photo-polymerizable. The photopolymerization of the shrink material 110 may result in a shrink of the trench 107. Such a photo-polymerization of the shrink material 110 may also be referred to as a shrink polymerization for discussion purposes. Examples of the monomers capable of shrink polymerization may include cross-linkable acrylate-methacrylate mixtures (e.g., Bisphenol A ("BPA") diacrylate), thiol-ene compositions including aromatic thiols (e.g., benzene dithiol isomers) and aromatic ene (or yne) monomers (e.g., BPA diallyl ether), epoxy or glycidyl ether or oxetane monomers including fluorene bisglycidyl ether or other aromatic cyclic ethers, etc. The monomers may be soluble in a mixture of one or more organic solvents to form a solution. At least one of the organic solvents may have a boiling point greater than 150° C. In some embodiments, the total solid content in the formulation may be within a range of about 0.5-10 wt %. For example, the concentration of the monomers in the solution may be within a range of about 0.5-10 wt %. Examples of the organic solvent may include PGMEA, propylene glycol methyl ether, anisole, cyclohexanone, propylene carbonate, di(propylene glycol) butyl ether, di(propylene glycol) methyl ether, di(propylene glycol) methyl ether acetate, butyl lactate, 2-ethylhexyl-lactate, benzyl benzoate, n-methyl-2-pyrrolidinone, gamma-butyrolactone, tripropylene glycolmethylether, 1,6-diacetoxyhexane, 3-phenoxy toluene, benzyl alcohol, tolyl ether, terpineol, etc.

The patterned substrate 105 may include a photosensitive material that may be activated when the patterned substrate 105 with the shrink material layer 110 is exposed to an activating radiation, e.g., a second activating radiation different from the first activating radiation. The activated photosensitive material may react with the shrink material 110. Such a photosensitive material may be referred to as a photosensitive material for secondary exposure. In some embodiments, the photosensitive material for secondary exposure may be included in the first photoresist pattern 104. For example, the photoresist structures 103 may be configured to include the photosensitive material for secondary exposure before forming the solution for dispensing. Thus, the photosensitive material for secondary exposure may be distributed in the first photoresist pattern 104.

In some embodiments, the photosensitive material for secondary exposure may be disposed at (e.g., on) the surface of the first photoresist pattern 104, after the first photoresist pattern 104 is fabricated and before the shrink material layer 110 is formed over the first photoresist pattern 104. For example, before forming the shrink material layer 110 over the patterned substrate 105, a solution dissolved with the photosensitive material for secondary exposure may be applied to the surface of the first photoresist pattern 104. In some embodiments, the photosensitive material for secondary exposure may be at least disposed at (e.g., on) the sidewalls of the respective photoresist structures 103 (or the sidewalls of the respective trenches 107). In some embodiments, the photosensitive material for secondary exposure may also be disposed at the top walls of the respective photoresist structures 103.

In some embodiments, the photosensitive material for secondary exposure may include a residual first PAG from the first photoresist pattern 104. The residual first PAG may be the first PAG that has not been activated by the first activating radiation and, thus, remains in the first photoresist pattern 104 after the first photoresist pattern 104 is fabricated. In some embodiments, the photosensitive material for secondary exposure and the first PAG may be the same PAG. That is, the first PAG for fabricating the first photoresist pattern 104 (or for primary exposure) may also function as the photosensitive material for secondary exposure, and the photosensitive material for secondary exposure may be included in the first photoresist pattern 104 (or the photoresist composition 103).

In some embodiments, the photosensitive material for secondary exposure may be different from the residual first PAG in the first photoresist pattern 104. In such an embodiment, the photosensitive material for secondary exposure may be included in the first photoresist pattern 104, or disposed at (e.g., on) the surface of the first photoresist pattern 104 before the shrink material layer 110 is formed over the patterned substrate 105. In some embodiments, the photosensitive material for secondary exposure and the first PAG for primary exposure may be activated by activating radiations of the same wavelength. In some embodiments, the photosensitive material for secondary exposure and the first PAG for primary exposure may be activated by activating radiations of different wavelengths. For example, the first PAG may be activated by an activating radiation with a wavelength of equal to or less than 350 nm, and the photosensitive material for secondary exposure may be activated by an activating radiation with a wavelength of greater than 350 nm.

In some embodiments, the shrink material 110 may be configured to include a polymer or small molecules with protected amine functionalities. The photosensitive material for secondary exposure configured to include a PAG (e.g., a second PAG) configured to generate acid groups (e.g., second acid groups), under the second activating radiation. The second acid groups may react with the amine functional groups of the molecular units (e.g., small molecules or fragments of polymeric molecules) in the shrink material 110, de-protecting the amine functional groups. The second PAG may be included in the first photoresist pattern 104 or disposed at (e.g., on) the first photoresist pattern 104 before the shrink material layer 110 is formed over the first photoresist pattern 104.

In some embodiments, the second PAG may be included in the first photoresist pattern 104, and may include the residual first PAG from the first photoresist pattern 104. In some embodiments, the second PAG and the first PAG may be the same PAG. That is, the PAG for primary exposure may also function as the PAG for secondary exposure. In some embodiments, the second PAG may be different from the first PAG, and the second PAG may be included in the first photoresist pattern 104, or disposed at (e.g., on) the surface of the first photoresist pattern 104 before the shrink material layer 110 is formed over the patterned substrate 105. In some embodiments, the second PAG and the first PAG may be activated by activating radiations of different wavelengths. For example, the first PAG may be activated by an activating radiation with a wavelength of equal to or less than 350 nm, and the second PAG may be activated by an activating radiation with a wavelength of greater than 350 nm. In some embodiments, the second PAG and the first PAG may be activated by activating radiations of the same wavelength.

In some embodiments, the shrink material 110 may be configured to include monomers capable of shrink polymerization, and the photosensitive material for secondary exposure may be configured to include an initiator for the photo-polymerization of the monomers. Such an initiator may be referred to as a shrink polymerization initiator for discussion purposes. The shrink polymerization initiator may be included in the first photoresist pattern 104, or disposed at (e.g., on) the surface of the first photoresist pattern 104 before the shrink material layer 110 is formed over the patterned substrate 105. The shrink material 110 itself may not include the shrink polymerization initiator. The shrink polymerization initiator may be configured to generate, under the second activating radiation, initiating species that may react with the monomer double bonds in the shrink material 110, resulting in a polymerization of the monomers. The shrink polymerization initiator may be included in the first photoresist pattern 104 or disposed at (e.g., on) the first photoresist pattern 104. In some embodiments, the photoresist composition 103 may be configured to include the shrink polymerization initiator, before the first photoresist pattern 104 is fabricated. For example, the shrink polymerization initiator and the photoresist may be mixed to form the photoresist composition 103, and the photoresist composition 103 may be dissolved in the solvent to form the solution for dispensing. In some embodiments, the shrink polymerization initiator may be disposed at (e.g., on) the surface of the first photoresist pattern 104, before the shrink material layer 110 is formed over the first photoresist pattern 104.

In some embodiments, the shrink polymerization initiator may include a third PAG that generates initiating species for photoinduced radical polymerization of monomers under the second activating radiation. In some embodiments, the third PAG may be included in the first photoresist pattern 104, and may include the residual first PAG from the first photoresist pattern 104 (or the photoresist composition 103). That is, the PAG for primary exposure may also function as the PAG for secondary exposure. In some embodiments, the third PAG may be different from the first PAG in the photoresist composition 103, and the third PAG may be included in the first photoresist pattern 104, or disposed at (e.g., on) the surface of the first photoresist pattern 104 before the shrink material layer 110 is formed over the patterned substrate 105. In some embodiments, the third PAG and the first PAG may be activated by activating radiations of different wavelengths. For example, the first PAG may be activated by an activating radiation with a wavelength of equal to or less than 350 nm, and the third PAG may be activated by an activating radiation with a wavelength of greater than 350 nm. In some embodiments, the third PAG and the first PAG may be activated by activating radiations of the same wavelength.

In some embodiments, the shrink polymerization initiator may include a photoradical generator or photoradical initiator that generates initiating species for photoinduced cationic polymerization of monomers under an activating radiation. The photoradical initiator may be included in the first photoresist pattern 104, or disposed at (e.g., on) the surface of the first photoresist pattern 104 before the shrink material layer 110 is formed over the patterned substrate 105. The photoradical initiator may be classified as one-component (type I system), two-component (type II system), and multicomponent photo-initiating system. In some embodiments, the photoradical initiator may include one-component (type I system), such as phosphine oxides (e.g., phenylbis(acyl) phosphine oxide ("BAPO"), diphenyl(acyl) phosphine oxide ("TPO")), a Norrish Type 1 initiator, etc. In some embodiments, the photoradical initiator may include two-component (type II system), such as a camphoroquinone-tertiary amine system.

As shown in FIG. 1B, after the shrink material layer 110 is formed over the patterned substrate 105, the patterned substrate 105 provided with the shrink material layer 110 may be exposed to an activating radiation (referred to as the second activating radiation) via a grey-tone (or grey-scale) mask 115. The grey-tone mask 115 may be configured to provide a predetermined 1D or 2D light transmittance profile of the second activating radiation. That is, at different portions of the grey-tone mask 115, the light transmittance may be different. Any desirable light transmittance profile may be configured for the grey-tone mask 115, depending on the duty cycle profile to be achieved for the grating. In some embodiments, the light transmittance profile may be uniform, continuously gradient, or arbitrary with desired discrete values. For example, the grey-tone mask 115 may include at least three levels of grey tones to provide at least three different levels of transmission of the second activating radiation. In some embodiments, the different levels of transmission may be 0%, 25%, 50%, 75%, and 100%, etc. Thus, when a light 117 having a spatially uniform light intensity is incident onto the grey-tone mask 115, a transmitted light 119 of the grey-tone mask 115 may have a spatially varying light intensity.

In some embodiments, the grey-tone mask 115 may be configured with a predetermined 1D or 2D light transmittance variation in one or two dimensions within a plane (e.g., the x-y plane shown in FIG. 1B) perpendicular to a thickness direction (e.g., the z-axis direction shown in FIG. 1B) of the grey-tone mask 115. Thus, a light transmitted through the grey-tone mask 115 may have a predetermined 1D or 2D light intensity variation in one or two dimensions within the plane perpendicular to the thickness direction of the grey-tone mask 115. In some embodiments, in the one or two dimensions within the plane perpendicular to the thickness direction of the grey-tone mask 115, the light transmittance of the grey-tone mask 115 may decrease or increase in a gradient manner. The gradient manner may be a linearly gradient manner, a non-linearly gradient manner, a stepped gradient manner, or a suitable combination thereof.

Figure 5A:
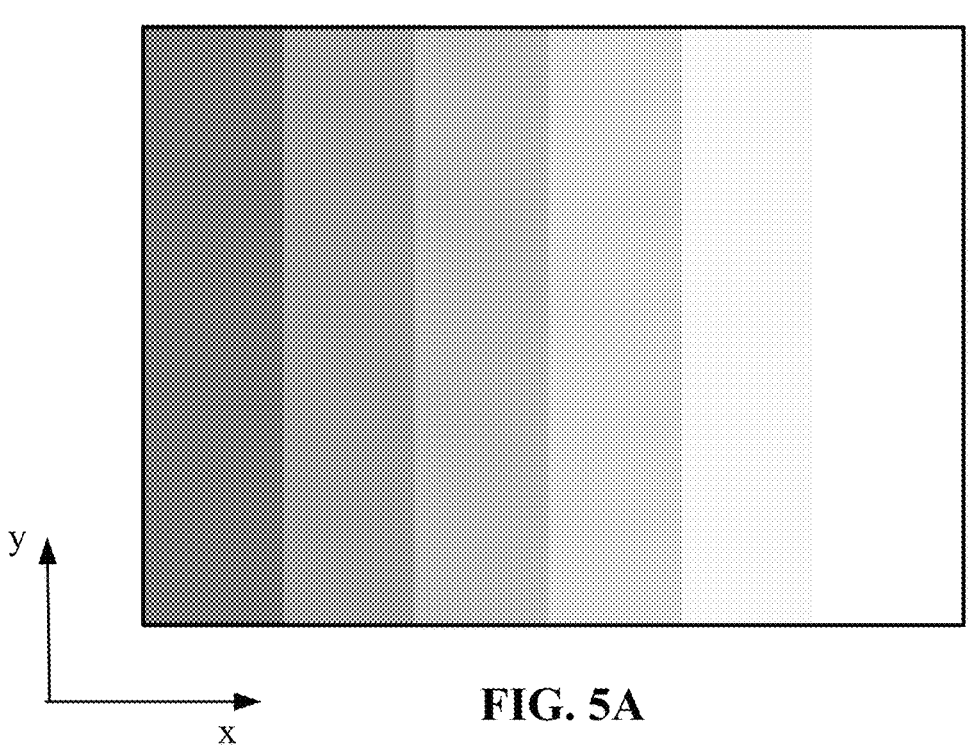
FIG. 5A illustrates a schematic diagram of a grey-tone mask configured with a one-dimensional ("1D") light transmittance variation, according to an embodiment of the present disclosure.
Figure 5B:
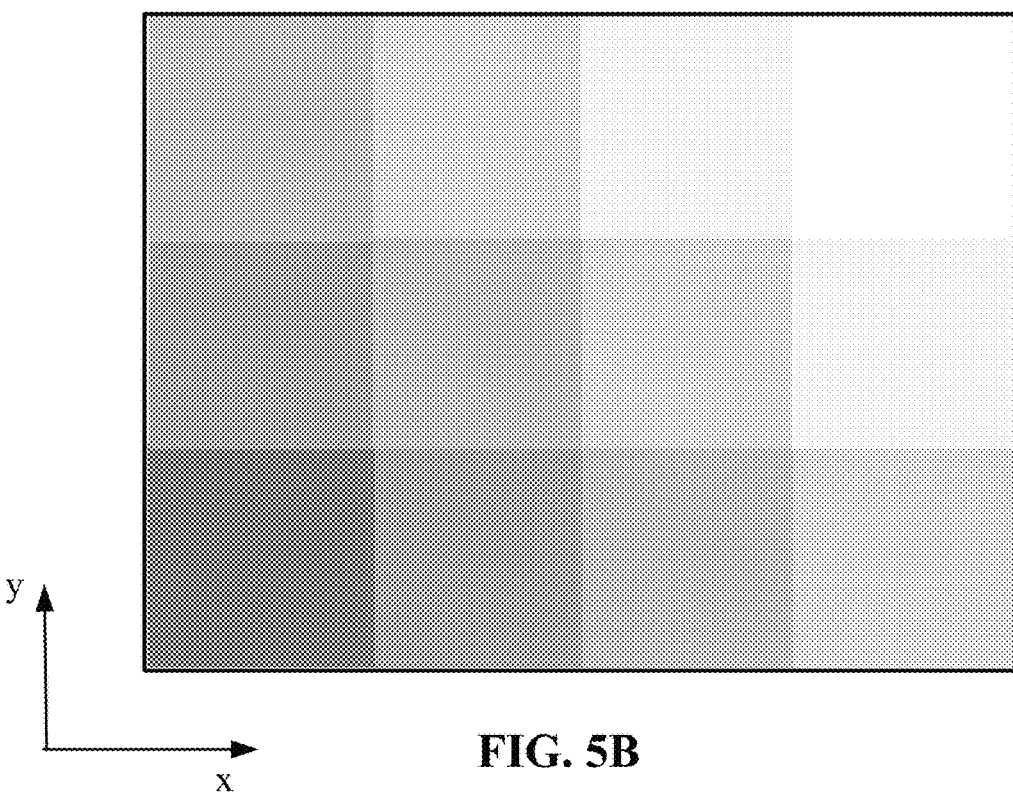
FIG. 5B illustrates a schematic diagram of a grey-tone mask configured with a two-dimensional ("2D") light transmittance variation, according to an embodiment of the present disclosure.

For example, FIG. 5A illustrates an x-y section of a grey-tone mask 500 configured with a 1D light transmittance variation according to an embodiment of the present disclosure, and FIG. 5B illustrates an x-y section of a grey-tone mask 550 configured with a 2D light transmittance variation according to an embodiment of the present disclosure. The light transmittance of the grey-tone mask 500 or 550 is represented by grey scales, in which the darker grey indicates a lower light transmittance, and the lighter grey indicates a higher light transmittance. For discussion purpose, the grey-tone mask 500 shown in FIG. 5A may include six levels of grey tones arranged in the x-axis direction. The light transmittance of the grey-tone mask 550 may increase in the +x-axis direction. For discussion purpose, the grey-tone mask 500 shown in FIG. 5B includes six levels of grey tones arranged in both of the x-axis direction and y-axis direction. The light transmittance of the grey-tone mask 550 may increase in both of the +x-axis direction and the +y-axis direction.

Referring back to FIG. 1B, FIG. 1B shows that the grey-tone mask 115 is configured with a 1D light transmittance variation in an x-axis direction. The light transmittance of the grey-tone mask 115 is represented by grey scales, in which the darker grey indicates a lower light transmittance, and the lighter grey indicates a higher light transmittance. For illustrative purposes, FIG. 1B shows that the light transmittance of the grey-tone mask 115 increases in the +x-axis direction. Thus, the intensity of the light 119 transmitted through the grey-tone mask 115 increases in the +x-axis direction, and the patterned substrate 105 may be subject to the second activating radiation with the exposure intensity gradually increasing in the +x-axis direction.

In some embodiments, when exposed to the second activating radiation via the grey-tone photomask (also referred to as a secondary exposure), the patterned substrate 105 with the shrink material layer 110 may be subject to a secondary photoreaction, in which the second activating radiation may activate the photosensitive material for secondary exposure included in or disposed over the first photoresist pattern 104, and the activated photosensitive material for secondary exposure may react with the shrink material layer 110. For example, the second activating radiation may activate the second PAG to generate the second acid groups that may react with the amine functional groups of the molecular units (e.g., small molecules or fragments of polymeric molecules) in the shrink material 110, or activate the shrink polymerization initiator to generate the initiating species that may react with the monomer double bonds in the shrink material 110.

The amount of the second acid groups or initiating species generated in the first photoresist pattern 104 may be determined, in part, by the intensity of the second activating radiation. In some embodiments, the second activating radiation with a higher intensity may generate more second acid groups or initiating species in the first photoresist pattern 104. Here "the first photoresist pattern" may encompass a photoresist pattern including the photosensitive material for secondary exposure and/or a photoresist pattern disposed with the photosensitive material for secondary exposure.

In some embodiments, the wavelength of the second activating radiation may be substantially the same as, or different from (e.g., longer than) the wavelength of the first activating radiation, depending on the activating wavelengths of the photosensitive material for secondary exposure and the first PAG for primary exposure. In some embodiments, the wavelength of the first activating radiation to activate the first PAG may be equal to or less than 350 nm, and the wavelength of the second activating radiation to activate the photosensitive material for secondary exposure may be greater than 350 nm.

In some embodiments, after the secondary exposure of the patterned substrate 105 with the shrink material layer 110, the patterned substrate 105 with the shrink material layer 110 may be heat treated in a hardbake process (e.g., post exposure bake, not shown). In some embodiments, the temperature of the post exposure bake may be within a range from about 90° C. to about 200° C., or within a range from about 90° C. to about 150° C. In some embodiments, the time duration of the post exposure bake may be within a range from about 1 minute to about 5 mins. For example, for the shrink material layer 110 including the polymer or small molecules with protected amine functionalities, the temperature of the post exposure bake may be within a range from about 90° C. to about 200° C. (e.g., 110° C.), and the time duration of the post exposure bake may be within a range from about 1 minute to about 5 minutes (e.g., 1 minute). In some embodiments, for the shrink material layer 110 including the monomers, the temperature of the post exposure bake may be within a range from about 90° C. to about 150° C. (e.g., 90° C.), and the time duration of the post exposure bake may be within a range from about 1 minute to about 5 minutes.

In some embodiments, during the post exposure bake of the patterned substrate 105 with the shrink material layer 110, the second acid groups or initiating species generated in the first photoresist pattern 104 may diffuse into the shrink material layer 110, thereby reacting with the shrink material layer 110. The second acid groups or initiating species generated in the first photoresist pattern 104 may diffuse into the shrink material layer 110 at least through the sidewalls of the respective photoresist structures 103. In some embodiments, the second acid groups or initiating species generated in the first photoresist pattern 104 may also diffuse into the shrink material layer 110 through the top walls of the respective photoresist structures 103.

For example, in some embodiments, the shrink material layer 110 may be configured to include molecular units (e.g., small molecules or fragments of polymeric molecules) with protected amine functional groups, and the patterned substrate 105 may be configured to include the second PAG in the first photoresist pattern 104 or disposed over the first photoresist pattern 104. When exposed to the second activating radiation via the grey-tone photomask, the second PAG may generate the second acid groups (or secondary-photoreaction-generated acid groups), which may diffuse to the shrink material layer 110 and react with the molecular units (e.g., small molecules or fragments of polymeric molecules) with protected amine functional groups.

In some embodiments, the shrink material layer 110 may be configured to include the monomers capable of shrink polymerization, and the patterned substrate 105 may be configured to include the shrink polymerization initiator in the first photoresist pattern 104 or disposed over the first photoresist pattern 104. When exposed to the second activating radiation via the grey-tone photomask, the shrink polymerization initiator may generate the initiating species, which may diffuse to the shrink material layer 110 and react with the monomer double bonds in the monomers.

The shrink material layer 110 may include a first portion in which the concentration of the diffused second acid groups or initiating species is greater than or equal to a threshold value, and a second portion in which the concentration of the diffused second acid groups or initiating species is less than the threshold value. The reaction between the diffused second acid groups or initiating species and the shrink material layer 110 may substantially occur in the first portion of the shrink material layer 110, and may not occur in the second portion of the shrink material layer 110. For illustrative and discussion purposes, FIG. 1B shows the shrink material 110 filled into the trench 107 (e.g., 107-1) may include a first portion 107a and a second portion 107b. The first portion 107a may be located closer to the sidewalls of the trench 107-1 (that is also the interface of the trench 107-1 and the shrink material layer 110) than the second portion 107b. In some embodiments, the first portion 107a may include the diffused second acid groups or initiating species with a concentration greater than or equal to a predetermined value, and the second portion 107b may include the diffused second acid groups or initiating species with a concentration less than the predetermined value. In some embodiments, the second acid groups or initiating species may diffuse into the first portion 107a, and may not diffuse into the second portion 107b. The reaction between the diffused second acid groups or initiating species and the shrink material 110 filled into the trench 107 may substantially occur in the first portion 107a, rather than in the second portion 107b.

As shown in FIG. 1C, after the secondary exposure and the post exposure bake, the patterned substrate 105 with the shrink material layer 110 may be rinsed using a rinsing solution (not shown). In some embodiments, the rinsing solution may include one or more organic solvents. Examples of the organic solvent may include propylene PGMEA, propylene glycol methyl ether, anisole, cyclohexanone, propylene carbonate, di(propylene glycol) butyl ether, di(propylene glycol) methyl ether, di(propylene glycol) methyl ether acetate, butyl lactate, 2-ethylhexyl-lactate, benzyl benzoate, n-methyl-2-pyrrolidinone, gamma-butyrolactone, tripropylene glycolmethylether, 1,6-diacetoxyhexane, 3-phenoxy toluene, benzyl alcohol, tolyl ether, terpineol, etc.

The secondary exposure of the patterned substrate 105 with the shrink material layer 110 may result in a solubility difference between the first portion of the shrink material layer 110 that has reacted with the diffused second acid groups or initiating species and the second portion of the shrink material layer 110 that has not reacted with the diffused second acid groups or initiating species. The first portion of the shrink material layer 110 may be substantially insoluble in the rinsing solution, and therefore may remain on the substrate 101. The second portion of the shrink material layer 110 may be substantially soluble in the rinsing solution, and thereby may be removed from the substate 101. For example, for the shrink material 110 filled into the trench 107-1, the secondary exposure of the patterned substrate 105 with the shrink material layer 110 may result in a solubility difference between the first portion 107a and the second portion 107b. The first portion 107a may be substantially insoluble in the rinsing solution, and therefore may remain on the substrate 101. The second portion 107b may be substantially soluble in the rinsing solution, and therefore may be removed from the substate 101. In some embodiments, the first photoresist pattern 104 may be substantially insoluble in the rinsing solution, without being affected by the rinsing solution.

After the rinse using the rising solution, the remaining portion (e.g., the first portion) of the shrink material 110 may be attached or bonded to at least one sidewall of at least one photoresist structure 103 of the first photoresist pattern 104, or may be provided at (e.g., coated at) at least one sidewall of at least one trench 107 of the first photoresist pattern 104, forming an interface layer 120 on the first photoresist pattern 104. The photoresist structure 103 with the reacted shrink material attached to the sidewall thereof may form a photoresist structure 123 having an increased width $w_3$, compared to the width $w_1$ of the corresponding photoresist structure 103 shown in FIG. 1B. Accordingly, the trench 127 with the reacted shrink material provided at the sidewall thereof may have a reduced width $w_4$, compared to the width $w_2$ of the corresponding trench 107 shown in FIG. 1B. That is, at least one trench 107 of the first photoresist pattern 104 may be shrunken with a reduced width.

For example, for the shrink material 110 filled into the trench 107-1, the remaining first portion 107a may be attached to the sidewalls of the photoresist structures 103-1 and 103-2, forming two photoresist structures 123-1 and 123-2 with increased width $w_3$, compared to the width $w_1$ of the corresponding photoresist structures 103-1 and 103-2 shown in FIG. 1B. The sidewalls of the trench 107-1 may be provided with the reacted shrink material 110, forming a trench 127-1 with a reduced width $w_4$, compared to the width $w_2$ of the corresponding trench 107-1 shown in FIG. 3B. That is, the trench 107-1 of the first photoresist pattern 104 may be shrunken. In some embodiments, when the shrink material layer 110 is also formed at the top surfaces of the respective photoresist structures 103 of the first photoresist pattern 104, the reacted shrink material may also be attached to the top wall of at least one photoresist structure 103. Thus, the height of the photoresist structure 123 with the reacted shrink material at the top wall may be increased, as compared to the height of the corresponding photoresist structure 103 shown in FIG. 1B. For example, the heights of the photoresist structure 123-1 and 123-3 with the reacted shrink material at the top wall may be greater than the height of the corresponding photoresist structures 103-1 and 103-2 shown in FIG. 1B.

Referring to FIGS. 1A-1C, after the rinse, the first photoresist pattern 104 with the first duty cycle variation may be transformed to a second photoresist pattern 124 with a second duty cycle variation. The second photoresist pattern 124 may include a plurality of photoresist structures (e.g., lines) 123 and a plurality of trenches 127. The trenches 107 of the first photoresist pattern 104 may be selectively shrunken to form the trenches 127 of the second photoresist pattern 124. Compared to the widths $w_2$ of the respective trenches 107 of the first photoresist pattern 104, the widths $w_4$ of the respective trenches 127 of the second photoresist pattern 124 may be selectively reduced. In some embodiments, the width reductions of the respective trenches 127 may be non-uniform across the second photoresist pattern 124. Accordingly, compared to the duty cycles at the respective portions of the first photoresist pattern 104, the duty cycles at the respective portions of the second photoresist pattern 124 may be selectively increased, in a non-uniform manner across the second photoresist pattern 124.

In some embodiments, the width reductions of the respective trenches 127 of the second photoresist pattern 124 may be determined, in part, by an exposure intensity variation of the secondary exposure via the grey-tone mask 115. The exposure intensity variation of the secondary exposure via the grey-tone mask 115 may include information of local exposure intensities to which the respective portions of the first photoresist pattern 104 are exposed. In some embodiments, a greater local exposure intensity of the secondary exposure may result in a greater width reduction of a corresponding trench 127 of the second photoresist pattern 124.

In some embodiments, the exposure intensity variation of the secondary exposure via the grey-tone mask 115 may be determined, in part, by the light transmittance variation of the grey-tone mask 115. Thus, the width reductions (or shrink) of the respective trenches 127 of the second photoresist pattern 124 may be determined, in part, by the light transmittance variation of the grey-tone mask 115. The light transmittance variation of the grey-tone mask 115 may include information of local light transmittances across the grey-tone mask 115. In some embodiments, a greater local light transmittance of the grey-tone mask 115 may result in a greater width reduction of a corresponding trench 127 of the second photoresist pattern 124.

Thus, through adjusting a local light transmittance of the grey-tone mask 115, the width reduction of a corresponding trench 127 of the second photoresist pattern 124 may be adjustable. In addition, through configuring the light transmittance variation of the grey-tone mask 115, a width reduction variation of the respective trenches 127 of the second photoresist pattern 124 may be configurable. The width reduction variation of the respective trenches 127 of the second photoresist pattern 124 may include information of the width reductions of the respective trenches 127 across the second photoresist pattern 124.

Accordingly, through adjusting a local light transmittance of the grey-tone mask 115, the duty cycle increase at a corresponding portion of the second photoresist pattern 124 may be adjustable. In addition, through configuring the light transmittance variation of the grey-tone mask 115, a duty cycle increase variation of the second photoresist pattern 124 may be configurable. The duty cycle increase variation of the second photoresist pattern 124 may include information of the duty cycle increases at the respective portions of the second photoresist pattern 124.

For discussion purposes, FIG. 1B and FIG. 1C show that as the light transmittance of the grey-tone mask 115 gradually increases in the +x-axis direction, the width reductions of the respective trenches 127 of the second photoresist pattern 124 may increase in the +x-axis direction. Referring to FIG. 1B, as the light transmittance of the grey-tone mask 115 gradually increases in the +x-axis direction, the intensity of the light 119 may gradually increase in the +x-axis direction, the amount of the second acid groups or initiating species generated in the shrink material layer 110 may gradually increase in the +x-axis direction, and the amount of the second acid groups or initiating species that diffuse into the shrink material layer 110 may gradually increase in the +x-axis direction. Thus, the amount of the shrink material 110 that react with the diffused second acid groups or initiating species may gradually increase in the +x-axis direction. After the rinse, referring to FIG. 1C, the amount of the shrink material 110 that has not reacted and, thus, is removed by the rinsing solution may gradually decrease in the +x-axis direction. Thus, the width reductions (or shrinks) of the respective trenches 127 of the second photoresist pattern 124 may increase in the +x-axis direction. Accordingly, the duty cycle increases at the respective portions of the second photoresist pattern 124 (as compared with the duty cycles of the first photoresist pattern 104) may increase in the +x-axis direction.

For example, referring to FIGS. 1A-1C, the width $w_4$ of the trenches 127 located at the left portion of the second photoresist pattern 124 may be substantially the same as the width $w_2$ of the corresponding trenches 107 of the first photoresist pattern 104, e.g., about 100 nm. The width $w_4$ of the trenches 127 located at the central portion of the second photoresist pattern 124 may be reduced to 40 nm, and the width $w_4$ of the trenches 127 located at the right portion of the second photoresist pattern 124 may be reduced to 20 nm. Compared to the width $w_2$ of the trenches 127 located at corresponding portions of the first photoresist pattern 104 (e.g., 100 nm, 60 nm, and 60 nm), the width $w_4$ of the trenches 127 located at the left portion, the central portion, and the right portion of second photoresist pattern 124 may be reduced by about 0 nm, 20 nm, and 40 nm, respectively. In other words, the trenches 127 located at the left portion, the central portion, and the right portion of second photoresist pattern 124 may be shrunken by about 0 nm, 20 nm, and 40 nm in width, respectively. The width reductions (or shrink) of the respective trenches 127 of the second photoresist pattern 124 may increase in the +x-axis direction.

Further, the duty cycles of the left portion, the central portion, and the right portion of the second photoresist pattern 124 may be calculated as 0.5, 0.8, and 0.9, respectively. Compared to the duty cycles at corresponding portions of the first photoresist pattern 104 (e.g., 0.5, 0.7, 0.7), the duty cycles at the left portion, the central portion, and the right portion of second photoresist pattern 124 may be increased by 0, 0.1, and 0.2, respectively. The duty cycle increases of the respective portions of the second photoresist pattern 124 may increase in the +x-axis direction. The second photoresist pattern 124 may have be configured to have a broader duty cycle variation (e.g., from 0.5 to 0.9, with a range of 0.4) compared to the first photoresist pattern 104 (e.g., from 0.5 to 0.7, with a range of 0.2). In some embodiments, through configuring the light transmittance variation of the grey-tone mask 115, the duty cycles at the respective portions of the second photoresist pattern 124 may be configured to include at least one substantially high duty cycle, e.g., 0.8, 0.9, etc. In some embodiments, the substrate 101 with the second photoresist pattern 124 may function as patterned grating (e.g., an SRG) 100. The SRG 100 may have a broader duty cycle variation than the base SRG 105.

The light transmittance variation of the grey-tone mask 115 shown in FIG. 1B, and the width reductions of the respective trenches 127 shown in FIG. 1C are for illustrative purposes. In some embodiments, the grey-tone mask 115 may be configured with a predetermined 1D or 2D light transmittance variation in one or two dimensions within the plane (e.g., the x-y plane shown in FIG. 1B) of the grey-tone mask 115. Thus, the light 119 transmitted through the grey-tone mask 115 may be configured to have a predetermined 1D or 2D light intensity variation in the one or two dimensions within the plane of the grey-tone mask 115. Accordingly, the trenches 127 of the second photoresist pattern 124 may be configured to have a predetermined 1D or 2D width reduction variation in the one or two dimensions within the plane of the second photoresist pattern 124. The second photoresist pattern 124 may be configured to have a predetermined 1D or 2D duty cycle variation in the one or two dimensions within the plane of the second photoresist pattern 124.

Figure 2A:
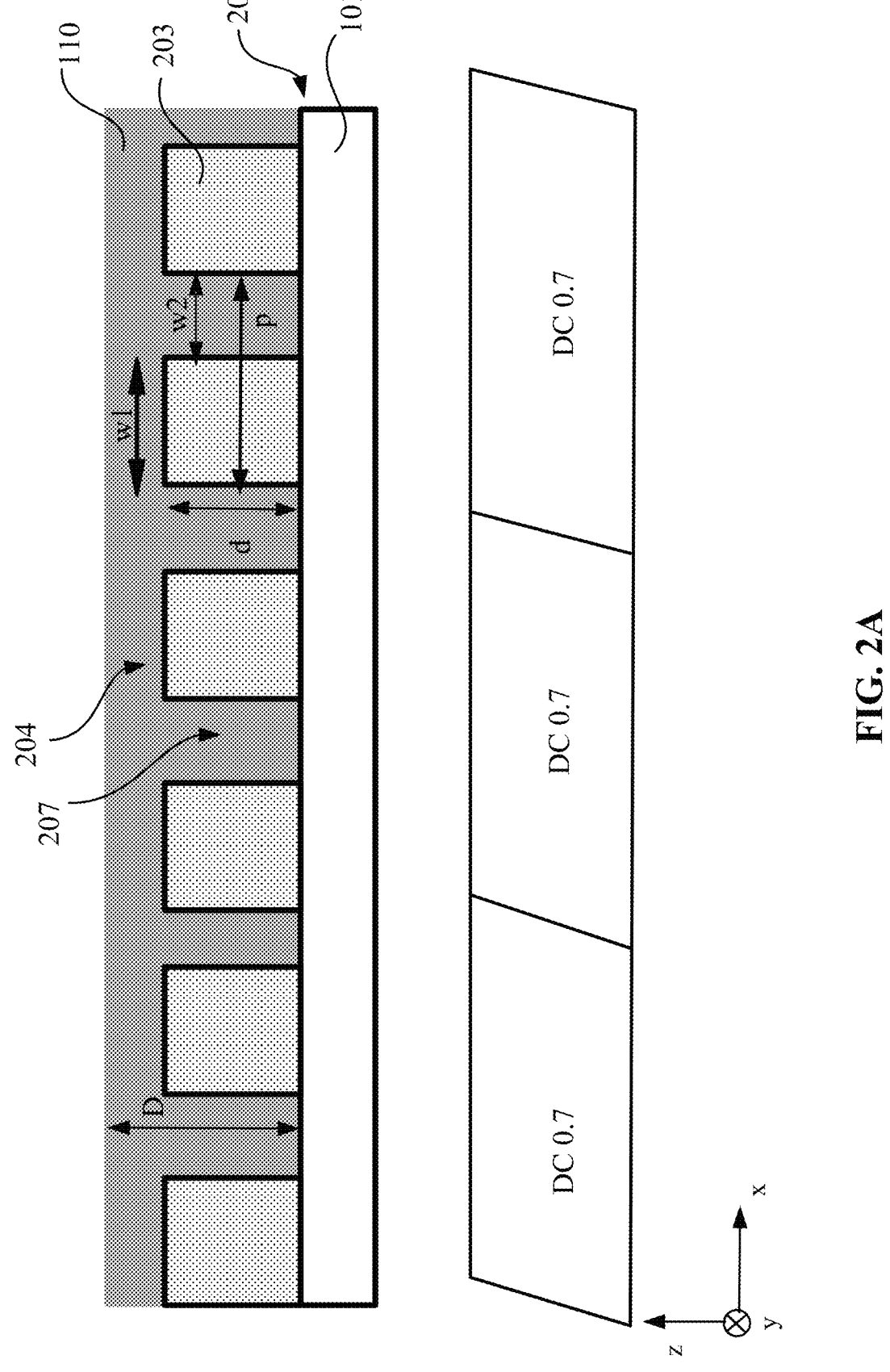
FIGS. 2A-2C illustrate schematic diagrams showing processes for selectively reducing critical dimensions of lithography-defined features, according to an embodiment of the present disclosure.
Figure 2B:
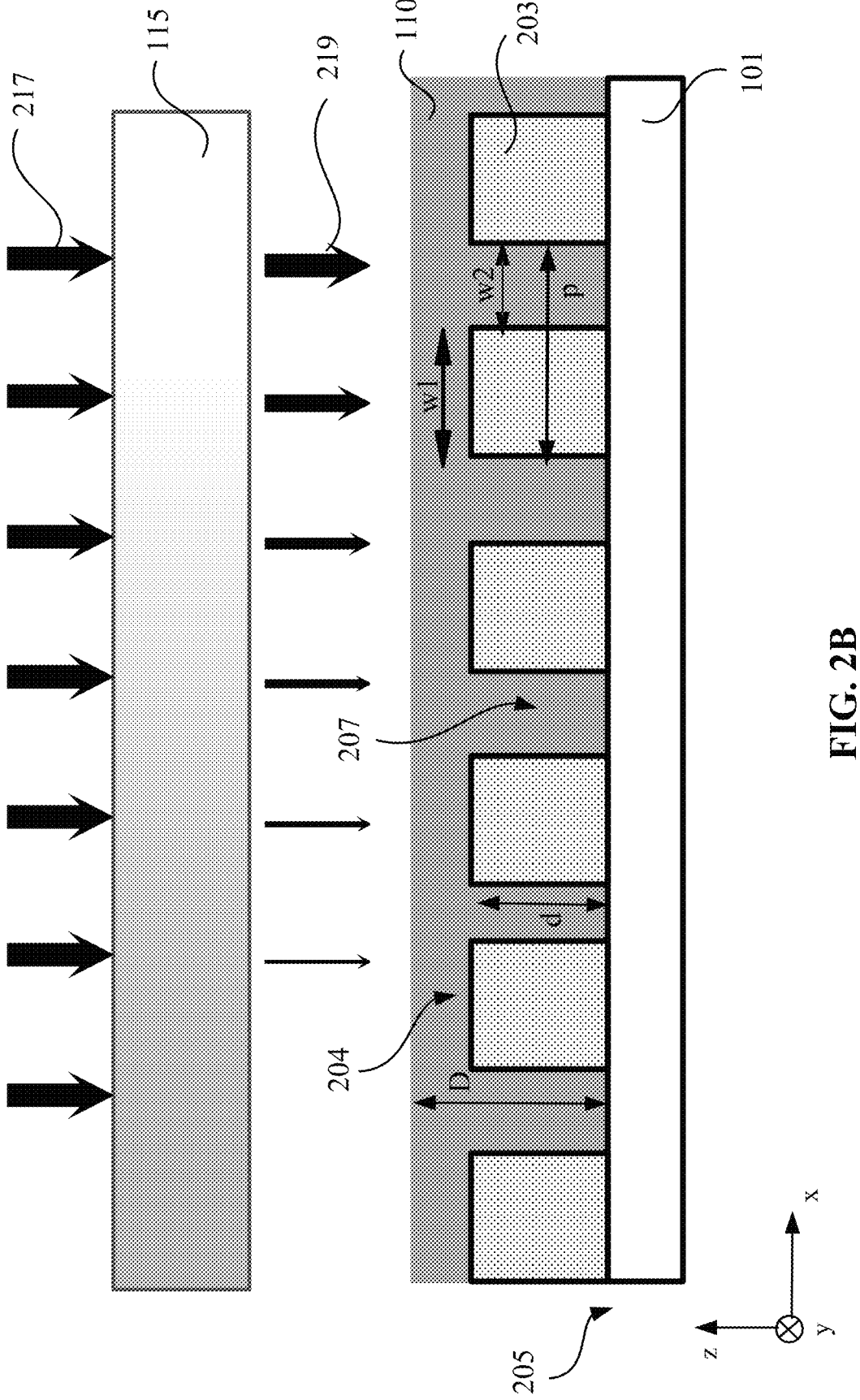
Figure 2C:
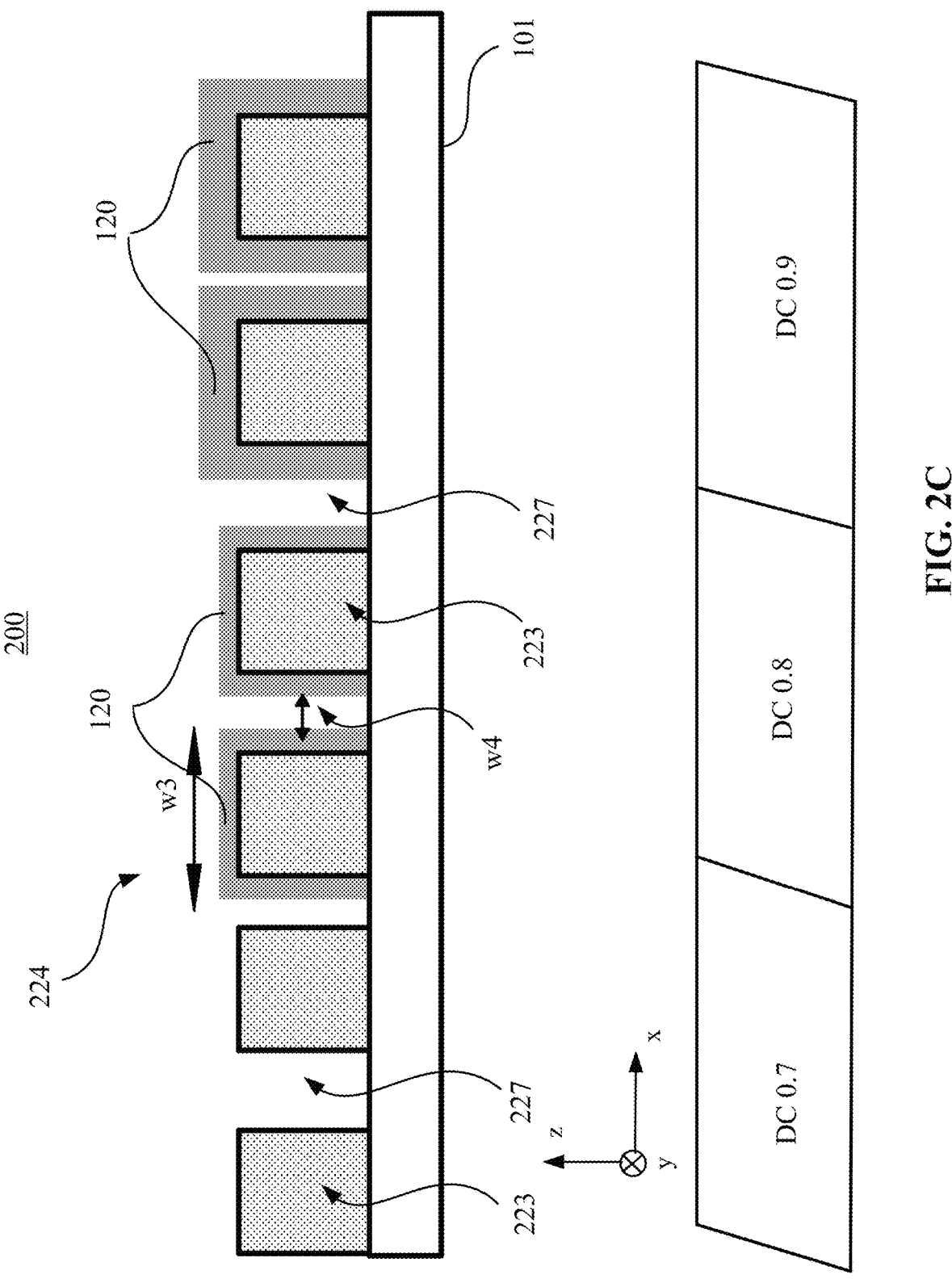

FIGS. 2A-2C illustrate schematic diagrams showing processes for selectively reducing a critical dimension of predefined features (e.g., lithography-defined features), according to an embodiment of the present disclosure. For illustrative purposes, trenches in a photoresist pattern (e.g., trenches 207 in a first photoresist pattern 204 shown in FIG. 2A) are used as examples of the lithography-defined features to explain the processes. The disclosed processes may also be applied to selectively reducing other predefined features (e.g., lithography-defined features), such as holes and contact openings. The processes shown in FIGS. 2A-2C may include steps or processes similar to those shown in FIGS. 1A-1C. An SRG 200 fabricated based on the processes shown in FIGS. 2A-2C may include elements, which are similar to those included in the SRG 100 fabricated based on the processes shown in FIGS. 1A-1C. Descriptions of the similar steps and similar elements can refer to the descriptions rendered above in connection with FIGS. 1A-1C. Although the substrate 101 and films or layers are shown as having flat surfaces, in some embodiments, the substrate and films or layers formed thereon may include curved surfaces.

For example, as shown in FIGS. 2A-2C, a substrate 201 with the first photoresist pattern 204 may be provided (also be referred to as a patterned substrate 205), and a layer of the shrink material 110 (or the shrink material layer 110) may be formed over the patterned substrate 205 to flatten or planarize the first photoresist pattern 204. In some embodiments, the patterned substrate 205 may function as the base SRG 205. The material and fabrication process of the patterned substrate 205 may be similar to the material and fabrication process of the patterned substrate 105 shown in FIG. 1A, respectively. In the embodiment shown in FIG. 2A, the first photoresist pattern 204 may have a uniform period p (e.g., about 200 nm), a uniform width $w_2$ of the trench 207 (e.g., about 60 nm), and a uniform duty cycle (e.g., about 0.7) for the entire photoresist pattern 204.

After the shrink material layer 110 is formed over the patterned substrate 205, the patterned substrate 205 provided with the shrink material layer 110 may be exposed to a second activating radiation via the grey-tone mask 115. When a light 217 having a spatially uniform light intensity is incident onto the grey-tone mask 115, a transmitted light 219 of the grey-tone mask 115 may have a spatially varying light intensity. Thus, an exposure intensity of the secondary exposure may spatially vary. After the secondary exposure, the patterned substrate 205 with the shrink material layer 110 may be subject to the post exposure bake. After the post exposure bake, the patterned substrate 205 with the shrink material layer 110 may be rinsed with the rinsing solution (not shown). After the processes shown in FIGS. 2A-2C, the first photoresist pattern 204 may be transformed to a second photoresist pattern 224 having at least one shrunken trench.

For discussion purposes, FIG. 2B and FIG. 2C show that as the light transmittance of the grey-tone mask 115 gradually increases in the +x-axis direction, the width reductions of respective trenches 227 of the second photoresist pattern 224 may increase in the +x-axis direction. Accordingly, the duty cycle increases at the respective portions of the second photoresist pattern 224 may increase in the +x-axis direction. For example, referring to FIGS. 2A-2C, the width $w_4$ of the trenches 227 located at the left portion of the second photoresist pattern 224 may be substantially the same as the width $w_2$ of the corresponding trenches 207 of the first photoresist pattern 204, e.g., about 60 nm. The width $w_4$ of the trenches 227 located at the central portion of the second photoresist pattern 224 may be reduced to 40 nm, and the width $w_4$ of the trenches 227 located at the right portion of the second photoresist pattern 224 may be reduced to 20 nm. Thus, compared to the width $w_2$ of the trenches 207 located at corresponding portions of the first photoresist pattern 204 (e.g., 60 nm, 60 nm, and 60 nm), the width $w_4$ of the trenches 227 located at the left portion, the central portion, and the right portion of second photoresist pattern 224 may be reduced by about 0 nm, 20 nm, and 40 nm, respectively. In other words, the trenches 227 located at the left portion, the central portion, and the right portion of second photoresist pattern 224 may be shrunken by about 0 nm, 20 nm, and 40 nm, respectively. The width reductions (or shrink) of the respective trenches 227 of the second photoresist pattern 224 may increase in the +x-axis direction.

Further, the duty cycles of the left portion, the central portion, and the right portion of the second photoresist pattern 224 may be calculated as 0.7, 0.8, and 0.9, respectively. Compared to the duty cycles at corresponding portions of the first photoresist pattern 204 (e.g., 0.7, 0.7, 0.7), the duty cycles at the left portion, the central portion, and the right portion of second photoresist pattern 224 may be increased by 0, 0.1, and 0.2, respectively. The duty cycle increases of the respective portions of the second photoresist pattern 224 may increase in the +x-axis direction. The second photoresist pattern 224 may be configured with a broader duty cycle variation (e.g., from 0.7 to 0.9, with a range of 0.2) compared to the first photoresist pattern 204 (e.g., with the constant duty cycle). In some embodiments, through configuring the light transmittance variation of the grey-tone mask 115, the duty cycles at the respective portions of the second photoresist pattern 224 may be configured to include at least one substantially high duty cycle, e.g., 0.8, 0.9, etc. In some embodiments, the substrate 201 with the second photoresist pattern 224 may function as a patterned grating (e.g., an SRG) 200. The SRG 200 may have a broader duty cycle variation than the base SRG 205.

Figure 3A:
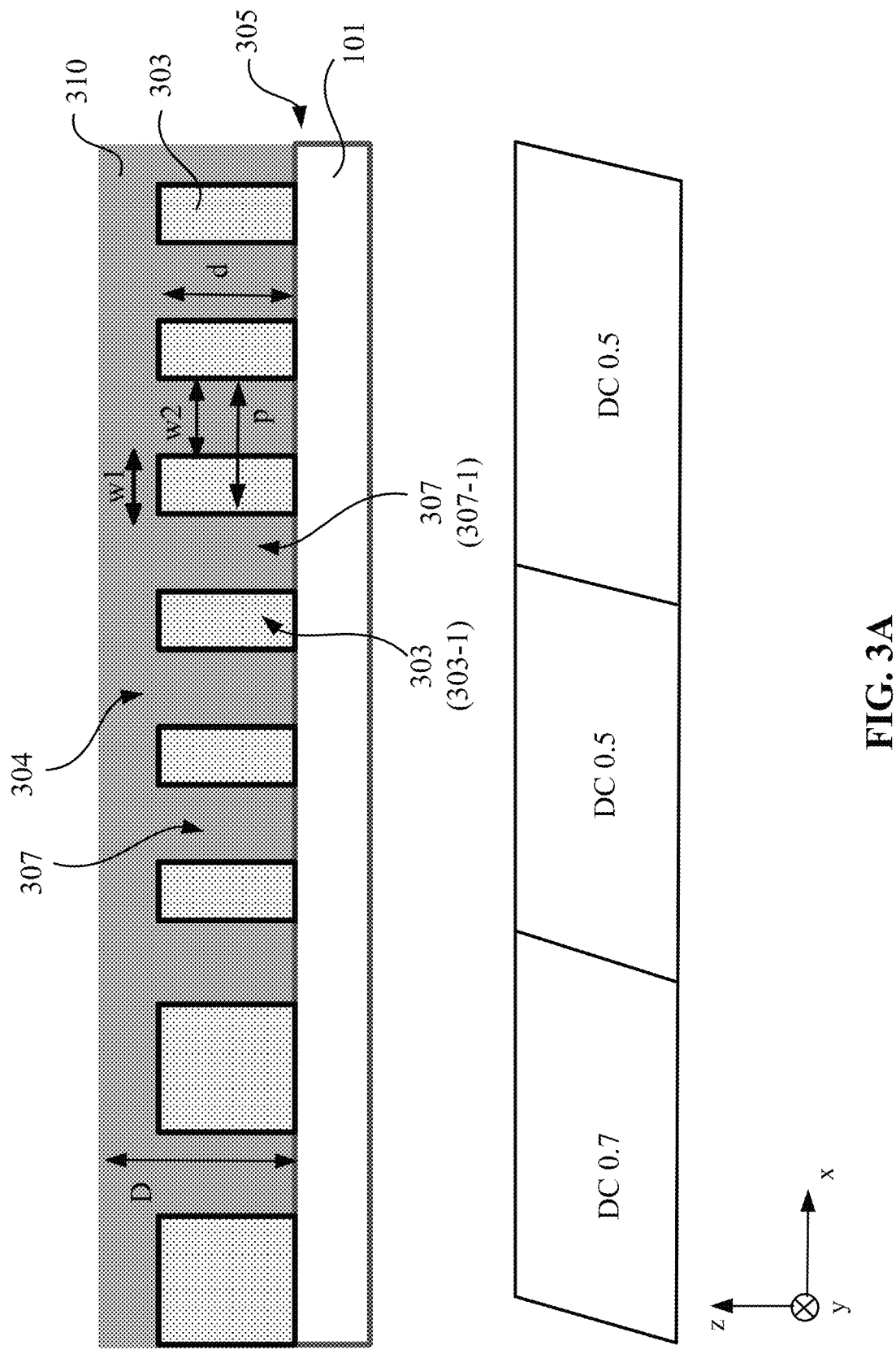
FIGS. 3A-3C illustrate schematic diagrams showing processes for selectively reducing critical dimensions of lithography-defined features, according to an embodiment of the present disclosure.
Figure 3B:
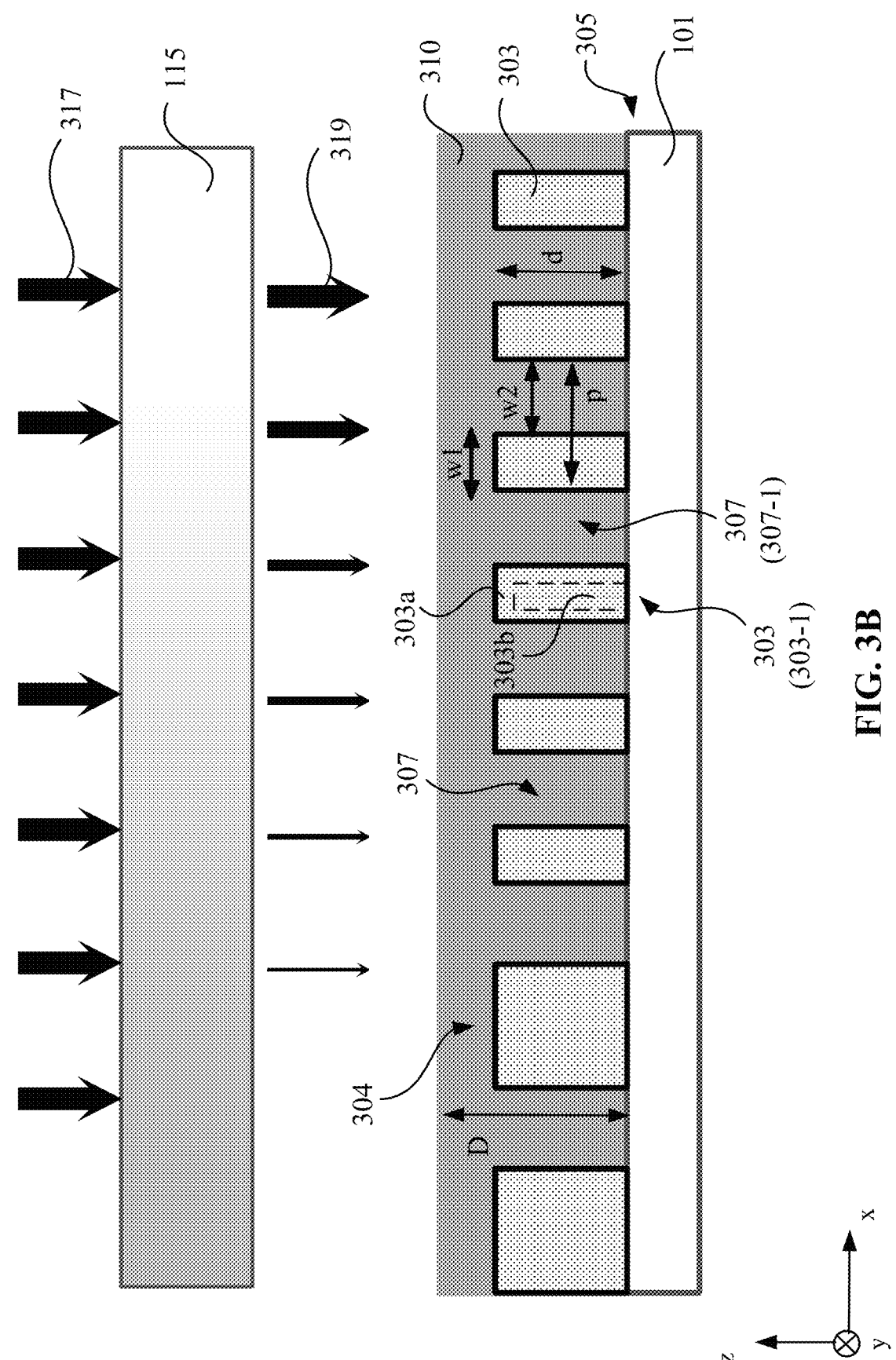
Figure 3C:
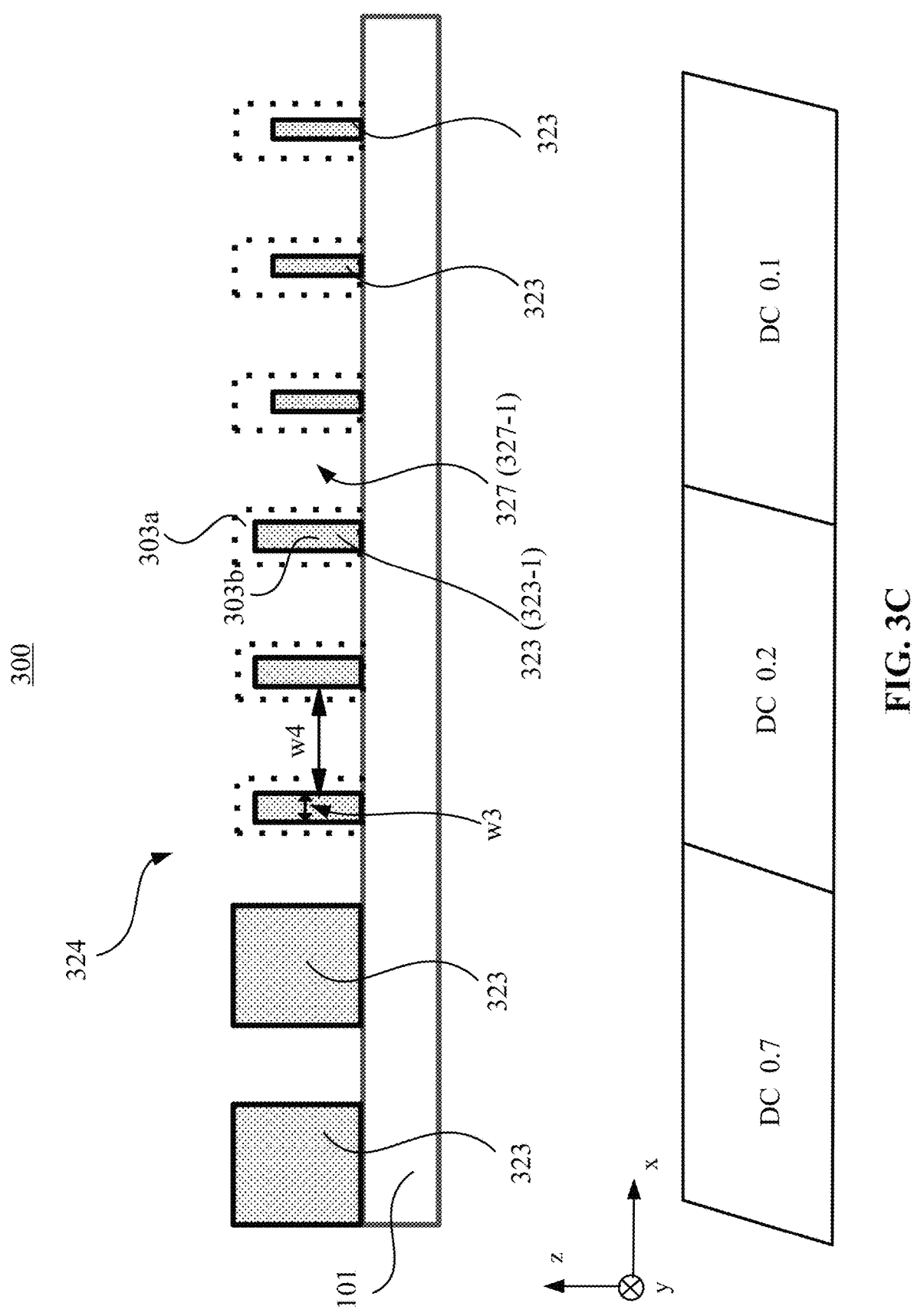

FIGS. 3A-3C illustrate schematic diagrams showing processes for selectively reducing a critical dimension of predefined features (e.g., lithography-defined features), according to an embodiment of the present disclosure. For illustrative purposes, photoresist structures (e.g., photoresist lines 303 having rectangular cross-sections) in a first photoresist pattern 304 are used as examples of the predefined features (e.g., lithography-defined features) to explain the processes. The disclosed processes may also be applied to selectively reducing other predefined features, such as photoresist structures having other cross-sectional shape. The processes shown in FIGS. 3A-3C may include steps or processes similar to those shown in FIGS. 1A-1C or FIGS. 2A-2C. A second photoresist pattern 324 (or an SRG 300) fabricated based on the processes shown in FIGS. 3A-3C may include elements, which are similar to those included in the second photoresist pattern 124 (or the SRG 100) fabricated based on the processes shown in FIGS. 1A-1C, or the second photoresist pattern 224 (or the SRG 200) fabricated based on the processes shown in FIGS. 2A-2C. Descriptions of the similar steps and similar elements can refer to the descriptions rendered above in connection with FIGS. 1A-1C or FIGS. 2A-2C. Although the substrate and films or layers are shown as having flat surfaces, in some embodiments, the substrate and films or layers formed thereon may include curved surfaces.

As shown in FIG. 3A, a substrate 101 with the first photoresist pattern 304 may be provided. In some embodiments, the substrate 101 provided with the first photoresist pattern 304 may also be referred to as a patterned substrate 305. In some embodiments, the patterned substrate 305 may function as a base SRG 305. The patterned substrate 305 may be similar to the patterned substrate 105 shown in FIG. 1A or the patterned substrate 205 shown in FIG. 2A. The configuration of the first photoresist pattern 304 may be similar to the configuration of the first photoresist pattern 104 shown in FIG. 1A or the configuration of the first photoresist pattern 204 shown in FIG. 2A. For example, the first photoresist pattern 304 may include a plurality of photoresist structures 303 with sizes at the nano level or micron level that define or form a plurality of predefined features. In the embodiment shown in FIG. 3A, the predefined features may include photoresist lines 303. For illustrative purposes, the photoresist lines 303 are schematically illustrated as rectangular structures filled with dots, and two neighboring photoresist lines 303 may be spaced apart by a trench 307. The plurality of photoresist line 303 may be arranged in a 1D or 2D array. A period p of the first photoresist pattern 304 may be uniform or may not be uniform for the entire photoresist pattern 304. A width $w_1$ of the first photoresist pattern 304 may be uniform or may not be uniform for the entire photoresist pattern 304. A duty cycle of the first photoresist pattern 304 may be uniform or may not be uniform for the entire photoresist pattern 304.

For discussion purposes, FIG. 3A show that the period p of the first photoresist pattern 304 may be uniform for the entire photoresist pattern 304, e.g., about 200 nm. The width $w_1$ of the photoresist line 303 may be not uniform for the entire photoresist pattern 304, and a width $w_2$ of the trench 307 between two neighboring photoresist lines 303 may be not uniform for the entire photoresist pattern 304. For example, in the embodiment shown in FIG. 3A, the width $w_1$ of the photoresist line 303 decreases in +x-axis direction. For example, the width $w_1$ of the photoresist line 303 located at a left portion, a central portion, and a right portion of the first photoresist pattern 304 may be 140 nm, 100 nm, and 100 nm, respectively. Accordingly, the duty cycle at the left portion, the central portion, and the right portion of the first photoresist pattern 304 may be calculated as 0.7, 0.5, and 0.5, respectively. Although not shown, in some embodiments, the plurality of photoresist line 303 may be configured with a predetermined 1D or 2D width variation in one or two dimensions within a plane (e.g., an x-y plane shown in FIG. 3A) perpendicular to a thickness direction (e.g., a z-axis direction shown in FIG. 3A) of the first photoresist pattern 304. Accordingly, the first photoresist pattern 304 may be configured with a predetermined 1D or 2D duty cycle variation in one or two dimensions within the plane (e.g., the x-y plane shown in FIG. 3A) of the first photoresist pattern 304.

The fabrication process of the first photoresist pattern 304 may be similar to the fabrication process of the first photoresist pattern 104 shown in FIG. 1A or the fabrication process of the first photoresist pattern 204 shown in FIG. 2A. For example, the fabrication processes of the patterned substrate 305 may include forming a layer of a photoresist composition (also referred to as 303 for discussion purposes) over the substrate 101; exposing the layer of the photoresist composition 303 to an activating radiation (referred to as a first activating radiation) through a patterned photomask (e.g., a binary half-tone photomask); and developing the exposed layer of the photoresist composition 303 in a developer base to form the first photoresist pattern 304. In some embodiments, the fabrication processes of the patterned substrate 305 may also include a post apply bake and a post exposure bake.

The photoresist composition 303 may include a photoresist that includes a mixture of a photoresist and a first PAG (or PAG for primary exposure). The first PAG may be configured to generate first acid groups when subject to the first activating radiation. The first acid groups may react with the photoresist in the layer of the photoresist composition 303, resulting in a solubility difference between the exposed regions and the unexposed regions of the layer of the photoresist composition 303 in the developer base. In some embodiments, the photoresist composition 303 may include a positive photoresist, and the exposed regions of the layer of the photoresist composition 303 corresponding to the optically transparent regions of the patterned photomask may be soluble and removed in the subsequent development step (e.g., via an aqueous developer base).

Referring to FIG. 3A, after the patterned substrate 305 is provided, a layer of a shrink material 310 (also referred to as a shrink material layer 310) may be formed over the patterned substrate 305. The process of forming the shrink material layer 310 over the patterned substrate 305 may be similar to the process of forming the shrink material layer 110 over the patterned substrate 105 shown in FIG. 1A or over the patterned substrate 205 shown in FIG. 2A. The shrink material layer 310 may be applied to at least a portion of the surface of the first photoresist pattern 304 to flatten or planarize the first photoresist pattern 304. At least one (e.g., each) of the trenches 307 may be filled with the shrink material 310. For example, the shrink material 310 may fill the entire trench 307 between the neighboring photoresist lines 303. The first photoresist pattern 304 provided with the shrink material layer 310 may have a substantially uniform thickness/) across the entire photoresist pattern 304. In some embodiments, as shown in FIG. 3A, the shrink material layer 310 may be disposed at the entire surface of the first photoresist pattern 304, including the sidewalls of the respective photoresist lines 303 or respective trenches 307, the top walls of the respective photoresist lines 303, and the bottom walls of the respective trenches 307. In such a configuration, the thickness I) may be greater than the depth d of the photoresist line 303. In some embodiments, the shrink material 310 may not be disposed at the top walls of the respective photoresist lines 303. In such a configuration, the thickness I) may be substantially equal to the depth d of the trench 307.

The shrink material layer 310 may include a polymer or small molecules that are aqueous-soluble or organic solvent soluble (e.g., fluoro-soluble). The shrink material layer 310 may also include a photosensitive material that may react with the first photoresist pattern 304, when the patterned substrate 305 with the shrink material layer 310 is exposed to an activating radiation, e.g., a second activating radiation different from the first activating radiation. Such a photosensitive material may be referred to as a photosensitive material for secondary exposure. In some embodiments, the photosensitive material for secondary exposure may include a fourth PAG. The fourth PAG may be configured to generate fourth photo acid groups when exposed to the second activating radiation. Such a fourth PAG may also be referred to as a PAG for secondary exposure. In some embodiments, the fourth PAG for secondary exposure and the first PAG for primary exposure may be activated by activating radiations of different wavelengths. For example, the activating wavelength of the fourth PAG may be longer than the activating wavelength of the first PAG. In some embodiments, the activating wavelength of the first PAG may be equal to or less than 350 nm, and the activating wavelength of the fourth PAG may be greater than 350 nm.

In some embodiments, a mixture of the aqueous-soluble or organic solvent soluble (e.g., fluoro-soluble) polymer or small molecules and the fourth PAG may be dissolved in a mixture of one or more of solvents to form a solution. Example of the solvents may include an aqueous solvent, a fluorinated solvent, etc. In some embodiments, the total solid content in the formulation may be within a range of about 0.5-10 wt %. For example, the solution may include propylene glycol methyl ether ("PGME"), dissolved with poly(acrylic acid) of 5 wt % and the second PGA of 1 wt %. In some embodiments, the solution may include PGME, dissolved with poly(hydroxystyrene) of 5 wt % and the second PGA of 1 wt %.

As shown in FIG. 3B, after the shrink material layer 310 is formed over the patterned substrate 305, the patterned substrate 305 with the shrink material layer 310 may be exposed to an activating radiation (referred to as the second activating radiation) via the grey-tone (or grey-scale) mask 115. When a light 317 having a spatially uniform light intensity is incident onto the grey-tone mask 115, a transmitted light 319 of the grey-tone mask 115 may have a spatially varying light intensity. Thus, an exposure intensity of the patterned substrate 305 with the shrink material layer 310 may spatially vary. When exposed to the second activating radiation via the grey-tone photomask 115 (also referred to as a secondary exposure), the patterned substrate 305 with the shrink material layer 110 may be subject to a secondary photoreaction, such that the photosensitive material for secondary exposure in the shrink material layer 310 may be activated. For example, the fourth PAG included in the shrink material layer 310 may be activated to generate the fourth acid groups. The amount of the fourth acid groups generated in the shrink material layer 310 may be determined, in part, by the intensity of the second activating radiation (or the secondary exposure intensity). In some embodiments, the second activating radiation with a higher light intensity (or a higher secondary exposure intensity) may generate more fourth acid groups in the shrink material layer 310.

The wavelength of the second activating radiation to activate the fourth PAG included in the shrink material layer 310 may be different from (e.g., longer than) the wavelength of the first activating radiation to activate the first PAG included in the first photoresist pattern 304 (or the photoresist composition 303 forming the first photoresist pattern 304). For example, the wavelength of the first activating radiation to activate the first PAG may be equal to or less than 350 nm, and the wavelength of the second activating radiation to activate the fourth PAG included in the shrink material 310 may be greater than 350 nm. Thus, when the first photoresist pattern 304 includes a residual first PGA, the residual first PGA may not be activated by the second activating radiation.

In some embodiments, after the secondary exposure, the patterned substrate 305 with the shrink material layer 310 may be heat treated in a hardbake process (e.g., post exposure bake). In some embodiments, the temperature of the post exposure bake may be within a range from about 90° C. to about 200° C., and the time duration of the post exposure bake may be within a range from about 1 minute to about 5 minutes. In some embodiments, the temperature of the post exposure bake may be about 110° C., and the time duration of the post exposure bake may be about 1 minute. During the post exposure bake of the patterned substrate 305 with the shrink material layer 310, the fourth acid groups generated in the shrink material layer 310 may diffuse into the first photoresist pattern 304, thereby reacting with the first photoresist pattern 304. The fourth acid groups generated in the shrink material layer 310 may diffuse into the first photoresist pattern 304 at least through the sidewalls of the respective photoresist lines 303. In some embodiments, the fourth acid groups generated in the shrink material layer 310 may also diffuse into the first photoresist pattern 304 through the top walls of the respective photoresist lines 303.

The first photoresist pattern 304 may include a first portion, in which the concentration of the diffused fourth acid groups is greater than or equal to a threshold value, and a second portion, in which the concentration of the diffused fourth acid groups is less than the threshold value. The reaction between the diffused fourth acid groups and the first photoresist pattern 304 may substantially occur in the first portion of the first photoresist pattern 304, and may not occur in the second portion of the first photoresist pattern 304. For illustrative and discussion purposes, FIG. 3B shows that the photoresist line 303 (e.g., 303-1) may include a first portion 303a and a second portion 303b. The first portion 303a may be a portion between the solid rectangle and the dashed rectangle as shown in FIG. 3B. The second portion 303b may be a portion encompassed by the dashed rectangle as shown in FIG. 3B. The first portion 303a may be located closer to the sidewalls of the photoresist line 303-1 than the second portion 303b. The sidewalls are also where the interfaces between the photoresist line 303-1 and the shrink material layer 310 are located. In some embodiments, the first portion 303a of the photoresist line 303-1 may include the diffused fourth acid groups with a concentration greater than or equal to the predetermined value, and the second portion 303b of the photoresist line 303-1 may include the diffused fourth acid groups with a concentration less than the predetermined value. In some embodiments, the fourth acid groups may diffuse into the first portion 303a of the photoresist line 303-1, and may not diffuse into the second portion 303b of the photoresist line 303-1. The reaction between the diffused fourth acid groups and the photoresist line 303-1 may occur substantially in the first portion 303a, rather than in the second portion 303b.

As shown in FIG. 3C, after the secondary exposure and the post exposure bake, the patterned substrate 305 with the shrink material layer 310 may be developed using a developer base (not shown). In some embodiments, the developer base may include an aqueous solvent, a fluorinated solvent, etc. The shrink material layer 310 may be substantially soluble in the developer base, and therefore may be removed by the developer base. In addition, the secondary exposure of the patterned substrate 305 with the shrink material layer 310 may result in a solubility difference between the first portion of the first photoresist pattern 304 that has reacted with the diffused fourth acid groups and the second portion of the first photoresist pattern 304 that has not reacted with the diffused fourth acid groups in the developer base. The first portion of the first photoresist pattern 304 may be substantially soluble in the developer base, and therefore may be removed from the substate 101. The second portion of the first photoresist pattern 304 may be substantially insoluble in the developer base, and therefore may remain on the substrate 101. For example, the first portion 303a of the photoresist line 303-1 may be substantially soluble in the developer base, and may be removed from the substate 101. The second portion 303b of the photoresist line 303-1 may be substantially insoluble in the developer base, and may remain on the substrate 101. The remaining portion (e.g., the second portion 303b) may form a photoresist line 323 (e.g., 323-1) with a reduced width $w_3$, compared to the width $w_1$ of the corresponding photoresist line 303-1 shown in FIG. 3B. That is, the photoresist line 303-1 of the first photoresist pattern 304 may be trimmed. Accordingly, a trench 327 (e.g., 327-1) adjacent to the photoresist line 323 (e.g., 323-1) may have an increased width $w_4$, compared to the width $w_2$ of the corresponding trench 307 (e.g., 307-1) of the first photoresist pattern 304.

In some embodiments, when the shrink material layer 310 is also formed at the top surfaces of the respective photoresist lines 303 of the first photoresist pattern 304, the top of at least one photoresist line 303 may also be trimmed. Thus, the height of the photoresist line 323 may be reduced, as compared to the height of the corresponding photoresist line 303 shown in FIG. 3B. For example, the height of the photoresist line 323-1 may be less than the height of the corresponding photoresist line 303-1 shown in FIG. 3B.

Referring to FIGS. 3A-3C, the first photoresist pattern 304 with the first duty cycle variation may be transformed to a second photoresist pattern 324 with a second duty cycle variation. The second photoresist pattern 324 may include a plurality of photoresist lines 323 and a plurality of trenches 327. The respective photoresist lines 303 of the first photoresist pattern 304 may be selectively trimmed to form the respective photoresist lines 323 of the second photoresist pattern 324. Compared to the widths $w_1$ of the respective photoresist lines 303 of the first photoresist pattern 304, the widths $w_3$ of the respective photoresist lines 323 of the second photoresist pattern 324 may be selectively reduced. In some embodiments, the width reductions of the respective photoresist lines 323 may be non-uniform across the second photoresist pattern 324. Accordingly, compared to the duty cycles at the respective portions of the first photoresist pattern 304, the duty cycles at the respective portions of the second photoresist pattern 324 may be selectively reduced, in a non-uniform manner across the second photoresist pattern 324.

In some embodiments, the width reductions of the respective photoresist lines 323 of the second photoresist pattern 324 may be determined, in part, by an exposure intensity variation of the secondary exposure via the grey-tone mask 115. The exposure intensity variation of the secondary exposure via the grey-tone mask 115 may include information of local exposure intensities to which the respective portions of the first photoresist pattern 304 are exposed. In some embodiments, a greater local exposure intensity of the secondary exposure may result in a greater width reduction of a corresponding photoresist line 323 of the second photoresist pattern 324.

In some embodiments, the exposure intensity variation of the secondary exposure via the grey-tone mask 115 may be determined, in part, by the light transmittance variation of the grey-tone mask 115. Thus, the width reductions of the respective photoresist lines 323 of the second photoresist pattern 324 may be determined, in part, by the light transmittance variation of the grey-tone mask 115. The light transmittance variation of the grey-tone mask 115 may include information of local light transmittances at respective portions of the grey-tone mask 115. In some embodiments, a greater local light transmittance of the grey-tone mask 115 may result in a greater width reduction of a corresponding photoresist line 323 of the second photoresist pattern 324.

Thus, through adjusting a local light transmittance of the grey-tone mask 115, the width reduction of a corresponding photoresist line 323 of the second photoresist pattern 324 may be adjustable. In addition, through configuring the light transmittance variation of the grey-tone mask 115, a width reduction variation of the respective photoresist lines 323 of the second photoresist pattern 324 may be configurable. The width reduction variation of the respective photoresist lines 323 of the second photoresist pattern 324 may include information of the width reductions of the respective photoresist lines 323 across the second photoresist pattern 324.

Accordingly, through adjusting a local light transmittance of the grey-tone mask 115, the duty cycle reduction of a corresponding portion of the second photoresist pattern 324 may be adjustable. In addition, through configuring the light transmittance variation of the grey-tone mask 115, a duty cycle reduction variation of the second photoresist pattern 324 may be configurable. The duty cycle reduction variation of the second photoresist pattern 324 may include information of the duty cycle reductions at respective portions of the second photoresist pattern 324.

For discussion purposes, FIG. 3B and FIG. 3C show that as the light transmittance of the grey-tone mask 115 gradually increases in the +x-axis direction, the width reductions of the respective photoresist lines 323 of the second photoresist pattern 324 may increase in the +x-axis direction. Referring to FIG. 3B, as the light transmittance of the grey-tone mask 115 gradually increases in the +x-axis direction (as shown in FIG. 3B), the intensity of the light 319 may gradually increase in the +x-axis direction, the amount of the fourth acid groups generated in the shrink material layer 310 may gradually increase in the +x-axis direction, and the amount of the fourth acid groups that diffuse into the respective photoresist lines 303 may gradually increase in the +x-axis direction, e.g., increasing from the leftmost photoresist line 303 to the rightmost photoresist line 303. The reaction between the first photoresist pattern 304 and the diffused fourth acid groups may gradually increase in the +x-axis direction. For example, the sizes of the first portions of the respective photoresist lines 303 that react with the diffused fourth acid groups may gradually increase in the +x-axis direction.

After the development, referring to FIG. 3C, the sizes of the first portions of the respective photoresist lines 303 that are removed by the developer base may gradually increase in the +x-axis direction. Thus, compared to the widths $w_1$ of the respective photoresist lines 303 of the first photoresist pattern 304, the width reductions of the respective photoresist lines 323 of the second photoresist pattern 324 may increase in the +x-axis direction. Accordingly, compared to the duty cycles at the respective portions of the first photoresist pattern 304, the duty cycle reductions of the respective portions of the second photoresist pattern 324 may increase in the +x-axis direction.

For example, referring to FIGS. 3A-3C, the width $w_3$ of the photoresist line 323 located at the left portion of the second photoresist pattern 324 may be substantially the same as the width $w_1$ of the corresponding photoresist line 303 of the first photoresist pattern 304, e.g., about 140 nm. The width $w_3$ of the photoresist line 323 located at the central portion of the second photoresist pattern 324 may be reduced to 40 nm, and the width $w_3$ of the photoresist line 323 located at the right portion of the second photoresist pattern 324 may be reduced to 20 nm. Compared to the widths $w_2$ of the photoresist lines 303 located at corresponding portions of the first photoresist pattern 304 (e.g., 140 nm, 100 nm, and 100 nm), the widths $w_3$ of the photoresist lines 323 located at the left portion, the central portion, and the right portion of second photoresist pattern 324 may be reduced by about 0 nm, 60 nm, and 80 nm, respectively. In other words, the photoresist lines 323 located at the left portion, the central portion, and the right portion of the second photoresist pattern 324 may be trimmed by about 0 nm, 60 nm, and 80 nm in width, respectively. The width reductions of the respective photoresist lines 323 of the second photoresist pattern 324 may increase in the +x-axis direction.

Further, the duty cycles of the left portion, the central portion, and the right portion of the second photoresist pattern 324 may be calculated as 0.7, 0.2, and 0.1, respectively. Compared to the duty cycles at corresponding portions of the first photoresist pattern 304 (e.g., 0.7, 0.5, 0.5), the duty cycles at the left portion, the central portion, and the right portion of second photoresist pattern 324 may be reduced by 0, 0.3, and 0.4, respectively. The duty cycle reductions of the respective portions of the second photoresist pattern 324 may increase in the +x-axis direction. In some embodiments, the second photoresist pattern 324 may have be configured to have a broader duty cycle variation (e.g., from 0.7 to 0.1, with a range of 0.6) compared to the first photoresist pattern 304 (e.g., from 0.7 to 0.5, with a range of 0.2). In some embodiments, through configuring the light transmittance variation of the grey-tone mask 115, the duty cycles at the respective portions of the second photoresist pattern 324 may be configured to include at least one substantially low duty cycle, e.g., 0.4, 0.3, 0.2, 0.1, etc. In some embodiments, the substrate 101 with the second photoresist pattern 324 may function as patterned grating (e.g., an SRG) 300. The SRG 300 may have a broader duty cycle variation than the base SRG 305.

The light transmittance variation of the grey-tone mask 115 shown in FIG. 3B and the width reductions of the respective photoresist lines 323 shown in FIG. 3C are for illustrative purposes. In some embodiments, the grey-tone mask 115 may be configured with a predetermined 1D or 2D light transmittance variation in one or two dimensions within the plane (e.g., the x-y plane shown in FIG. 3B) of the grey-tone mask 115. Thus, the light 319 transmitted through the grey-tone mask 115 may be configured to have a predetermined 1D or 2D light intensity variation in the one or two dimensions within the plane of the grey-tone mask 115. Accordingly, the photoresist lines 323 of the second photoresist pattern 324 may be configured to have a predetermined 1D or 2D width reduction variation in the one or two dimensions within the plane of the second photoresist pattern 324. The second photoresist pattern 324 may be configured to have a predetermined 1D or 2D duty cycle variation in the one or two dimensions within the plane of the second photoresist pattern 324.

Figure 4A:
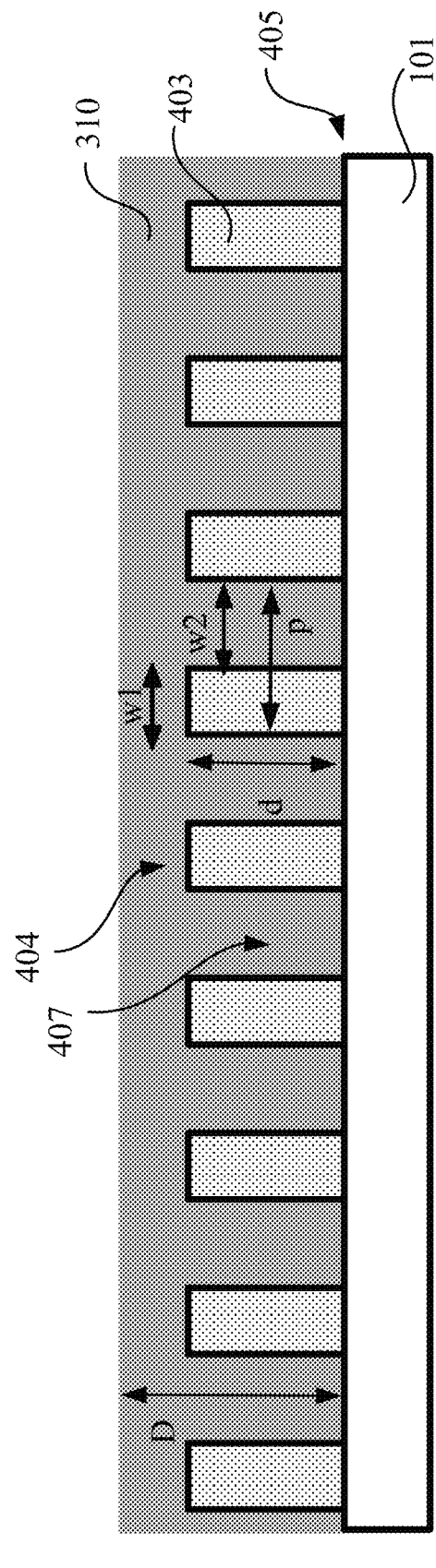
FIGS. 4A-4C illustrate schematic diagrams showing processes for selectively reducing critical dimensions of lithography-defined features, according to an embodiment of the present disclosure.
Figure 4A:
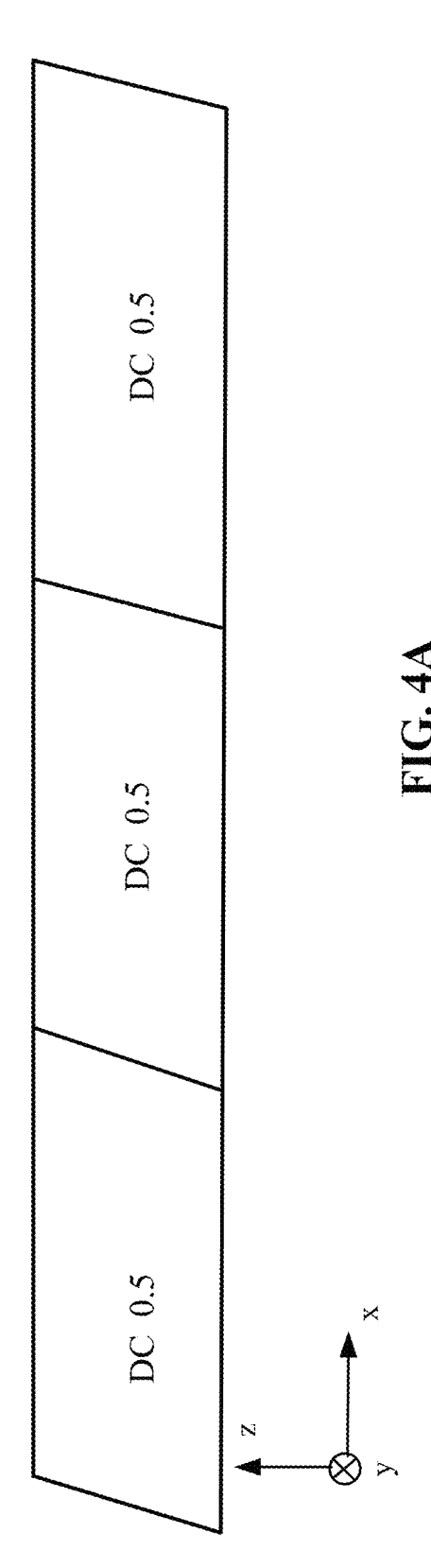
Figure 4B:
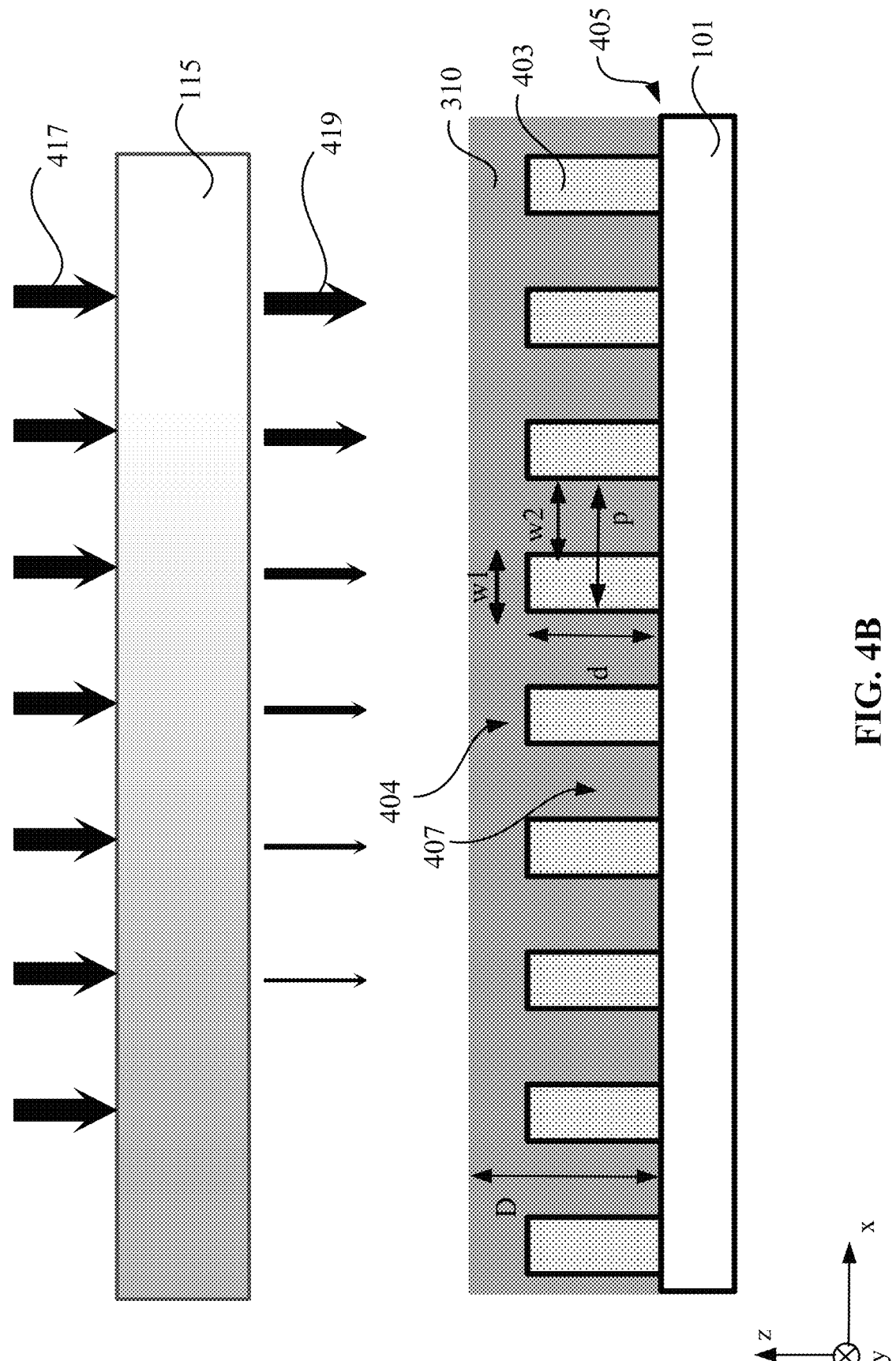
Figure 4C:
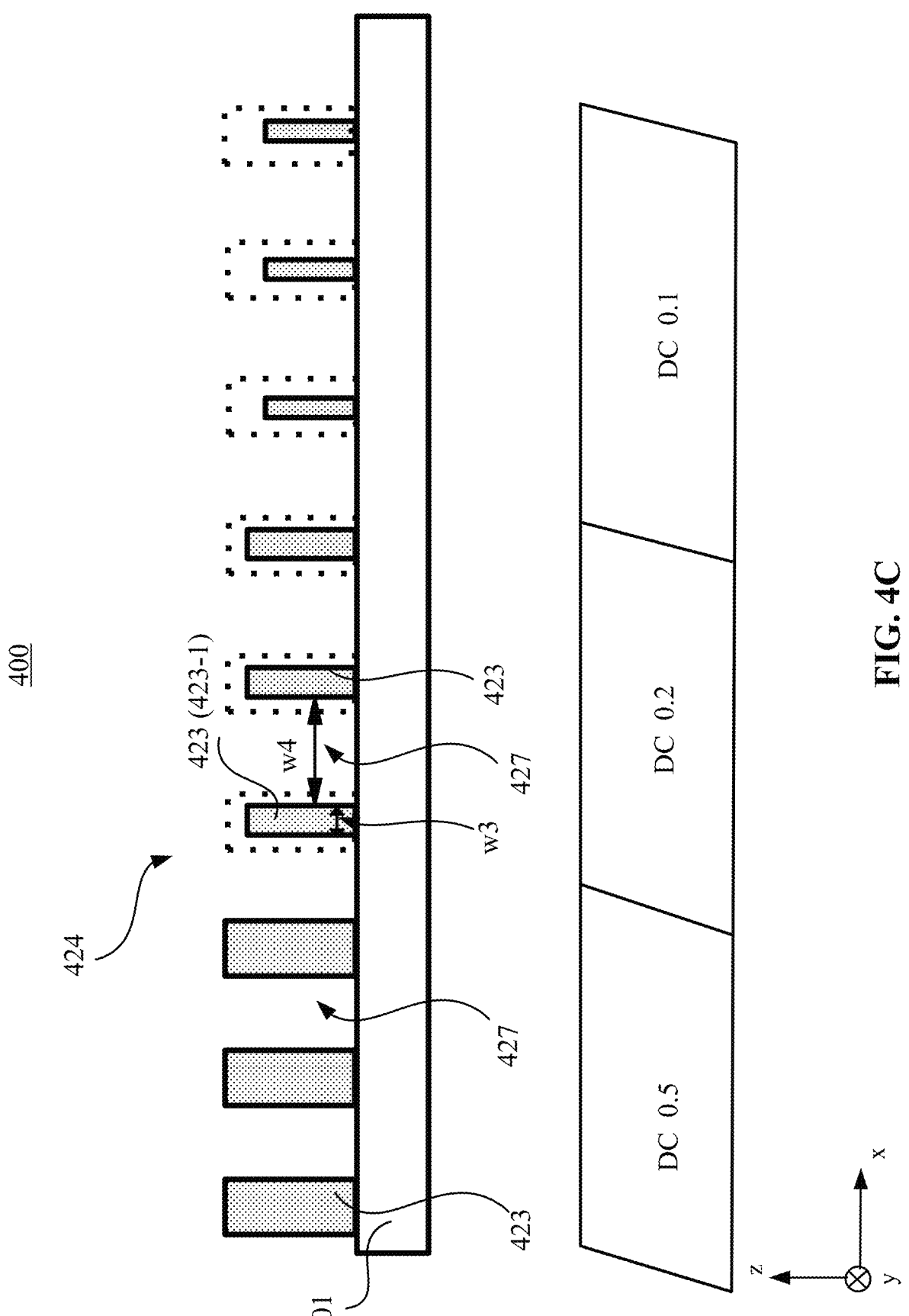

FIGS. 4A-4C illustrate schematic diagrams showing processes for selectively reducing a critical dimension of predefined features (e.g., lithography-defined features), according to an embodiment of the present disclosure. For illustrative purposes, photoresist structures in a photoresist pattern (e.g., photoresist lines 403 in a first photoresist pattern 404 shown in FIG. 4A) are used as examples of the lithography-defined features to explain the processes. The disclosed processes may also be applied to selectively reducing other lithography-defined features. The processes shown in FIGS. 4A-4C may include steps or processes similar to those shown in FIGS. 1A-1C, FIGS. 2A-2C, or FIGS. 3A-3C. An SRG 400 fabricated based on the processes shown in FIGS. 4A-4C may include elements, which are similar to those included in the SRG 100 fabricated based on the processes shown in FIGS. 1A-1C, those included in the SRG 200 fabricated based on the processes shown in FIGS. 2A-2C, or those included in the SRG 300 fabricated based on the processes shown in FIGS. 3A-3C. Descriptions of the similar steps and similar elements can refer to the descriptions rendered above in connection with FIGS. 1A-1C, FIGS. 2A-2C, or FIGS. 3A-3C. Although the substrate 101 and films or layers are shown as having flat surfaces, in some embodiments, the substrate and films or layers formed thereon may include curved surfaces.

For example, as shown in FIGS. 4A-4C, the substrate 101 with the first photoresist pattern 404 may be provided (also be referred to as a patterned substrate 405), and a layer of the shrink material 310 (or the shrink material layer 310) may be formed over the patterned substrate 405 to flatten or planarize the first photoresist pattern 404. In some embodiments, the patterned substrate 405 may function as the base SRG 405. The material and fabrication process of the patterned substrate 405 may be similar to the material and fabrication process of the patterned substrate 305 shown in FIG. 3A, respectively. In the embodiment shown in FIG. 4A, the first photoresist pattern 404 may have a uniform period p (e.g., about 100 nm), a uniform width $w_2$ of the trench 407 (e.g., about 100 nm), and a uniform duty cycle (e.g., about 0.5) for the entire first photoresist pattern 404.

After the shrink material layer 310 is formed over the patterned substrate 405, the patterned substrate 405 provided with the shrink material layer 310 may be exposed to a second activating radiation via the grey-tone mask 115. When a light 417 having a spatially uniform light intensity is incident onto the grey-tone mask 115, a transmitted light 419 output from the grey-tone mask 115 may have a spatially varying light intensity. Thus, an exposure intensity of the secondary exposure may spatially vary. After the secondary exposure, the patterned substrate 405 with the shrink material layer 310 may be subject to the post exposure bake. After the post exposure bake, the patterned substrate 405 with the shrink material layer 310 may be developed using a developer base (not shown). After the processes shown in FIGS. 4A-4C, the first photoresist pattern 404 may be transformed to a second photoresist pattern 424 having at least one trimmed photoresist line.

For discussion purposes, FIG. 4B and FIG. 4C show that as the light transmittance of the grey-tone mask 115 gradually increases in the +x-axis direction, the width reductions of respective photoresist lines 423 of the second photoresist pattern 424 may increase in the +x-axis direction. Accordingly, the duty cycle reductions at the respective portions of the second photoresist pattern 424 may increase in the +x-axis direction. For example, referring to FIGS. 4A-4C, the width $w'4$ of the photoresist lines 423 located at the left portion of the second photoresist pattern 424 may be substantially the same as the width $w_2$ of the corresponding trenches 407 of the first photoresist pattern 404, e.g., about 100 nm. The width $w_4$ of the photoresist lines 423 located at the central portion of the second photoresist pattern 424 may be reduced to 40 nm, and the width $w_4$ of the photoresist lines 423 located at the right portion of the second photoresist pattern 424 may be reduced to 20 nm. Thus, compared to the width $w_2$ of photoresist lines 403 located at corresponding portions of the first photoresist pattern 404 (e.g., 100 nm, 100 nm, and 100 nm), the widths $w_4$ of the photoresist lines 423 located at the left portion, the central portion, and the right portion of second photoresist pattern 424 may be reduced by about 0 nm, 60 nm, and 80 nm, respectively. In other words, the photoresist lines 423 located at the left portion, the central portion, and the right portion of second photoresist pattern 424 may be shrunken by about 0 nm, 60 nm, and 80 nm in width, respectively. The width reductions (or shrink) of the respective photoresist lines 423 of the second photoresist pattern 424 may increase in the +x-axis direction.

Further, the duty cycles of the left portion, the central portion, and the right portion of the second photoresist pattern 424 may be calculated as 0.5, 0.2, and 0.1, respectively. Compared to the duty cycles at corresponding portions of the first photoresist pattern 404 (e.g., 0.5, 0.5, 0.5), the duty cycles at the left portion, the central portion, and the right portion of second photoresist pattern 424 may be reduced by 0, 0.3, and 0.4, respectively. The duty cycle increases of the respective portions of the second photoresist pattern 424 may increase in the +x-axis direction. The second photoresist pattern 424 may be configured to have a broader duty cycle variation (e.g., from 0.5 to 0.1, with a range of 0.4) compared to the first photoresist pattern 404 (e.g., with the constant duty cycle of 0.5). In some embodiments, through configuring the light transmittance variation of the grey-tone mask 115, the duty cycles at the respective portions of the second photoresist pattern 424 may be configured to include at least one substantially low duty cycle, e.g., 0.4, 0.3, 0.2, or 0.1, etc. In some embodiments, the substrate 101 with the second photoresist pattern 424 may function as patterned grating (e.g., an SRG) 400. The SRG 400 may have a broader duty cycle variation than the base SRG 405.

Figure 6A:
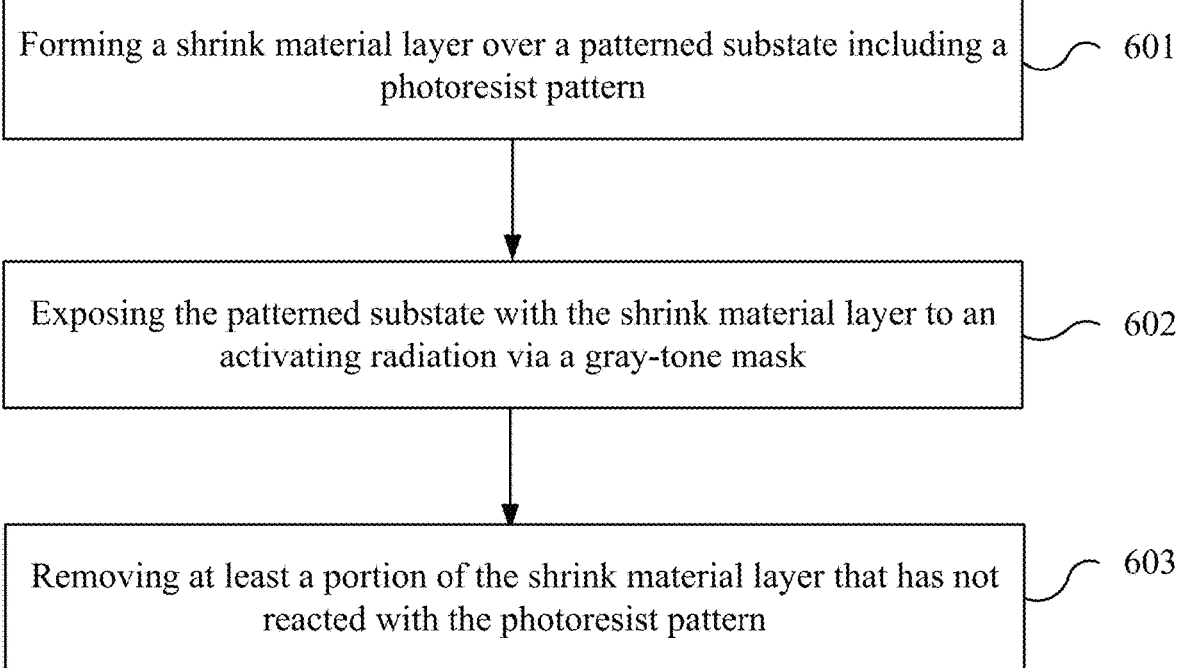
FIG. 6A illustrates a flow chart showing a method for selectively reducing critical dimensions of lithography-defined features, according to an embodiment of the present disclosure.

The present disclosure also provides a method for selectively reducing critical dimensions of lithography-defined features. FIG. 6A illustrates a flow chart showing a method 600 for selectively reducing critical dimensions of lithography-defined features, according to an embodiment of the present disclosure. As shown in FIG. 6A, the method 600 may include forming a shrink material layer over a patterned substate including a photoresist pattern (step 601). The method 600 may also include exposing the patterned substate with the shrink material layer to an activating radiation via a grey-tone mask (step 602). The grey-tone mask may provide a predetermined light transmittance profile for the activating radiation. The predetermined light transmittance profile may be a non-uniform light transmittance profile. In some embodiments, the non-uniform light transmittance profile may be a gradient profile or an arbitrary profile with arbitrarily selected light transmittances. The light transmittance profile may be configured to be any suitable profile based on the duty cycle profile in a final grating to be fabricated. The method 600 may further include removing at least a portion of the shrink material layer that has not reacted with the photoresist pattern (step 603). For example, removing the portion of the shrink material layer may include rinsing the patterned substrate with the shrink material layer using a rinsing solution to remove the unreacted shrink material. The variation of the light transmittance of the grey-tone mask may result in any desirable varying duty cycles in the photoresist pattern of a final grating. In some embodiments, by configuring the light transmittance profile of the grey-tone mask, the duty cycles of the final grating may be controlled to vary between 0.1 and 0.9, in the range of 0.8. In some embodiments, the method 600 may include additional steps that are not shown in FIG. 6A, but have been described above in connection with other figures.

In some embodiments, the predetermined light transmittance profile of the grey-tone mask may be a non-uniform light transmittance profile. In some embodiments, the patterned substrate may include a photosensitive material that is activated under the activating radiation to react with the shrink material layer. In some embodiments, the photosensitive material may be disposed in the photoresist pattern or disposed between the photoresist pattern and the shrink material layer. In some embodiments, the shrink material layer may include a material including one or more amine functional groups and one or more amine protecting groups, and the photosensitive material may include a photoacid generator. In some embodiments, the shrink material layer may include monomers, and the photosensitive material may include an initiator for a photo-polymerization of the monomers. In some embodiments, removing at least a portion of the shrink material layer may include: rinsing the patterned substrate with the shrink material layer using a rinsing solution to remove a portion of the shrink material that has not reacted with the photoresist pattern. In some embodiments, a portion of the shrink material layer remains on the photoresist pattern after the rinsing to increase a width of at least one photoresist line included in the photoresist pattern.

In some embodiments, when at least a portion of the shrink material that has not reacted with the photoresist pattern is removed and the remaining portions of the shrink material that have reacted with the photoresist pattern remain on the surface of the photoresist pattern, the width of at least one photoresist line included in the photoresist pattern may be increased. As a result, a width of the trench between to neighboring photoresist lines may be reduced. Accordingly, the duty cycle at the corresponding portion of the photoresist pattern may be increased. By adjusting the light transmittance profile provided by the grey-tone mask, the photoresist lines of the photoresist pattern may be selectively increased in the width due to the attachment of the shrink material on the surfaces of the selective photoresist lines. In addition, the increases in the widths of the selective photoresist lines may be tunable. Thus, the duty cycles corresponding to the selective portions of the photoresist pattern may be adjusted or tuned to any suitable, desirable values.

In some embodiments, after exposing the patterned substate with the shrink material layer to the activating radiation via the grey-tone mask and before removing at least a portion of the shrink material layer, the method may also include heat treating the patterned substrate with the shrink material layer. In some embodiments, the patterned substrate with the shrink material layer has a uniform thickness.

FIG. 6B illustrates a flow chart showing a method 610 for selectively reducing critical dimensions of lithography-defined features, according to an embodiment of the present disclosure. As shown in FIG. 6B, the method 610 may include forming a shrink material layer over a patterned substate including a photoresist pattern (step 611). The method 610 may also include exposing the patterned substate with the shrink material layer to an activating radiation via a grey-tone mask (step 612). The method 610 may also include heat treating the patterned substrate with the shrink material layer (step 613). The method 610 may also include developing the patterned substrate with the shrink material layer using a developer base to remove the shrink material layer and a portion of the photoresist pattern that has reacted with the shrink material layer (step 614). In some embodiments, substantially all of the shrink material layer may be removed in the developing process. When the portion of the photoresist pattern that has reacted with the shrink material layer is removed, a width of at least one photoresist line included in the photoresist pattern may be reduced. The method 610 may include other steps not shown in FIG. 6B, but have been described above in connection with other figures.

In some embodiments, the shrink material layer may include a photosensitive material that is activated under the activating radiation to react with the photoresist pattern. In some embodiments, the shrink material layer may include a material that is aqueous-soluble or organic solvent soluble (e.g., fluoro-soluble), and the photosensitive material may include a photoacid generator. In some embodiments, the photoacid generator included in the photosensitive material may be a first photoacid generator with a first activating wavelength, the photoresist pattern may include a second photoacid generator with a second activating wavelength, and the first activating wavelength may be greater than the second activating wavelength.

In some embodiments, removing at least a portion of the shrink material layer may include developing the patterned substrate with the shrink material layer using a developer base to remove the shrink material layer and a portion of the photoresist pattern that has reacted with the shrink material layer. In some embodiments, substantially all of the shrink material layer may be removed from the photoresist pattern. In some embodiments, removing the portion of the photoresist pattern that has reacted with the shrink material layer may reduce a width of at least one photoresist line included in the photoresist pattern. When the portion of the photoresist pattern that has reacted with the shrink material layer is removed, a width of at least one photoresist line included in the photoresist pattern may be reduced (i.e., the photoresist line is trimmed). Accordingly, the duty cycle at the corresponding portion of the photoresist pattern may be reduced. By adjusting the light transmittance profile provided by the grey-tone mask, the photoresist lines of the photoresist pattern may be selectively reduced (or trimmed) in the width. In addition, the reductions in the widths of the selective photoresist lines may be tunable. Thus, the duty cycles corresponding to the selective portions of the photoresist pattern may be adjusted to any suitable, desirable values.

In some embodiments, after exposing the patterned substrate with the shrink material layer to the activating radiation via the grey-tone mask and before removing at least a portion of the shrink material layer, the method may also include heat treating the patterned substrate with the shrink material layer. In some embodiments, the patterned substrate with the shrink material layer has a uniform thickness.

FIG. 6C illustrates a flow chart showing a method 620 for selectively reducing critical dimensions of lithography-defined features, according to an embodiment of the present disclosure. The method 620 may include configuring a grey-tone mask to provide a non-uniform light transmittance profile for a radiation for creating a varying duty cycle profile in a grating to be fabricated (step 621). The method 620 may also include applying a shrink material over a photoresist pattern (step 622). The method 620 may also include exposing the photoresist pattern with the shrink material to the radiation transmitting through the grey-tone mask to cause a reaction between the shrink material and the photoresist pattern at selective portions of the photoresist pattern covered by the shrink material (step 623). Amounts of the shrink material that reacts with the photoresist pattern at selective portions of the photoresist pattern may be different. The method 620 may also include removing at least a portion of the shrink material to form the grating (step 624). In some embodiments, the method 620 may include other steps not shown in FIG. 6C, such as those described above in connection with method 600 and method 610.

Figure 6D:
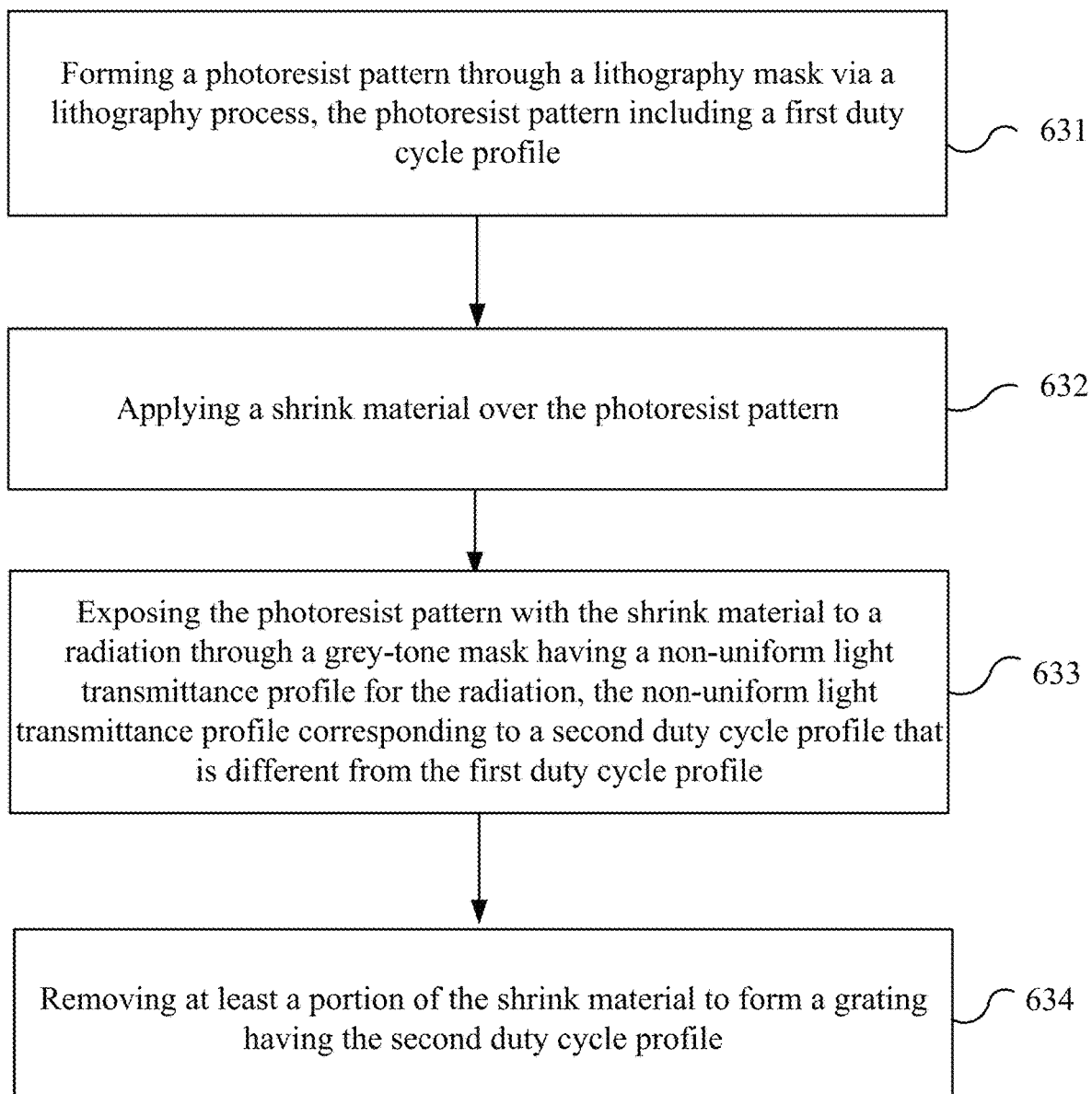
FIG. 6D illustrates a flow chart showing a method for selectively reducing critical dimensions of lithography-defined features, according to an embodiment of the present disclosure.

FIG. 6D illustrates a flow chart showing a method 630 for selectively reducing critical dimensions of lithography-defined features, according to an embodiment of the present disclosure. The method 630 may include forming a photoresist pattern through a lithography mask via a lithography process, the photoresist pattern including a first duty cycle profile (step 631). The method 630 may also include applying a shrink material over the photoresist pattern (step 632). The method 630 may also include exposing the photoresist pattern with the shrink material to a radiation through a grey-tone mask having a non-uniform light transmittance profile for the radiation, the non-uniform light transmittance profile corresponding to a second duty cycle profile that is different from the first duty cycle profile (step 633). The method 630 may also include removing at least a portion of the shrink material to form a grating having the second duty cycle profile (step 634). The method 630 may include other steps not shown in FIG. 6D, such as those described above in connection with method 600 and method 610.

Gratings fabricated based on the fabrication processes and methods disclosed herein have various applications in a number of technical fields. For example, the gratings fabricated based on the fabrication processes and methods disclosed herein may be implemented in various systems for augmented reality ("AR"), virtual reality ("VR"), and/or mixed reality ("MR") applications, e.g., near-eye displays ("NEDs"), head-up displays ("HUDs"), head-mounted displays ("HMDs"), smart phones, laptops, televisions, vehicles, etc. Some exemplary applications in AR, VR, and MR fields or some combinations thereof will be explained below. NEDs have been widely used in a wide variety of applications, such as aviation, engineering, scientific research, medical devices, computer games, videos, sports, training, and simulations. NEDs can function as a VR device, an AR device, and/or an MR device. When functioning as AR and/or MR devices, NEDs are at least partially transparent from the perspective of a user, enabling the user to view a surrounding real world environment. Such NEDs are also referred to as optically see-through NEDs. When functioning as VR devices, NEDs are opaque such that the user is substantially immersed in the VR imagery provided via the NEDs. An NED may be switchable between functioning as an optically see-through device and functioning as a VR device.

Figure 7A:
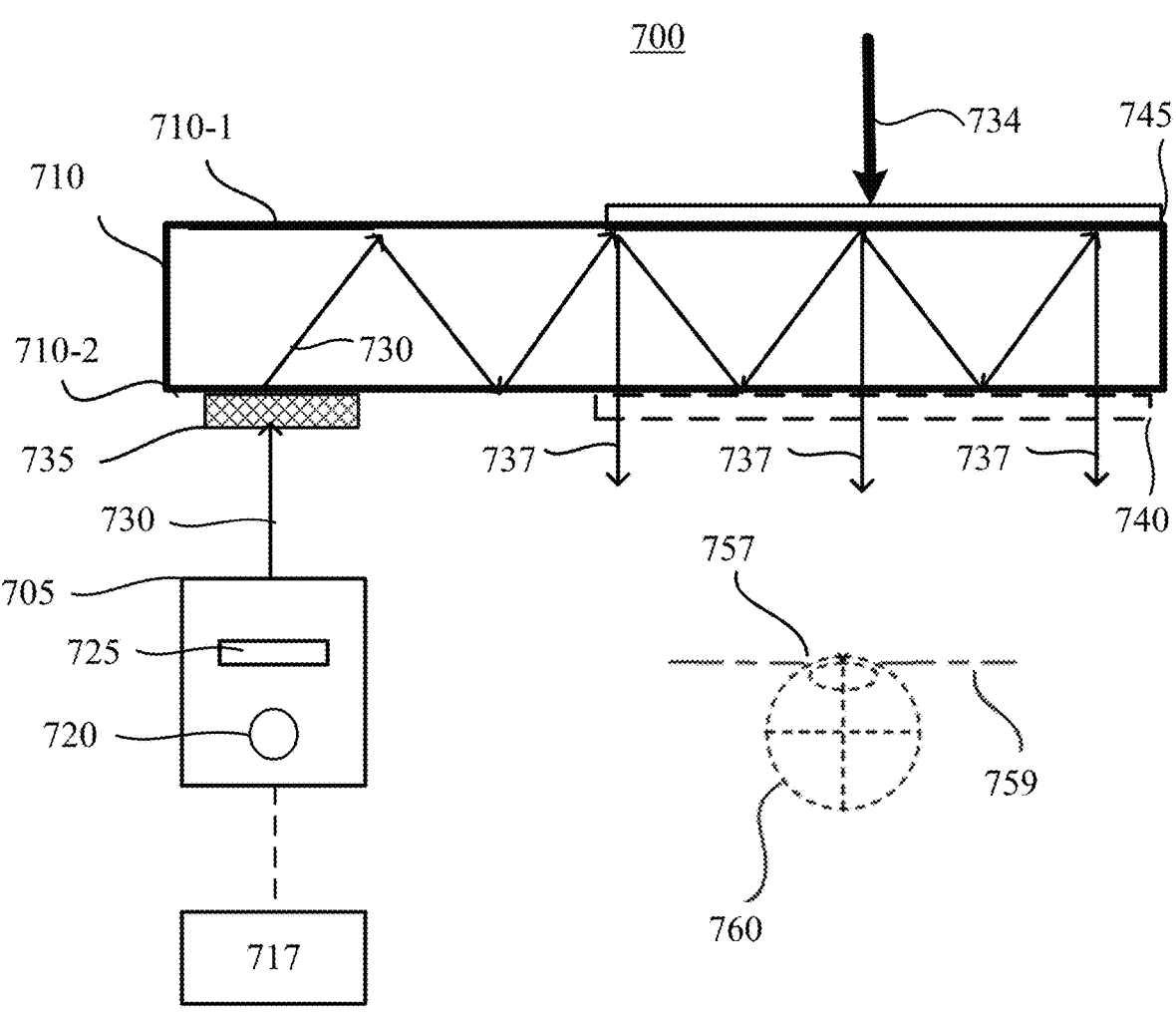
FIGS. 7A and 7B schematically illustrate diagrams of light guide display systems, according to various embodiments of the present disclosure.
Figure 7A:
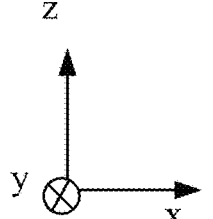

FIG. 7A illustrates an x-z sectional view of a light guide display system or assembly 700, according to an embodiment of the present disclosure. The light guide display system 700 may be a part of a system (e.g., an NED, an HUD, an HMD, a smart phone, a laptop, or a television, etc.) for VR, AR, and/or MR applications. As shown in FIG. 7A, the light guide display system 700 may include a light source assembly 705, a light guide 710, and a controller 717. The controller 717 may be configured to perform various controls, adjustments, or other functions or processes described herein. The light source assembly 705 may include a light source 720 and an light conditioning system 725. In some embodiments, the light source 720 may be a light source configured to generate a coherent or partially coherent light. The light source 720 may include, e.g., a laser diode, a vertical cavity surface emitting laser, a light emitting diode, or a combination thereof. In some embodiments, the light source 720 may be a display panel, such as a liquid crystal display ("LCD") panel, a liquid-crystal-on-silicon ("LCoS") display panel, an organic light-emitting diode ("OLED") display panel, a micro light-emitting diode ("micro-LED") display panel, a digital light processing ("DLP") display panel, a laser scanning display panel, or a combination thereof. In some embodiments, the light source 720 may be a self-emissive panel, such as an OLED display panel or a micro-LED display panel. In some embodiments, the light source 720 may be a display panel that is illuminated by an external source, such as an LCD panel, an LCOS display panel, or a DLP display panel. Examples of an external source may include a laser, an LED, an OLED, or a combination thereof. The light conditioning system 725 may include one or more optical components configured to condition the light from the light source 720. For example, the controller 717 may control the light conditioning system 725 to condition the light from the light source 720, which may include, e.g., transmitting, attenuating, expanding, collimating, and/or adjusting orientation of the light.

The light source assembly 705 may generate an image light 730 and output the image light 730 to an in-coupling element 735 disposed at a first portion of the light guide 710. The light guide 710 may receive the image light 730 at the in-coupling element 735 located at the first portion of the light guide 710. In some embodiments, the in-coupling element 735 may couple the image light 730 into a total internal reflection ("TIR") path inside the light guide 710. The image light 730 may propagate inside the light guide 710 through TIR along the TIR path, toward an out-coupling element 745 located at a second portion of the light guide 710. The first portion and the second portion may be located at different portions of the light guide 710. The out-coupling element 745 may be configured to couple the image light 730 out of the light guide 710. For example, the out-coupling element 745 may be configured to couple the image light 730 out of the light guide 710 as a plurality of output lights 732 propagating toward the eye-box region 759. Each of the plurality of output lights 732 may present substantially the same image content as the image light 730. Thus, the out-coupling element 745 may be configured to replicate the image light 730 received from the light source assembly 705 at an output side of the light guide 710 to expand an effective pupil of the light guide display system 700, e.g. in an x-axis direction shown in FIG. 7A. In some embodiments, the light guide display system 700 may expand and direct the image light 730 to an exit pupil 757 positioned in the eye-box region 759 of the light guide display system 700. The exit pupil 757 may be a location where an eye 760 is positioned in the eye-box region 759. The relative positions of the eye 760 and the light source assembly 705 shown in FIG. 7A are for illustrative purposes. In some embodiments, the eye 760 and the light source assembly 705 may be disposed at different sides of the light guide 710.

The light guide 710 may include a first surface or side 710-1 facing the real-world environment and an opposing second surface or side 710-2 facing the eye-box region 759. Each of the in-coupling element 735 and the out-coupling element 745 may be disposed at the first surface 710-1 or the second surface 710-2 of the light guide 710. In some embodiments, as shown in FIG. 7A, the in-coupling element 735 may be disposed at the second surface 710-2 of the light guide 710, and the out-coupling element 745 may be disposed at the first surface 710-1 of the light guide 710. In some embodiments, the in-coupling element 735 may be disposed at the first surface 710-1 of the light guide 710. In some embodiments, the out-coupling element 745 may be disposed at the second surface 710-2 of the light guide 710. In some embodiments, both of the in-coupling element 735 and the out-coupling element 745 may be disposed at the first surface 710-1 or the second surface 710-2 of the light guide 710. In some embodiments, the in-coupling element 735 or the out-coupling element 745 may be integrally formed as a part of the light guide 710 at the corresponding surface. In some embodiments, the in-coupling element 735 or the out-coupling element 745 may be separately formed, and may be disposed at (e.g., affixed to) the corresponding surface.

In some embodiments, each of the in-coupling element 735 and the out-coupling element 745 may have a designed operating wavelength band that includes at least a portion of the visible wavelength band. In some embodiments, the designed operating wavelength band of each of the in-coupling element 735 and the out-coupling element 745 may not include the IR wavelength band. For example, each of the in-coupling element 735 and the out-coupling element 745 may be configured to deflect a visible light, and transmit an IR light without a deflection or with negligible deflection.

In some embodiments, each of the in-coupling element 735 and the out-coupling element 745 may include one or more diffraction gratings, one or more cascaded reflectors, one or more prismatic surface elements, and/or an array of holographic reflectors, or any combination thereof. In some embodiments, each of the in-coupling element 735 and the out-coupling element 745 may include one or more diffractive structures, e.g., diffraction gratings. The diffraction grating may include a surface relief grating, a volume hologram grating, a polarization hologram grating (e.g., a liquid crystal polarization hologram grating), a metasurface grating, or any combination thereof. For discussion purposes, the in-coupling element 735 and the out-coupling element 745 may also be referred to as the in-coupling grating 735 and the out-coupling grating 745, respectively. In some embodiments, a pitch of the in-coupling grating 735 may be configured to enable TIR of the image light 730 within the light guide 710. In some embodiments, a pitch of the out-coupling grating 745 may be configured to couple the image light 730 propagating inside the light guide 710 through TIR out of the light guide 710 via diffraction.

The light guide 710 may include one or more materials configured to facilitate the total internal reflection of the image light 730. For example, the light guide 710 may be the substrate 101 shown in FIGS. 1A-4C. The light guide 710 may have a relatively small form factor. The light guide 710 coupled with the in-coupling element 735 and the out-coupling element 745 may also function as an image combiner (e.g., AR or MR combiner). The light guide 710 may combine the image light 732 representing a virtual image and a light 734 from the real world environment (or a real world light 734), such that the virtual image may be superimposed with real-world images. With the light guide display system 700, the physical display and electronics may be moved to a side of a front body of an NED. A substantially fully unobstructed view of the real world environment may be achieved, which enhances the AR or MR user experience.

In some embodiments, the light guide 710 may include additional elements configured to redirect, fold, and/or expand the pupil of the light source assembly 705. For example, in some embodiments, the light guide display system 700 may include a redirecting element 740 coupled to the light guide 710, and configured to redirect the image light 730 to the out-coupling element 745, such that the image light 730 is coupled out of the light guide 710 via the out-coupling element 745. In some embodiments, the redirecting element 740 may be arranged at a location of the light guide 710 opposing the location of the out-coupling element 745. For example, in some embodiments, the redirecting element 740 may be integrally formed as a part of the light guide 710 at the corresponding surface. In some embodiments, the redirecting element 740 may be separately formed and disposed at (e.g., affixed to) the corresponding surface of the light guide 710.

In some embodiments, the redirecting element 740 and the out-coupling element 745 may have a similar structure. In some embodiments, the redirecting element 740 may include one or more diffraction gratings, one or more cascaded reflectors, one or more prismatic surface elements, and/or an array of holographic reflectors, or any combination thereof. In some embodiments, the redirecting element

740 may include one or more diffractive structures, e.g., diffraction gratings. The diffraction grating may include a surface relief grating, a volume hologram grating, a polarization hologram grating (e.g., a liquid crystal polarization hologram grating), a metasurface grating, or any combination thereof. For discussion purposes, the redirecting element 740 may also be referred to as the redirecting grating 740.

In some embodiments, the redirecting element 740 and the out-coupling element 745 may be configured to replicate the image light 730 received from the light source assembly 705 at the output side of the light guide 710 in two different directions, thereby providing a two-dimensional ("2D") expansion of the effective pupil of the light guide display system 700. For example, the out-coupling element 745 may be configured to replicate the image light 730 received from the light source assembly 705 at the output side of the light guide 710 to expand the effective pupil of the light guide display system 700, e.g. in the x-axis direction shown in FIG. 7A. The redirecting element 740 may be configured to replicate the image light 730 received from the light source assembly 705 at the output side of the light guide 710 to expand the effective pupil of the light guide display system 700, e.g., in the y-axis direction shown in FIG. 7A.

In some embodiments, one of the redirecting grating 740 and the out-coupling grating 745 may be disposed at the first surface 710-1 of the light guide 710, and the other one of the redirecting grating 740 and the out-coupling grating 745 may be disposed at the second surface 710-2 of the light guide 710. In some embodiments, the redirecting grating 740 and the out-coupling grating 745 may have different orientations of grating fringes (or grating vectors), thereby expanding the input image light 730 in two different directions. For example, the out-coupling grating 745 may expand the image light 730 along the x-axis direction, and the redirecting grating 740 may expand the image light 730 along the y-axis direction. The out-coupling grating 745 may further couple the expanded input image light out of the light guide 710. Accordingly, the light guide display system 700 may provide pupil replication (or pupil expansion) at a light output side of the light guide display system 700. In some embodiments, the redirecting grating 740 and the out-coupling grating 745 may be disposed at the same surface of the light guide 710. In addition, to expand the exit pupil (or effective pupil) of the light guide display system 700 in more than two directions, more than two gratings (or layers of diffractive structures) may be disposed at the light output region of the light guide 710.

In some embodiments, multiple functions, e.g., redirecting, folding, and/or expanding the pupil of the light generated by the light source assembly 705 may be combined into a single element, e.g. the out-coupling element 745. For example, the out-coupling element 745 itself may be configured to provide a 2D expansion of the effective pupil of the light guide display system 700. For example, the out-coupling grating 745 may be a 2D grating including a single grating layer or a single layer of diffractive structures.

In some embodiments, the light guide display system 700 may include a plurality of light guides 710 disposed in a stacked configuration (not shown in FIG. 7A). At least one (e.g., each) of the plurality of light guides 710 may be coupled with or include one or more diffractive elements (e.g., in-coupling element, out-coupling element, and/or redirecting element), which may be configured to direct the image light 730 toward the eye 760. In some embodiments, the plurality of light guides 710 disposed in the stacked configuration may be configured to output an expanded polychromatic image light (e.g., a full-color image light). In some embodiments, the light guide display system 700 may include one or more light source assemblies 705 and/or one or more light guides 710. In some embodiments, at least one (e.g., each) of the light source assemblies 705 may be configured to emit a monochromatic image light of a specific wavelength band corresponding to a primary color (e.g., red, green, or blue) and a predetermined FOV (or a predetermined portion of an FOV).

In some embodiments, the light guide display system 700 may include three different light guides 710 configured to deliver component color images (e.g., primary color images) by in-coupling and subsequently out-coupling, e.g., red, green, and blue lights, respectively, in any suitable order. In some embodiments, the light guide display system 700 may include two different light guides configured to deliver component color images (e.g., primary color images) by in-coupling and subsequently out-coupling, e.g., a combination of red and green lights, and a combination of green and blue lights, respectively, in any suitable order. In some embodiments, at least one (e.g., each) of the light source assemblies 705 may be configured to emit a polychromatic image light (e.g., a full-color image light).

In the embodiment shown in FIG. 7A, the out-coupling grating 745 (and/or the redirecting grating 740 if included) may be a grating fabricated based on the disclosed processes and methods, such as the SRG 100 shown in FIG. 1C, the SRG 200 shown in FIG. 2C, the SRG 300 shown in FIG. 3C, or the SRG 400 shown in FIG. 4C. For example, the out-coupling grating 745 may be fabricated to have a predetermined duty cycle variation in one or more dimensions, e.g., within a plane (e.g., an x-y plane shown in FIG. 7A) perpendicular to a thickness direction of the out-coupling grating 745 (e.g., a z-axis direction shown in FIG. 7A). The out-coupling grating 745 may have a broad duty cycle variation. Thus, the out-coupling grating 745 may be configured to provide a broad diffraction efficiency variation in the one or more dimensions.

For example, the out-coupling grating 745 may be configured to provide a predetermined (e.g., a non-uniform) diffraction efficiency profile, e.g., a predetermined 1D or 2D diffraction efficiency profile, to image lights incident onto different portions of the out-coupling grating 745, when the Bragg condition is substantially satisfied. The predetermined non-uniform diffraction efficiency profile may allow the light guide display system 700 to have a predetermined illuminance distribution (or profile) along the one or more dimensions of the expanded exit pupil. The predetermined illuminance distribution may be any suitable illuminance distribution profile in the one or more dimensions, such as a Gaussian distribution or any other desirable distribution. In some embodiments, the predetermined illuminance distribution may be substantially uniform over an expanded exit pupil. In some embodiments, the predetermined illuminance distribution may be non-uniform depending on the application needs.

Figure 7B:
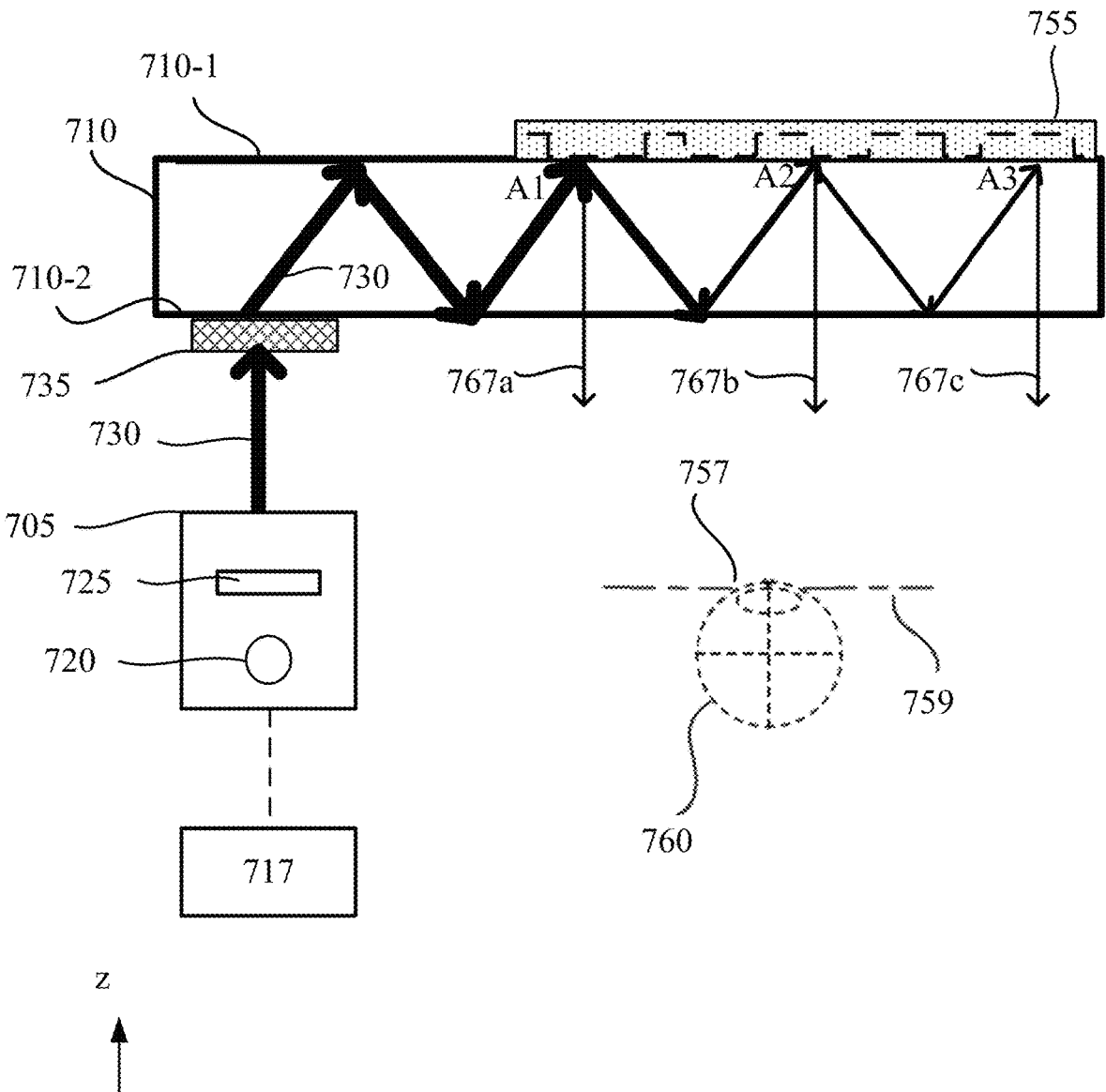

FIG. 7B illustrates an x-z sectional view of a light guide display assembly or system 750, according to an embodiment of the present disclosure. The light guide display system 750 may include elements, structures, and/or functions that are the same as or similar to those included in the light guide display system 700 shown in FIG. 7A. Descriptions of the same or similar elements, structures, and/or functions can refer to the descriptions rendered above in connection with FIG. 7A. As shown in FIG. 7B, the light guide 710 may be coupled with an out-coupling grating 755 that couples the image light 730 out of the light guide 710, via diffraction, as a plurality of output lights, e.g., 767a, 767b, and 767c. The out-coupling grating 755 may be fabricated based on the disclosed processes and methods, and may have a broad duty cycle variation along one or two dimensions in a plane (e.g., the x-y plane) of the out-coupling grating 755 perpendicular to the thickness direction of the out-coupling grating 755. Thus, the out-coupling grating 755 may provide a broad diffraction efficiency variation along one or two dimensions in the plane of the out-coupling grating 755.

For illustrative and discussion purposes, FIG. 7B shows that the duty cycle of the out-coupling grating 755 is configured to gradually increase along the +x-axis direction, e.g., from about 0.1 to about 0.9. The image light 730 propagating inside the light guide 710 via TIR may be incident onto different portions (e.g., A1, A2, A3, etc.) of the out-coupling grating 755 along the +x-axis direction. When the Bragg condition is substantially satisfied, the out-coupling grating 755 may diffract the image light 730 incident onto different portions (e.g., A1, A2, A3, etc.) of the out-coupling grating 755 along the +x-axis direction, with the diffraction efficiency gradually increasing along the +x-axis direction. For example, the diffraction efficiency of the out-coupling grating 755 provided to the image light 730 incident onto the position A2 may be larger than the position A1, and the diffraction efficiency of the out-coupling grating 755 provided to the image light 730 incident onto the position A3 may be larger than the position A2. Thus, the increase in the diffraction efficiency of the out-coupling grating 755 provided to the image light 730 may compensate for the decrease in the light intensity of the image light 730 due to portion of the image light 730 being coupled out when propagating along the light guide 710.

Accordingly, the difference between the light intensities of the output lights 767a, 767b, and 767c out-coupled from different portions (e.g., A1, A2, A3, etc.) of the light guide 710 may be reduced, and the uniformity of the illuminance within the eye-box region 759 may be improved at least along the +x-axis direction (or the exit pupil expansion direction). In some embodiments, through configuring the duty cycle variation of the out-coupling grating 755 along one or two dimensions of the out-coupling grating 755 (e.g., the x-axis direction and/or the y-axis direction), the light intensities of the output lights 767a, 767b, and 767c out-coupled from different portions (e.g., A1, A2, A3, etc.) of the light guide 710 may be configured to be substantially the same. Thus, the light guide display system 750 may be configured to provide a substantially uniform illuminance at the output side of the light guide 710 or over the effective pupil within the eye-box region 759. Compared to a conventional light guide display system including an out-coupling grating with a narrow duty cycle variation (e.g., from 0.5 to 0.7), the light guide display system 750 with the disclosed out-coupling grating 755 with a broad duty cycle variation (from 0.1 to 0.9) may further improve the illuminance at the output side of the light guide 710 or over the effective pupil within the eye-box region 759.

The uniform illuminance distribution at the output side is an example of the illuminance profile that may be provided by the disclosed light guide display system 750. The present disclosure is not limited to providing a uniform illuminance distribution at the output side of the light guide 710. Any suitable, predetermined illuminance distribution (or profile), including controlled or preconfigured non-uniform illuminance distribution patterns may be provided by the disclosed light guide display system 750, following the same or similar principles described below using the uniform illuminance distribution as an example.

Although not shown, in some embodiments, the light guide display system 750 may include two or more out-coupling gratings 755. In some embodiments, the two or more out-coupling gratings 755 may have a substantially same duty cycle variation. In some embodiments, the two or more out-coupling gratings 755 may have different duty cycle variations. In some embodiments, the light guide display system 750 may also include a redirecting grating (not shown). In some embodiments, the out-coupling grating 755 and the redirecting grating may have a substantially same duty cycle variation. In some embodiments, the out-coupling grating 755 and the redirecting grating may have different duty cycle variations.

Although not shown in FIG. 7B, in some embodiments, the duty cycle variation of the out-coupling grating 755 may be configured, such that the out-coupling grating 755 may be configured to diffract the image light 730 toward regions outside of the eye-box region 759 with a relatively small (e.g., negligible) diffraction efficiency, and diffract the image light 730 toward regions inside the eye-box region 759 with a relatively large diffraction efficiency. Thus, the loss of the image light 730 directed to regions outside of the eye-box region 759 may be reduced. As a result, the power consumption of the light source assembly 705 may be significantly reduced, while the power efficiency of the light guide display system 750 may be significantly improved.

The configurations of the light guide display system 700 shown in FIG. 7A and the light guide display system 750 shown in FIG. 7B are used as example display systems configured to provide a predetermined illuminance distribution at the eye-box region 759 by including one or more gratings fabricated based on the disclosed processes and methods. The gratings fabricated based on the disclosed processes and methods may be implemented into any suitable systems (e.g., display systems, illumination systems, etc.) other than the disclosed light guide display systems, for providing a predetermined illuminance distribution within a predetermined region.

Figure 8A:
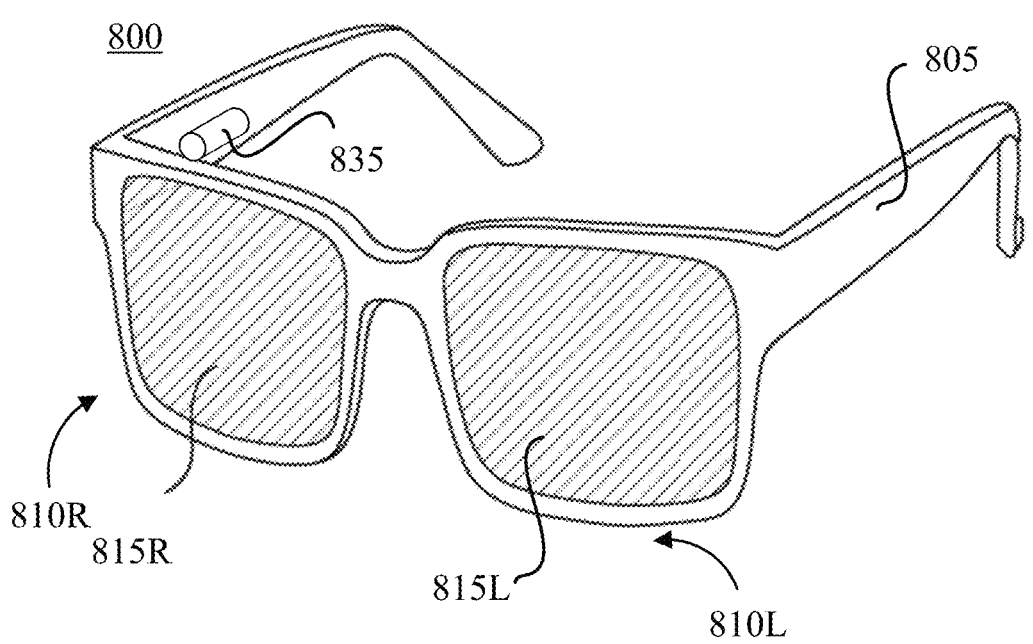
FIG. 8A schematically illustrates a diagram of a near-eye display ("NED"), according to an embodiment of the present disclosure.
Figure 8B:
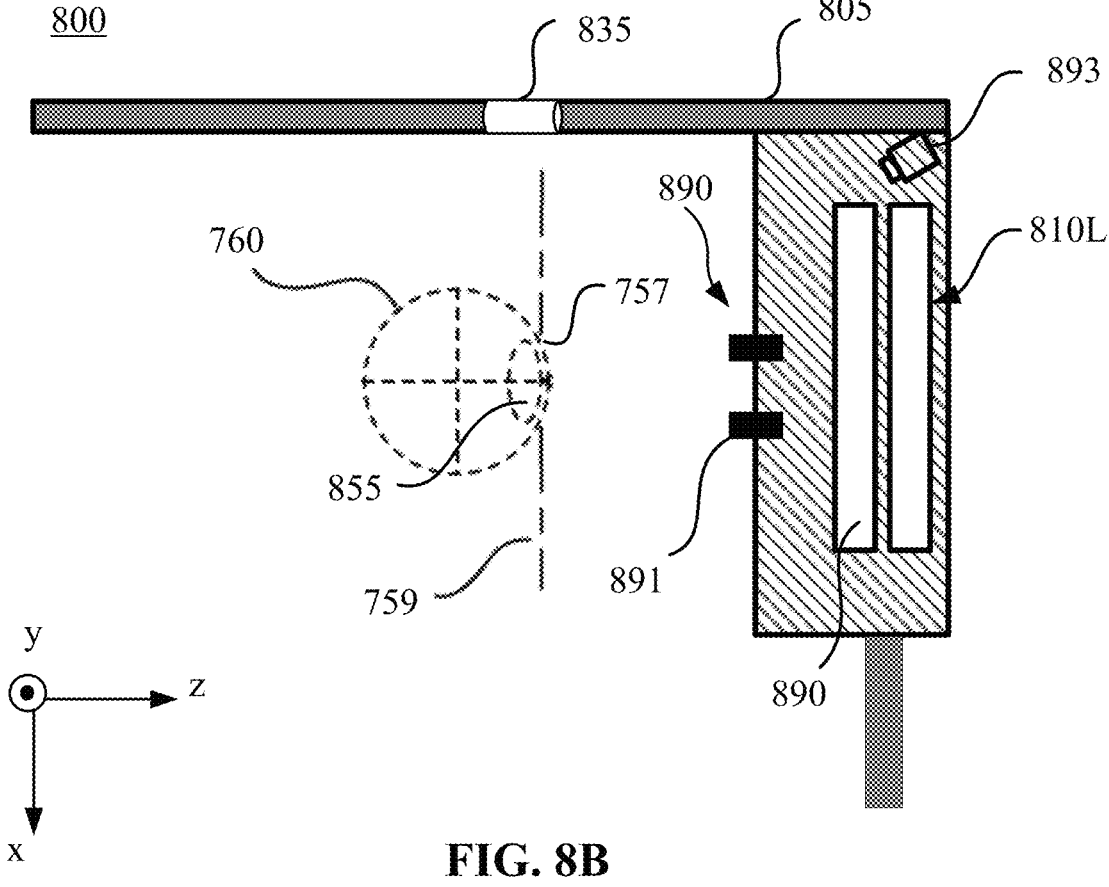
FIG. 8B schematically illustrates a cross-sectional view of half of the NED shown in FIG. 8A, according to an embodiment of the present disclosure.

FIG. 8A illustrates a schematic diagram of a near-eye display ("NED") 800 according to an embodiment of the disclosure. FIG. 8B is a cross-sectional view of half of the NED 800 shown in FIG. 8A according to an embodiment of the disclosure. For purposes of illustration, FIG. 8B shows the cross-sectional view associated with a left-eye display system 810L. The NED 800 may include a controller (not shown), which may be similar to other controllers shown in other figures. The NED 800 may include a frame 805 configured to mount to a user's head. The frame 805 is merely an example structure to which various components of the NED 800 may be mounted. Other suitable type of fixtures may be used in place of or in combination with the frame 805. The NED 800 may include right-eye and left-eye display systems 810R and 810L mounted to the frame 805. The NED 800 may function as a VR device, an AR device, an MR device, or any combination thereof. In some embodiments, when the NED 800 functions as an AR or an MR device, the right-eye and left-eye display systems 810R and 810L may be entirely or partially transparent from the perspective of the user, which may provide the user with a view of a surrounding real-world environment. In some embodiments, when the NED 800 functions as a VR device, the right-eye and left-eye display systems 810R and 810L may be opaque to block the light from the real-world environment, such that the user may be immersed in the VR imagery based on computer-generated images.

The left-eye and right-eye display systems 810L and 810R may include image display components configured to project computer-generated virtual images into left and right display windows 815L and 815R in a field of view ("FOV"). The right-eye and left-eye display systems 810R and 810L may be any suitable display systems. In some embodiments, the right-eye and left-eye display systems 810R and 810L may include one or more gratings fabricated based on the disclosed processes and methods. In some embodiments, the right-eye and left-eye display systems 810R and 810L may include one or more display systems disclosed herein, such as the light guide display system 700 shown in FIG. 7A or the light guide display system 750 shown in FIG. 7B. For illustrative purposes, FIG. 8A shows that the left-eye display systems 810L may include a light source assembly (e.g., a projector) 835 coupled to the frame 805 and configured to generate an image light representing a virtual image.

As shown in FIG. 8B, the left-eye display systems 810L may also include a viewing optical system 880 and an object tracking system 890 (e.g., eye tracking system and/or face tracking system). The viewing optical system 880 may be configured to guide the image light output from the left-eye display system 810L to the exit pupil 757. The exit pupil 757 may be a location where an eye pupil 855 of the eye 760 of the user is positioned in the eye-box region 759 of the left-eye display system 810L. For example, the viewing optical system 880 may include one or more optical elements configured to, e.g., correct aberrations in an image light output from the left-eye display systems 810L, magnify an image light output from the left-eye display systems 810L, or perform another type of optical adjustment of an image light output from the left-eye display systems 810L. Examples of the one or more optical elements may include an aperture, a Fresnel lens, a convex lens, a concave lens, a filter, any other suitable optical element that affects an image light, or a combination thereof.

The object tracking system 890 may include an IR light source 891 configured to illuminate the eye 760 and/or the face, and an optical sensor 893 (e.g., a camera) configured to receive the IR light reflected by the eye 760 and generate a tracking signal relating to the eye 760 (e.g., an image of the eye 760). In some embodiments, the NED 800 may include an adaptive dimming element that may dynamically adjust the transmittance of lights reflected by real-world objects, thereby switching the NED 800 between a VR device and an AR device or between a VR device and an MR device. In some embodiments, along with switching between the AR/MR device and the VR device, the adaptive dimming element may be used in the AR and/MR device to mitigate differences in brightness of lights reflected by real-world objects and virtual image lights.

In some embodiments, the present disclosure provides a method including forming a shrink material layer over a patterned substrate including a photoresist pattern. The method may also include exposing the patterned substrate with the shrink material layer to an activating radiation via a grey-tone mask that provides a predetermined light transmittance profile for the activating radiation. The method may also include removing at least a portion of the shrink material layer.

In some embodiments, the predetermined light transmittance profile is a non-uniform light transmittance profile. In some embodiments, the patterned substrate includes a photosensitive material that is activated under the activating radiation to react with the shrink material layer. In some embodiments, the photosensitive material is disposed in the photoresist pattern or disposed between the photoresist pattern and the shrink material layer. In some embodiments, the shrink material layer includes a material including one or more amine functional groups and one or more amine protecting groups, and the photosensitive material includes a photoacid generator. In some embodiments, the shrink material layer includes monomers, and the photosensitive material includes an initiator for a photo-polymerization of the monomers. In some embodiments, removing at least a portion of the shrink material layer may include: rinsing the patterned substrate with the shrink material layer using a rinsing solution to remove a portion of the shrink material that has not reacted with the photoresist pattern. In some embodiments, a portion of the shrink material layer remains on the photoresist pattern after the rinsing to increase a width of at least one photoresist line included in the photoresist pattern. In some embodiments, the shrink material layer includes a photosensitive material that is activated under the activating radiation to react with the photoresist pattern. In some embodiments, the shrink material layer includes a material that is aqueous-soluble or organic solvent soluble (e.g., fluoro-soluble), and the photosensitive material includes a photoacid generator. In some embodiments, the photoacid generator included in the photosensitive material is a first photoacid generator with a first activating wavelength, the photoresist pattern includes a second photoacid generator with a second activating wavelength, and the first activating wavelength is greater than the second activating wavelength. In some embodiments, removing at least a portion of the shrink material layer may include: developing the patterned substrate with the shrink material layer using a developer base to remove the shrink material layer and a portion of the photoresist pattern that has reacted with the shrink material layer. In some embodiments, removing the portion of the photoresist pattern that has reacted with the shrink material layer reduces a width of at least one photoresist line included in the photoresist pattern. In some embodiments, the method may also include, after exposing the patterned substrate with the shrink material layer to the activating radiation via the grey-tone mask and before removing at least a portion of the shrink material layer, heat treating the patterned substrate with the shrink material layer. In some embodiments, the patterned substrate with the shrink material layer has a uniform thickness.

In some embodiments, the present disclosure also provides a method including configuring a grey-tone mask to provide a non-uniform light transmittance profile for a radiation for creating a varying duty cycle profile in a grating to be fabricated. The method may also include applying a shrink material over a photoresist pattern. The method may also include exposing the photoresist pattern with the shrink material to the radiation transmitting through the grey-tone mask to cause a reaction between the shrink material and the photoresist pattern at selective portions of the photoresist pattern covered by the shrink material. The method may further include removing at least a portion of the shrink material to form the grating.

In some embodiments, removing at least a portion of the shrink material comprises at least one of: rinsing the photoresist pattern with the shrink material using a rinsing solution to remove a portion of the shrink material that has not reacted with the photoresist pattern; or developing the photoresist pattern with the shrink material using a developer base to remove the shrink material and a portion of the photoresist pattern that has reacted with the shrink material to reduce a width of at least one photoresist line included in the photoresist pattern. In some embodiments, amounts of the shrink material that reacts with the photoresist pattern at different selective portions of the photoresist pattern are different.

In some embodiments, the present disclosure provides a method including forming a photoresist pattern through a lithography mask in a lithography process, the photoresist pattern including a first duty cycle profile. The lithography mask may be different from the grey-tone mask. The lithography process may be any suitable process for making the photoresist pattern. The gray-tone mask may be used to adjust the duty cycle in the photoresist pattern after the photoresist pattern is fabricated using the lithography process, without the need of changing the lithography mask, as typically performed in a conventional technology. With the disclosed method, the process of adjusting the duty cycles of the photoresist pattern may be significantly simplified, and the flexibility in adjusting the duty cycles may be significantly increased. In some embodiments, the method may also include applying a shrink material to the photoresist pattern over the photoresist pattern. The method may also include exposing the photoresist pattern with the shrink material to a radiation through a grey-tone mask having a non-uniform light transmittance profile for the radiation, the non-uniform light transmittance profile corresponding to a second duty cycle profile that is different from the first duty cycle profile. The method may further include removing at least a portion of the shrink material to form a grating having the second duty cycle profile. In some embodiments, removing at least a portion of the shrink material layer may include at least one of: rinsing the photoresist pattern with the shrink material using a rinsing solution to remove a portion of the shrink material that has not reacted with the photoresist pattern; or developing the photoresist pattern with the shrink material using a developer base to remove the shrink material and a portion of the photoresist pattern that has reacted with the shrink material to reduce a width of at least one photoresist line included in the photoresist pattern.

Further, when an embodiment illustrated in a drawing shows a single element, it is understood that the embodiment or another embodiment not shown in the figures but within the scope of the present disclosure may include a plurality of such elements. Likewise, when an embodiment illustrated in a drawing shows a plurality of such elements, it is understood that the embodiment or another embodiment not shown in the figures but within the scope of the present disclosure may include only one such element. The number of elements illustrated in the drawing is for illustration purposes only, and should not be construed as limiting the scope of the embodiment. Moreover, unless otherwise noted, the embodiments shown in the drawings are not mutually exclusive, and they may be combined in any suitable manner. For example, elements shown in one figure/embodiment but not shown in another figure/embodiment may nevertheless be included in the other figure/embodiment. In any optical device disclosed herein including one or more optical layers, films, plates, or elements, the numbers of the layers, films, plates, or elements shown in the figures are for illustrative purposes only. In other embodiments not shown in the figures, which are still within the scope of the present disclosure, the same or different layers, films, plates, or elements shown in the same or different figures/embodiments may be combined or repeated in various manners to form a stack.

Various embodiments have been described to illustrate the exemplary implementations. Based on the disclosed embodiments, a person having ordinary skills in the art may make various other changes, modifications, rearrangements, and substitutions without departing from the scope of the present disclosure. Thus, while the present disclosure has been described in detail with reference to the above embodiments, the present disclosure is not limited to the above described embodiments. The present disclosure may be embodied in other equivalent forms without departing from the scope of the present disclosure. The scope of the present disclosure is defined in the appended claims.

What is claimed is:

1. A method, comprising:
forming a shrink material layer over a substrate including a photoresist pattern;
exposing the substrate with the shrink material layer to an activating radiation via a grey-tone mask that provides a predetermined light transmittance profile for the activating radiation; and
removing at least a portion of the shrink material layer, wherein the shrink material layer reacts with the photoresist pattern at different selective portions of the photoresist pattern to vary a width of at least one photoresist line and vary a width of at least one trench in the photoresist pattern.

2. The method of claim 1, wherein the predetermined light transmittance profile is a non-uniform light transmittance profile.

3. The method of claim 1, wherein the substrate includes a photosensitive material that is activated under the activating radiation to react with the shrink material layer.

4. The method of claim 3, wherein the photoresist pattern includes the photosensitive material, or the photosensitive material is disposed between the photoresist pattern and the shrink material layer.

5. The method of claim 3, wherein the shrink material layer includes a material including one or more amine functional groups and one or more amine protecting groups, and the photosensitive material includes a photoacid generator.

6. The method of claim 3, wherein the shrink material layer includes monomers, and the photosensitive material includes an initiator for a photo-polymerization of the monomers.

7. The method of claim 3, wherein removing at least the portion of the shrink material layer comprises:
rinsing the substrate with the shrink material layer using a rinsing solution to remove a portion of the shrink material layer that has not reacted with the photoresist pattern.

8. The method of claim 7, wherein a portion of the shrink material layer remains on the photoresist pattern after the rinsing to increase the width of the at least one photoresist line included in the photoresist pattern.

9. The method of claim 1, wherein the shrink material layer includes a photosensitive material that is activated under the activating radiation to react with the photoresist pattern.

10. The method of claim 9, wherein the shrink material layer includes a material that is aqueous-soluble or organic solvent-soluble, and the photosensitive material includes a photoacid generator.

11. The method of claim 10, wherein the photoacid generator included in the photosensitive material is a first photoacid generator with a first activating wavelength, the photoresist pattern includes a second photoacid generator with a second activating wavelength, and the first activating wavelength is greater than the second activating wavelength.

12. The method of claim 9, wherein removing at least the portion of the shrink material layer comprises:

developing the substrate with the shrink material layer using a developer base to remove the shrink material layer and a portion of the photoresist pattern that has reacted with the shrink material layer.

13. The method of claim 12, wherein removing the portion of the photoresist pattern that has reacted with the shrink material layer reduces the width of the at least one photoresist line included in the photoresist pattern.

14. The method of claim 12, wherein removing the portion of the photoresist pattern that has reacted with the shrink material layer reduces the width of the at least one trench in the photoresist pattern.

15. The method of claim 1, wherein the photoresist pattern includes a plurality of photoresist structures that are slanted with respect to the substrate.

16. The method of claim 1, wherein the substrate with the shrink material layer has a uniform thickness.

17. A method, comprising:

configuring a grey-tone mask to provide a non-uniform light transmittance profile for a radiation for creating a varying duty cycle profile in a grating to be fabricated;

applying a shrink material over a photoresist pattern;

exposing the photoresist pattern with the shrink material to the radiation transmitting through the grey-tone mask to cause a reaction between the shrink material and the photoresist pattern at selective portions of the photoresist pattern covered by the shrink material; and removing at least a portion of the shrink material to form the grating, wherein the selective portions of the photoresist pattern varies in a width of at least one photoresist line and varies in a width of at least one trench in the photoresist pattern.

18. The method of claim 17, wherein removing at least the portion of the shrink material comprises at least one of:

rinsing the photoresist pattern with the shrink material using a rinsing solution to remove a portion of the shrink material that has not reacted with the photoresist pattern; or developing the photoresist pattern with the shrink material using a developer base to remove the shrink material and a portion of the photoresist pattern that has reacted with the shrink material to reduce the width of the at least one photoresist line included in the photoresist pattern.

19. A method, comprising:

forming a photoresist pattern through a lithography mask via a lithography process, the photoresist pattern including a first duty cycle profile;

applying a shrink material over the photoresist pattern;

exposing the photoresist pattern with the shrink material to a radiation through a grey-tone mask having a non-uniform light transmittance profile for the radiation, the non-uniform light transmittance profile corresponding to a second duty cycle profile that is different from the first duty cycle profile; and removing at least a portion of the shrink material to form a grating having the second duty cycle profile, wherein the second duty cycle profile varies in a width of at least one photoresist line and varies in a width of at least one trench in the photoresist pattern.

20. The method of claim 19, wherein removing at least the portion of the shrink material to form the grating having the second duty cycle profile comprises at least one of:

rinsing the photoresist pattern with the shrink material using a rinsing solution to remove a portion of the shrink material that has not reacted with the photoresist pattern; or developing the photoresist pattern with the shrink material using a developer base to remove the shrink material and a portion of the photoresist pattern that has reacted with the shrink material to reduce the width of the at least one photoresist line included in the photoresist pattern.

* * * * *